(12) United States Patent
Mateu Sáez et al.

(10) Patent No.: US 9,294,004 B2
(45) Date of Patent: Mar. 22, 2016

(54) PEAK DETECTOR WITH IMPROVED FALSE PEAK REJECTION

(71) Applicant: Fraunhofer-Gesellschaft zur Foerderung der angewandten Forschung e.V., Munich (DE)

(72) Inventors: MaríaLoreto Mateu Sáez, Nuremberg (DE); Lars Luehmann, Nuremberg (DE); Philipp Babel, Nuremberg (DE); Markus Pollak, Nuremberg (DE); Peter Spies, Herzogenaurach (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 69 days.

(21) Appl. No.: 14/230,333

(22) Filed: Mar. 31, 2014

(65) Prior Publication Data
US 2014/0211523 A1    Jul. 31, 2014

Related U.S. Application Data

(63) Continuation of application No. PCT/EP2012/069901, filed on Oct. 8, 2012.

(30) Foreign Application Priority Data

Oct. 7, 2011 (EP) .................................... 11184378
Oct. 7, 2011 (EP) .................................... 11184380

(51) Int. Cl.
*H03K 5/153* (2006.01)
*H02M 7/06* (2006.01)
(Continued)

(52) U.S. Cl.
CPC ............. *H02M 7/06* (2013.01); *G01R 19/04* (2013.01); *H02H 7/125* (2013.01); *H02N 2/181* (2013.01)

(58) Field of Classification Search
CPC .. G01R 19/04; G01R 19/0038; H03K 5/1532; H03K 5/082; G11B 20/10009
USPC ....................................................... 327/58–62
See application file for complete search history.

(56) References Cited

U.S. PATENT DOCUMENTS 3,700,920 A * 10/1972 Eyler ............................... 327/59
4,020,423 A *  4/1977 Guyot et al. .................... 327/61
(Continued)

FOREIGN PATENT DOCUMENTS

CN    1574523 A    2/2005
CN    1954226 A    4/2007
(Continued)

OTHER PUBLICATIONS

Official Communication issued in International Patent Application No. PCT/EP2012/069901, mailed on Jan. 22, 2013.
(Continued)

*Primary Examiner* — Quan Tra
(74) *Attorney, Agent, or Firm* — Keating & Bennett, LLP

(57) ABSTRACT

A peak detector for synchronized switch harvesting on inductor converter includes a comparator and a filter for filtering an input signal to the peak detector and for providing a filtered signal to an input of the comparator. The filter has differentiating and integrating transfer characteristics for low and high frequency ranges, respectively, of the input signal so that peaks of the input signal to the peak detector which have primarily frequency components in the low range cause a relatively strong variation of the filtered signal and peaks of the input signal to the peak detector which have primarily frequency components in the high range are substantially integrated and cause a relatively weak variation of the filtered signal. The relatively strong variation of the filtered signal crosses a threshold of the comparator, which is configured to generate an output signal indicating a relation of the filtered signal regarding the comparator threshold.

13 Claims, 56 Drawing Sheets

(51) Int. Cl.
*G01R 19/04* (2006.01)
*H02N 2/18* (2006.01)
*H02H 7/125* (2006.01)

(56) References Cited

U.S. PATENT DOCUMENTS

| | | | |
|---|---|---|---|
| 4,652,774 | A * | 3/1987 | Hasegawa .................. 327/178 |
| 6,429,638 | B1 * | 8/2002 | Wight et al. ............... 324/103 P |
| 7,034,562 | B2 | 4/2006 | Kimura |
| 7,483,280 | B2 * | 1/2009 | Benabdelaziz et al. ......... 363/44 |
| 2004/0239373 | A1 | 12/2004 | Seshita |
| 2005/0258855 | A1 | 11/2005 | Kimura |
| 2011/0227543 | A1 | 9/2011 | Ivanov |

FOREIGN PATENT DOCUMENTS

| | | |
|---|---|---|
| DE | 195 34 464 C1 | 12/1996 |
| EP | 0 514 755 A1 | 11/1992 |
| JP | 59-221814 A | 12/1984 |
| WO | 2007/063194 A1 | 6/2007 |
| WO | 2011/093966 A1 | 8/2011 |

OTHER PUBLICATIONS

Ben-Yaakov et al.: "Resonant Rectifier for Piezoelectric Sources", Applied Power Electronics Conference and Exposition, vol. 1, Mar. 6, 2005, pp. 249-253.
Lallart et al.: "An Optimized Self-Powered Switching Circuit for Non-Linear Energy Harvesting With Low Voltage Output", Smart Materials and structures, IOP Publishing Ltd., vol. 17, No. 3, Jun. 1, 2008, 8 pages.
Priya, S. et al.,"Energy Harvesting Technologies"; 2009, Springer, pp. 209-259.
Guyomar, D. et al., "Energy Harvesting from Ambient Vibrations and Heat"; Journal of Intelligent Material Systems and Structures, vol. 20, No. 5, Mar. 2009, pp. 609-624.
Official Communication issued in corresponding Chinese Patent Application No. 201280059568.X, mailed on Aug. 21, 2015.
Official Communication issued in corresponding Japanese Patent Application No. 2014-533947 mailed on Apr. 7, 2015.
Mateu Sáez et al.; "Rectifier Circuit with AC Side Short-Circuiting Function and Synchronized Switch Harvesting on Inductor Convertor"; U.S. Appl. No. 14/246,303, filed Apr. 7, 2014.

* cited by examiner

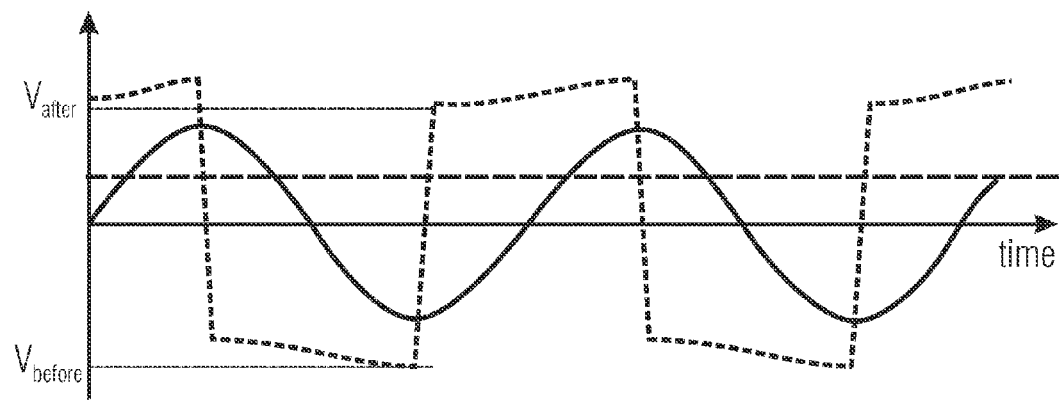
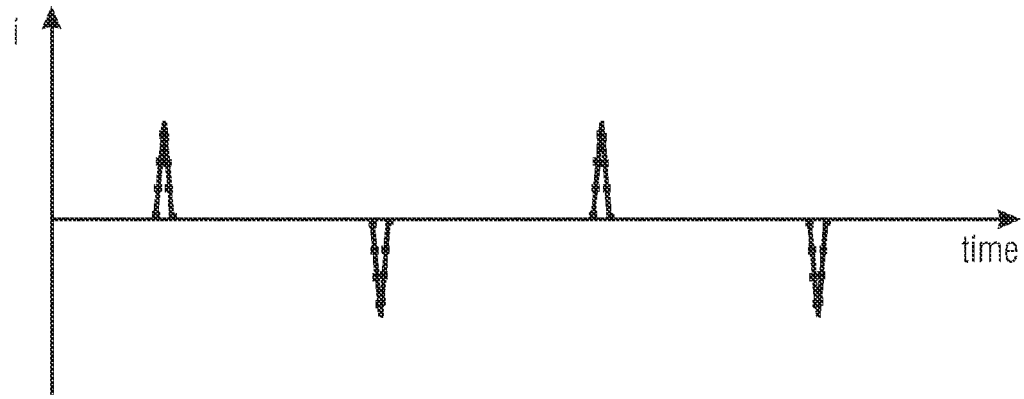
FIG 1B
PRIOR ART

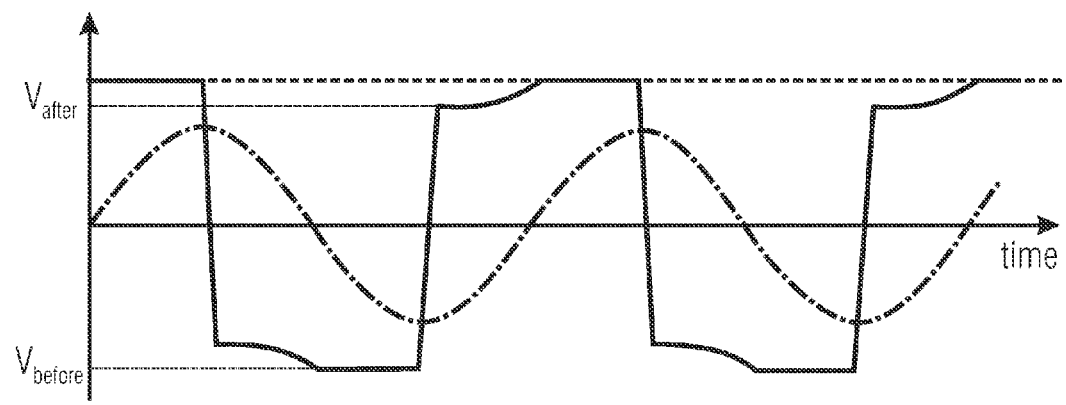
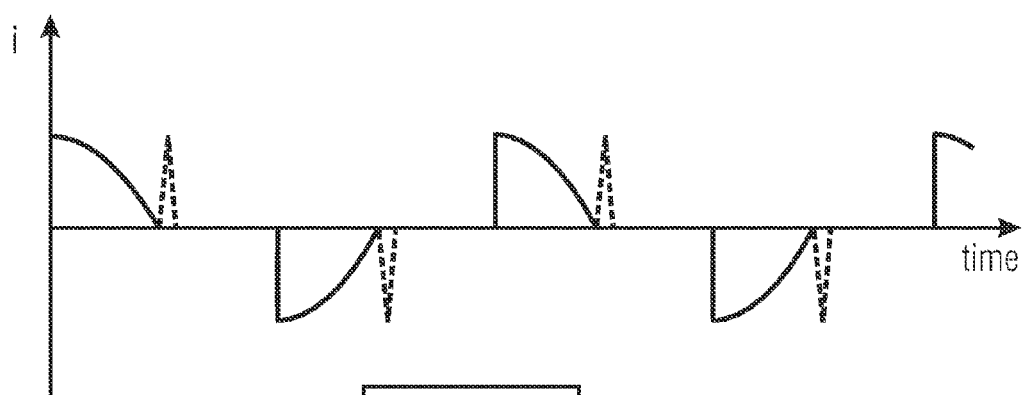
FIG 2B
PRIOR ART

PEAK DETECTOR WITH IMPROVED FALSE PEAK REJECTION

CROSS-REFERENCE TO RELATED APPLICATIONS

This application is a continuation of copending International Application No. PCT/EP2012/069901, filed Oct. 8, 2012, which is incorporated herein by reference in its entirety, and additionally claims priority from European Applications Nos. EP 11 184 378.5, filed Oct. 7, 2011 and EP 11 184 380.1, filed Oct. 7, 2011, both of which are incorporated herein by reference in their entirety.

Embodiments of the present invention relate to a peak detector, in particular a peak detector for an alternating-current/direct-current (AC/DC) converter, such as a synchronized switch harvesting on inductor (SSHI) converter. Some embodiments relate to a converter for converting alternating current to direct current. Some embodiments relate to a method for detecting a peak in an electrical input voltage for an alternating-current/direct-current converter. Some embodiments relate to a method for generating a control signal for at least one controllable switching element (typically two or more controllable switching elements) of an alternating-current/direct-current converter.

BACKGROUND OF THE INVENTION

Energy harvesting (also known as power harvesting or energy scavenging) is a process by which energy is derived from external sources (e.g., solar power, thermal energy, wind energy, salinity gradients, and kinetic energy), captured, and stored for small, wireless autonomous devices, like those used in wearable electronics and wireless sensor networks. For example, piezoelectric transducers are employed for harvesting electrical power from vibrations. Different AC-DC converters are described in the literature in order to rectify the AC power and extract the maximum amount of energy.

Possible applications of energy harvesters comprising such AC-DC converters for piezoelectric generators are, e.g., in applications like highway bridges (structural health monitoring) or railway trains (tracking and tracing). The frequency range of the vibrations associated to these applications is between 2 and 20 Hz, whereas mean accelerations are around 0.1 g.

When a piezoelectric material is mechanically excited, it transforms the mechanical energy into electrical energy. The AC power available between its electrical terminals has to be rectified to obtain DC power. A control circuit allows switching the transistors of a non-linear rectifier technique (SSHI) that provides better results than a diode bridge rectifier.

When a piezoelectric element is in open circuit, the derivative of its voltage and the derivative of its displacement are proportional since I=0.

$$I = \alpha du/dt - C_0 dv_1/dt,$$

where I is the current flowing out of the piezoelectric element, u is the piezoelectric displacement, $v_1$ is the piezoelectric voltage, a is the force factor and $C_0$ is the capacitance of the piezoelectric element (cf. S. Priya and D. J. Inman, Energy Harvesting Technologies, Springer, 2009, pp. 209-259).

There are two SSHI techniques: parallel and series. In the series SSHI circuit shown in FIG. 1, the inductor and the switch are connected in series between the piezoelectric element and the diode bridge and the filter capacitor. In the case of the parallel SSHI technique shown in FIG. 2, the switch and the inductor are connected in parallel to the piezoelectric element and the diode bridge and the filter capacitor are connected afterwards.

The series SSHI converter (FIG. 1A) remains in open circuit almost all the time and the switch that connects the piezoelectric element to the inductor, the diode bridge and the load is closed just for a short time. For this converter, it can be considered that when there is a piezoelectric voltage peak, there is also a peak displacement of the piezoelectric element. In this way, the power harvested from the piezoelectric element is maximum. Therefore, a voltage peak detector circuit is the appropriate control circuit for the series SSHI converter in order to maximize the harvested power.

For the parallel SSHI converter, (FIG. 2A), the piezoelectric element is continuously connected to the rectifier bridge and the output load which creates a phase shift between the derivatives of the displacement and the voltage of the piezoelectric element, and therefore a peak voltage detector circuit cannot detect the peak displacement without error.

A voltage peak detector circuit is one of several typically employed control circuit for switching the transistors of the SSHI converters.

The AC power delivered by piezoelectric transducers is usually rectified employing a diode bridge and a filtering capacitor. Recently, an AC-DC converter which employs an inductor connected through a switch to the piezoelectric element has been proposed. The switch is closed when the piezoelectric voltage peak is reached. In this moment, the connection of the piezoelectric element with the inductor causes a resonant effect and a fast inversion of the piezoelectric voltage. After the piezoelectric voltage inversion, the switch is opened until a new peak is detected.

Commonly used control circuits for the switching transistors of the SSHI circuits use the piezoelectric voltage as input signal. These control circuits employ a peak detector and a comparator for generating the gate signal. The peak detector changes its polarity when the piezoelectric voltage has reached a peak and the comparator provides the positive and negative voltage levels for switching the transistors.

The implementation of the self-powered control circuit is done in the literature employing primarily two different circuits. FIG. 3 shows a solution for detecting positive peaks which is described by M. Lallart and D. Guyomar in "An optimized self-powered switching circuit for non-linear energy harvesting with low voltage output," Smart Materials and Structures, Vol. 17, No. 3, 2008 and also in an international patent application PCT/FR2005/003000 (publication number: WO/2007/063194) by C. Richard, D. Guyomar and E. Lefeuvre entitled "Self-powered electronic breaker with automatic switching by detecting maxima or minima of potential difference between its power electrodes". The peak detector circuit is composed by resistor $R_3$, diode $D_3$ and capacitor C. The direction of the diode assures that only positive peaks are detected. This peak detector circuit is a differentiator. When the voltage on the emitter of transistor $T_2$ is higher than the voltage on the base, transistor $T_2$ starts conducting and diode $D_3$ is reverse biased since the voltage on the capacitor is bigger than the piezoelectric voltage. Since the base voltage of transistor $T_1$ is higher than its emitter voltage, transistor $T_1$ starts conducting and capacitor C is discharged. A complementary control circuit with a switch is used for detecting the negative peaks of the piezoelectric element.

Another solution available in the literature consists of a passive differentiator with hysteresis and a discrete comparator (see FIG. 4) which is described in S. Ben-Yaakov and N. Krihely, "Resonant rectifier for piezoelectric sources", Applied Power Electronics Conference and Exposition, 2005, APEC 2005, Twentieth Annual IEEE, vol. 1, pp. 249-253, 6-10 Mar. 2005. The passive differentiator detects when there is a voltage peak changing the polarity of its output. The output of the passive differentiator is connected to the negative input of the comparator whereas the positive input is connected to the piezoelectric reference terminal. The output of the comparator is connected to the gate of the transistors for switching them appropriately. The authors claim that the differentiator with hysteresis prevents undesired triggers through $R_{hys}$. The transfer function of a differentiator composed by a capacitor $C_{der}$ and a resistor $R_{der}$ is:

$$\frac{V_{out}}{V_{in}} = \frac{s}{s + \frac{1}{R_{der}C_{der}}}$$

If a resistor $R_{hys}$ is connected in parallel to capacitor $C_{der}$, the transfer function of this circuit is given by:

$$\frac{V_{out}}{V_{in}} = \frac{s + \frac{1}{R_{hys}C_{der}}}{s + \frac{R_{der} + R_{hys}}{R_{der}R_{hys}C_{der}}}$$

This transfer function has a zero located at $\omega_z = 1/(R_{hys}C_{der})$ and a pole located at $\omega_p = (R_{der} + R_{hys})/(R_{der}R_{hys}C_{der})$. For a proper operation of the circuit as a differentiator, $\omega_z$ is smaller than $\omega_p$. This circuit will act as a differentiator for angular frequencies which fulfill that $10\omega_z < \omega < 0.1\omega_p$.

The previous solution employs the same control circuit for detecting positive and negative voltage peaks.

The piezoelectric equivalent circuit at a given resonant frequency can be represented by an internal sinusoidal current source and a capacitor in parallel (in S. Ben-Yaakov and N. Krihely, "Resonant rectifier for piezoelectric sources", Applied Power Electronics Conference and Exposition, 2005, APEC 2005, Twentieth Annual IEEE, vol. 1, pp. 249-253, 6-10 Mar. 2005). The current source of the model is proportional to the velocity of the piezoelectric element, and therefore proportional to the derivative of the piezoelectric displacement. Hence, when there is a zero crossing of the sinusoidal current source, the optimum point for maximizing the harvested piezoelectric power takes place.

If the piezoelectric voltage inversion takes place at the peak displacement, like it occurs in the series SSHI converter, piezoelectric voltage V(vpiezo+)−V(vpiezo−) and internal current source I(V1) have the same polarity and the power harvested by the piezoelectric element is maximum (see FIGS. 5A and 5B). However, since the piezoelectric element typically is not in open circuit in the parallel SSHI converter, the piezoelectric peak voltage typically does not correspond at all with the peak displacement.

If the piezoelectric voltage inversion does not take place when there is a peak displacement, there are two possibilities: the piezoelectric voltage inversion has taken place before or after the peak displacement.

If the piezoelectric voltage inversion is done after the peak displacement, there is a time period before the piezoelectric voltage inversion where the piezoelectric voltage and current do not have the same polarity, and therefore the power harvested by the piezoelectric element is not maximum. However, the state-of-the-art peak detectors do not produce false peak detection under this circumstance. FIGS. 6A and 6B show a simulation example where the piezoelectric voltage inversion takes place after the peak displacement.

If the piezoelectric voltage inversion is done before the peak displacement, it means that the internal piezoelectric current source has the opposite polarity of the piezoelectric voltage and as long as this situation takes place, the internal capacitor of the piezoelectric element is discharged. This circumstance induces at the piezoelectric voltage waveform a local maximum and minimum that the state-of-the art differentiators detect sometimes as peaks. FIGS. 7A and 7B present a simulation that illustrates the scenario with local maximum and minimum after the piezoelectric voltage is inverted where there is no false detection of the piezoelectric voltage peaks, while FIG. 8 presents a simulation that illustrates the same scenario but with false detection of the piezoelectric voltage peaks. The false detection of the piezoelectric voltage causes a reduction of the harvested power. Then, a peak detector that rejects this false detections is of special interest for implementing the control of the parallel and the modified parallel SSHI converters.

When the piezoelectric voltage inverses its polarity, an overshoot may occur, which may be caused by the discharge of the internal piezoelectric capacitor when the internal current source has a different polarity than the piezoelectric voltage. The overshoot is a local maximum or minimum so that commonly used peak detectors may indicate the occurrence of a peak due to the overshoot. However, such a local maximum/minimum caused by such an overshoot immediately following a commutation of the piezoelectric voltage is typically not significant for an upcoming switching event to be performed by the switch. Therefore, a detection of such an overshoot as a switching-event-relevant peak is a false detection which is prone to disturb the operation of the SSHI AC/DC converter, thereby possibly reducing the harvested power.

SUMMARY

According to an embodiment, a peak detector for a synchronized switch harvesting on inductor converter may have: a comparator; a filter configured to detect a voltage peak on a piezoelectric element connected to an input of the peak detector and to reject false voltage peak detections, wherein the filter is configured to filter an output voltage of the piezoelectric element and provide a filtered signal to an input of the comparator, the filter having a differentiating transfer characteristic for low frequencies and an integrating transfer characteristic for high frequencies, the filter thus being configured to detect the peaks of the piezoelectric voltage for low frequencies and to reject detection of false peaks that have higher frequencies.

According to another embodiment, a converter converting alternating current to direct current may have a peak detector according to claim 1.

According to another embodiment, a method for detecting a peak in an electrical input voltage for an alternating-current/direct-current converter may have the steps of: receiving an input signal for a peak detector; filtering the input signal with a filter having differentiating transfer characteristic for a low frequency range and an integrating transfer characteristic for a high frequency range of the input signal, to obtain a filtered signal, so that peaks of the input signal to the peak detector which have primarily frequency components in the low frequency range cause a relatively strong variation of the filtered signal and peaks of the input signal to the peak detector which have primarily frequency components in the high frequency range are substantially integrated and cause a relatively weak variation of the filtered signal; which overcomes the detection of local maximums and minimums; comparing the filtered signal with a comparator threshold; generating an output signal on the basis of a result of comparing the filtered signal with the comparator threshold, the output signal indicating a relation of the filtered signal with respect to the comparator threshold.

According to another embodiment, a method for generating a control signal for at least one controllable switching element of an alternating-current/direct-current converter may have the steps of: detecting a peak in an electrical input voltage for the alternating-current/direct-current converter according to the method of claim 14; and generating the control signal on the basis of the output signal of the method for detecting the peak.

According to another embodiment, a peak detector may have: a first input terminal and a second input terminal, configured for being connected to an input voltage subject to a peak detection to be performed by the peak detector; a comparator having a comparator input terminal and a comparator threshold voltage relative to a reference potential; a capacitor connected between the first input terminal and the comparator input terminal; a diode connected between the comparator input terminal and the second input terminal, the diode having a diode threshold voltage relative to the reference potential and defining a border between a conducting range in which the diode is conducting and a blocking range of the diode in which the diode is blocking, the diode voltage being close to the diode threshold voltage while the diode is conducting; wherein the diode threshold voltage differs from the comparator threshold voltage by a margin voltage, and wherein the comparator threshold voltage is within the blocking range of the diode.

Embodiments of the present invention provide a peak detector for a synchronized switch harvesting on inductor converter. The peak detector comprises a comparator and a filter configured to filter an input signal to the peak detector and to provide a filtered signal to an input of the comparator. The filter has a differentiating transfer characteristic for a low frequency range and an integrating transfer characteristic for a high frequency range of the input signal so that peaks of the input signal to the peak detector which have primarily frequency components in the low frequency range cause a relatively strong variation of the filtered signal and peaks of the input signal to the peak detector which have primarily frequency components in the high frequency range are substantially integrated and cause a relatively weak variation of the filtered signal. The relatively strong variation of the filtered signal crosses a comparator threshold of the comparator and the comparator is configured to generate an output signal that indicates a relation of the filtered signal with respect to the comparator threshold.

The peak detection according to the teachings disclosed herein exploits the fact that switching-event-relevant peaks in the piezoelectric voltage have different spectral properties than spurious peaks, such as overshoots caused by a preceding commutation or inversion of the piezoelectric voltage. In this manner, a higher reliability of the detection of switching-event-relevant peaks can be achieved and the detected switching-event-relevant peaks are then processed, evaluated, and/or used to generate a control signal for controllable switching elements of an SSHI converter that is connected to the peak detector. In particular, the spectral properties of the switching-event-relevant peaks are rather in a relatively lower frequency range while the spectral properties of the spurious peaks are rather in a relatively higher frequency range. The filter of the peak detector has a bandpass-like characteristic without necessarily being a "classical" bandpass filter.

According to further embodiments of the teachings disclosed herein, a magnitude transfer function of the filter may have a maximum at a frequency between the low frequency range and the high frequency range.

A maximum magnitude frequency of a transfer function of the filter may be between 80 Hz and 400 Hz, advantageously between 100 Hz and 350 Hz, more advantageously between 110 Hz and 300 Hz, for example 120 Hz, 140 Hz, 160 Hz, 200 Hz, 240 Hz, 260 Hz, and/or 280 Hz, as well as values in between. In terms of angular frequency, the maximum magnitude angular frequency may be between 500 rad/s and 3000 rad/s, advantageously between 700 rad/s and 2000 rad/s, more advantageously between 800 rad/s and 1500 rad/s.

According to further embodiments, the filter may comprise a first filter branch connected between a first peak detector input terminal and a comparator input terminal, and a second filter branch connected between a second peak detector input terminal and the comparator input terminal, wherein at least one of the first filter branch and the second filter branch comprises an energy storing element.

The filter may comprise a voltage divider configured to divide an input voltage corresponding to the input signal and to provide a divisional voltage at an intermediary node on the basis of which the filtered signal is determined.

According to further embodiments, the filter may comprise at least two linear components and at least one non-linear component. The linear component may be, for example, a resistor, a capacitor, or a combination of both. The non-linear component may be, for example, a diode or a combination of two or more diodes.

According to further embodiments the filter may comprise an energy storing circuit and a clipper circuit. The energy storing circuit may connect a first input of the peak detector to a first input of the comparator and exhibit an energy storing behavior. The clipper circuit may connect a second input of the peak detector to the first input of the comparator. The clipper circuit may be configured to maintain a clipper circuit voltage across the clipper circuit within a voltage range defined by at least one clipping threshold. Moreover, the clipper circuit may be configured to maintain the clipper circuit voltage at the clipping threshold while an input voltage between the first input and the second input of the peak detector is monotone (e.g., in a mathematical sense) and outside the voltage range. A comparator input voltage between the first input of the comparator and a second input of the comparator may be based on the clipper circuit voltage. A comparator threshold voltage of the comparator is within the voltage range. The energy storing circuit may be configured, due to the energy storing behavior, to push the clipper circuit voltage across the clipping threshold into the voltage range and thereby causes the comparator input voltage to cross the comparator threshold in response to a peak in the input voltage so that an output of the comparator indicates the peak as a signal edge.

According to further embodiment of the teachings disclosed herein, a capacitor voltage (i.e., the voltage between the two terminals of the capacitor) may change relatively slowly in response to a peak so that the voltage at the first input of the comparator substantially follows the peak which causes the clipper circuit voltage to be pushed away from the clipping threshold into the voltage range of the clipper circuit. In this situation, the capacitor acts as a relatively inert circuit component which opposes a rapid variation of the capacitor voltage. Accordingly, an electrical potential at the node between the capacitor and the clipper circuit is varied in the manner described above. This action may cause the clipper circuit to enter a blocking state in which it does not conduct an electrical current. Accordingly, the capacitor cannot be discharged via the clipper circuit and is bound to maintain approximately the capacitor voltage which it had when the peak occurred. This leads to a rapid variation of the electrical potential at the node between the energy storing circuit and the clipper circuit and hence to cross (i.e., exceeding or falling below) the comparator threshold.

The clipper circuit may be configured to be in a blocking state when the clipper circuit voltage is not at the clipping voltage and to be in a non-blocking state when the clipper circuit voltage is at or beyond the clipping voltage.

The clipper circuit may comprise two antiparallel diodes or two antiparallel elements with diode-like characteristic.

According to further embodiments, the clipping threshold may be an upper clipping threshold and the voltage range may be further defined by a lower clipping threshold. The clipper circuit may be configured to maintain the clipper circuit voltage at the lower clipping threshold when the input voltage between the first input and the second input of the peak detector is below the lower threshold and monotonously diverging from the lower threshold. Likewise, the clipper circuit may further be configured to maintain the clipper circuit voltage at the upper clipping threshold when the input voltage between the first input and the second input of the peak detector is above the upper threshold and monotonously diverging from the upper threshold.

Further embodiments provide a converter for converting alternating current to direct current, the converter comprising a peak detector as herein described.

A method for detecting a peak in an electrical input voltage for an alternating-current/direct-current converter according to the teachings disclosed herein comprises receiving an input signal for a peak detector and filtering the input signal with a filter. The filter has a differentiating transfer characteristic for a low frequency range and an integrating transfer characteristic for a high frequency range of the input signal. By filtering the input signal, a filtered signal is obtained. Peaks of the input signal to the peak detector which have primarily frequency components in the low frequency range cause a relatively strong variation of the filtered signal and peaks of the input signal to the peak detector which have primarily frequency components in the high frequency range are substantially integrated and therefore cause a relatively weak variation of the filtered signal. The method further comprises comparing the filtered signal with a comparator threshold and generating an output signal on the basis of a result of comparing the filtered signal with the comparator threshold, the output signal indicating a relation of the filtered signal with respect to the comparator threshold.

A method for generating a control signal for at least one controllable switching element of an alternating-current/direct-current converter according to the teachings disclosed herein comprises detecting a peak in an electrical input voltage for the alternating-current/direct-current converter according to the method for detecting a peak mentioned above, and generating the control signal on the basis of the output signal of the method for detecting the peak.

According to further embodiments a peak detector comprises a first input terminal and a second input terminal, configured for being connected to an input voltage subject to a peak detection to be performed by the peak detector. The peak detector further comprises a comparator having a comparator input terminal and a comparator threshold voltage relative to a reference potential. The peak detector also comprises a capacitor connected between the first input terminal and the comparator input terminal and a diode connected between the comparator input terminal and the second input terminal. The diode has a diode threshold voltage relative to the reference potential that defines a border between a conducting range in which the diode is conducting and a blocking range of the diode in which the diode is blocking. The diode voltage is close to the diode threshold voltage while the diode is conducting. The diode threshold voltage differs from the comparator threshold voltage by a margin voltage. The comparator threshold voltage is within the blocking range of the diode.

BRIEF DESCRIPTION OF THE DRAWINGS

Embodiments of the present invention will be detailed subsequently referring to the appended drawings, in which:

FIG. 1B is a graph illustrating various voltage waveforms and electrical current waveforms occurring during the operation of the circuit shown in FIG. 1A.

FIG. 2B is a graph illustrating various voltage waveforms and electrical current waveforms occurring during the operation of the circuit shown in FIG. 2A.

DETAILED DESCRIPTION OF THE INVENTION

Figure 1A:
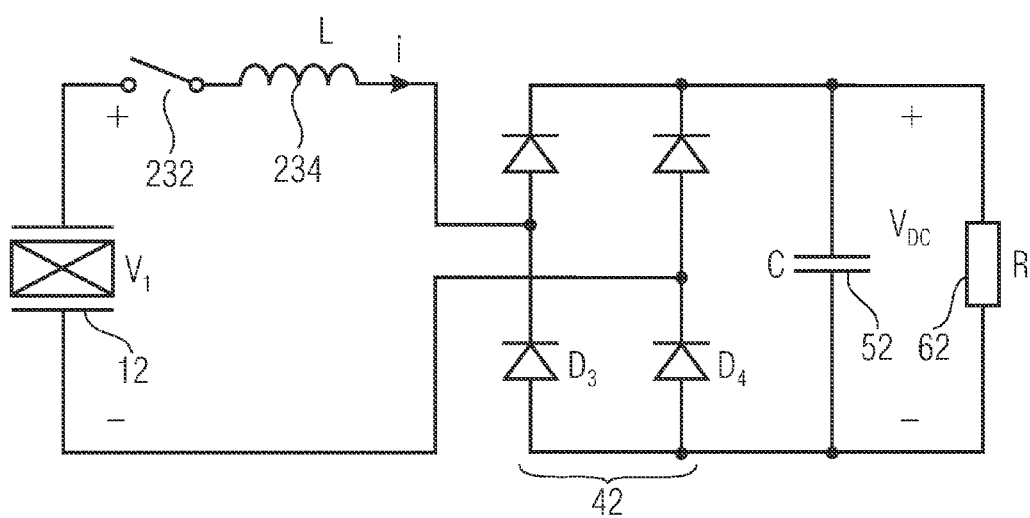
FIG. 1A shows a schematic circuit diagram of a series SSHI converter according to conventional technology.

Equal or equivalent elements or elements with equal or equivalent functionality are denoted in the following description by equal or equivalent reference numerals.

In the following description, a plurality of details are set forth to provide a more thorough explanation of embodiments of the present invention. However, it will be apparent to one skilled in the art that embodiments of the present invention may be practiced without these specific details. In other instances, well-known structures and devices are shown in block diagram form rather than in detail in order to avoid obscuring embodiments of the present invention. In addition, features of the different embodiments described hereinafter may be combined with each other, unless specifically noted otherwise.

The Synchronized Switch Harvesting on Inductor (SSHI) is a non-linear switching technique that provides DC (direct current) power from an energy source, such as a mechanically excited piezoelectric element. A SSHI converter typically consists of a switch and an inductor plus a diode bridge. The switch connects the piezoelectric element to the inductor to form a resonant circuit and invert the piezoelectric voltage. The mechanically excited piezoelectric element typically produces an alternating electric voltage and an alternating current (AC). A control circuit is typically needed for commutating appropriately the switch when a piezoelectric peak voltage is detected.

In the series SSHI circuit, which is illustrated in FIG. 1A, an inductor 234 and a switch 232 are connected in series to a piezoelectric element 12, a diode bridge 42, and a filter capacitor 52. As can be seen in FIG. 1B, in the case of the series SSHI circuit there is no current i flowing from the piezoelectric element 12 to the load 62 except when the switch 232 is closed, as stated in "Energy Harvesting from Ambient Vibrations and Heat", by D. Guyomar, G. Sebald, S. Pruvost, M. Lallart, A. Khodayari and C. Richard, Journal of Intelligent Material Systems and Structures, vol. 20, no. 5, pp. 609-624, March 2009. While the switch 232 is open, the derivative of the piezoelectric voltage and displacement are proportional and the piezoelectric internal capacitor is charged. Once the piezoelectric displacement u reaches an extreme, the switch 232 is closed and the current i flows from the piezoelectric element 12 to the output load 62 through the inductor 234 and the diode bridge 42. Since the series connection of the inductor with the piezoelectric element creates a resonating circuit, the piezoelectric voltage is inverted. Afterwards, the switch is opened again. Prior to opening the switch 232 the piezoelectric voltage $v_1$ has a magnitude of $V_{before}$ and subsequent to closing the switch 232 (and accordingly subsequent to the inversion of the piezoelectric voltage $v_1$ and a phase during which the current i flows) the piezoelectric voltage has a magnitude of $V_{after}$, with $|V_{before}|>|V_{after}|$. The output voltage $V_{DC}$ at the filter capacitor is also illustrated in FIG. 1B.

Figure 2A:
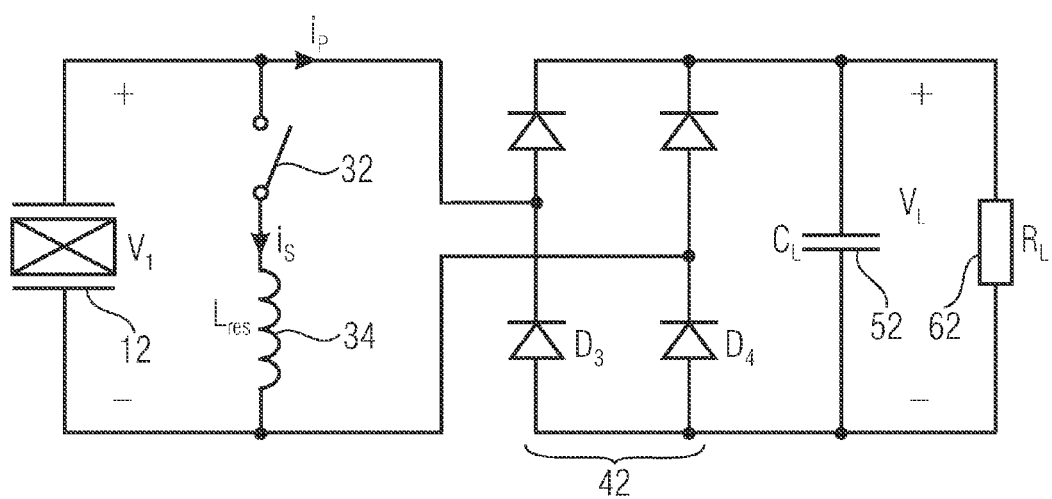
FIG. 2A shows a schematic circuit diagram of a parallel SSHI converter according to conventional technology.

In the case of the parallel SSHI technique, shown in FIG. 2A, a switch 32 and an inductor 34 are connected in parallel to a piezoelectric element 12. A diode bridge 42, a filter capacitor 52, and the output load 62 are connected afterwards. The parallel SSHI technique is, for example, described in an article by S. Ben-Yaakov and N. Krihely, "Resonant rectifier for piezoelectric sources", Applied Power Electronics Conference and Exposition, 2005. APEC 2005, pp. 249-253 Vol. 1, 6-10 Mar. 2005.

The working principle of the parallel SSHI circuit can be explained using FIG. 2B which shows waveforms at steady state associated to the circuit shown in FIG. 2A. The upper diagram in FIG. 2B shows a piezoelectric displacement u, a piezoelectric voltage $v_1$, and a load voltage $V_L$. When a piezoelectric material is mechanically excited, it transforms the mechanical energy into electrical energy. The AC power available between its electrical terminals has to be rectified to obtain DC power. When a piezoelectric element is in open circuit, the derivative of its voltage $dv_1/dt$ and the derivative of its displacement du/dt are proportional since no electrical current is flowing, i.e. I=0.

While the piezoelectric voltage $v_1$ is lower than the rectified voltage, there is no current $i_P$ flowing from the piezoelectric element 12 to the diode bridge 42. Therefore, the derivative of the piezoelectric voltage $dv_1/dt$ and the derivative of the displacement du/dt are proportional. Once the piezoelectric voltage $v_1$ is higher than the rectified voltage plus two times the voltage drop of the diodes, there is current $i_P$ flowing from the piezoelectric element 12 to the diode bridge 42. When the piezoelectric voltage $v_1$ reaches a peak (positive or negative), the switch 32 is closed and current $i_S$ flows from the internal piezoelectric capacitor to the inductor 34. At this moment, a resonant LC circuit is created with the piezoelectric internal capacitor and the voltage on the piezoelectric element changes its polarity in a time $\pi\sqrt{(LC)}$. The current generated by the piezoelectric element flows through the rectifier capacitor 52 and the load 62 when the switch 32 is open and the absolute value of the piezoelectric voltage is higher than the rectified voltage on the load (plus the voltage gaps of two diodes). When the piezoelectric voltage reaches a maximum, the switch 32 is closed. Once the piezoelectric voltage is inverted, the switch 32 is opened again. Since the piezoelectric element 12 is connected most of the time by the diode bridge 42 to the output load 62, it cannot be assumed that when the piezoelectric voltage $v_1$ reaches a peak, the displacement u of the piezoelectric element 12 is maximal. A corresponding parallel SSHI circuit is described by S. Priya and D. J. Inman in "Energy Harvesting Technologies", Springer, 2009, pp. 211-213.

If the piezoelectric voltage and current have the same polarity, the power supplied by the piezoelectric element 12, and therefore the power harvested at the output load 62, is higher than if piezoelectric voltage and current have a phase shift. The fact that piezoelectric voltage and current are in-phase makes possible to emulate the complex conjugate of the piezoelectric impedance as output load.

The piezoelectric current source is proportional to the derivative of the piezoelectric displacement. Moreover, when the piezoelectric element 12 is in open circuit, the piezoelectric current source is proportional to the derivative of the piezoelectric voltage. In other words, the multiplication of current and voltage is positive since the SSHI converters invert the piezoelectric voltage through inductor L and this maximizes the power supplied by the piezoelectric element, and therefore the harvested power. Hence, the piezoelectric voltage and displacement derivatives are proportional (the slopes of both curves have the same sign). However, when the piezoelectric power is rectified employing the parallel SSHI circuit, most of the time the piezoelectric element is connected to the output load, and therefore the derivative of the piezoelectric voltage and the derivative of the displacement are not anymore proportional. Thus, it cannot be assured that the zero-crossing of the piezoelectric current source occurs at the piezoelectric voltage peak which maximizes the harvested power. Nevertheless, for the case of the series SSHI, the piezoelectric element is usually in open circuit and this fact causes the zero-crossing of the internal piezoelectric source to occur during the piezoelectric voltage inversion and the multiplication of piezoelectric voltage and current to be positive, increasing the harvested power.

Figure 3:
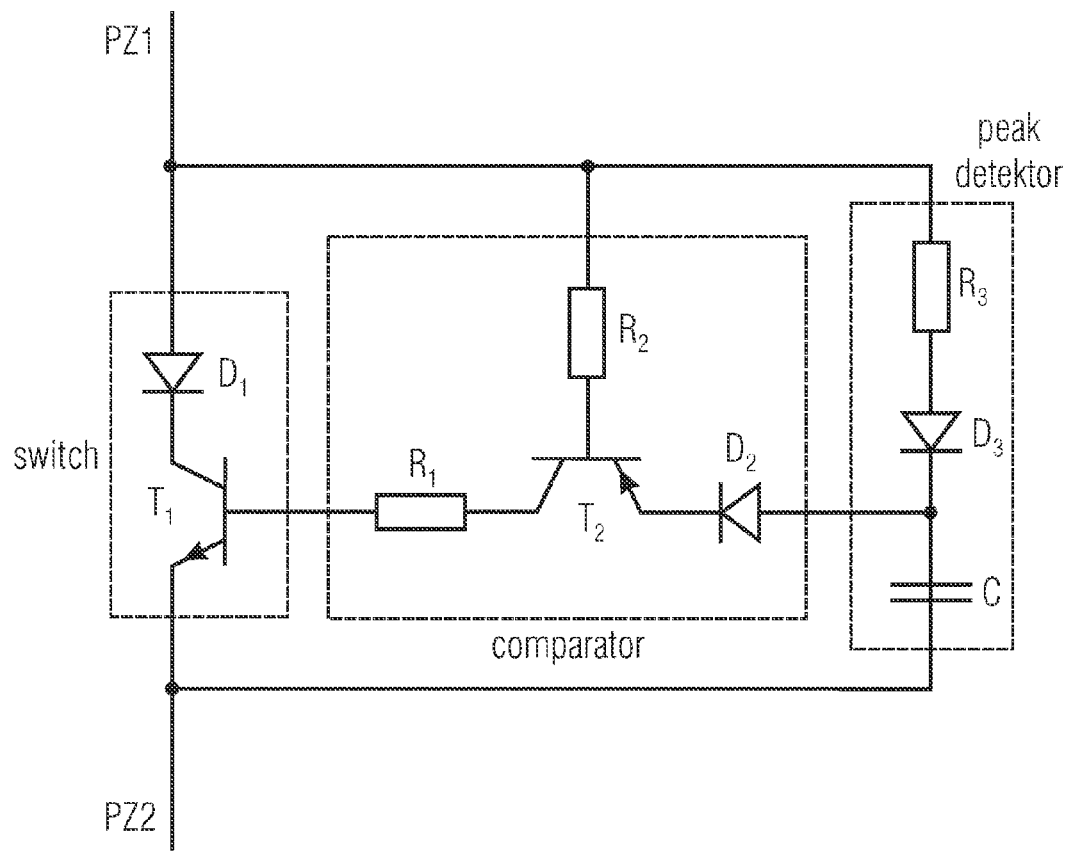
FIG. 3 shows a schematic circuit diagram of a positive peak detector circuit with switch.
Figure 4:
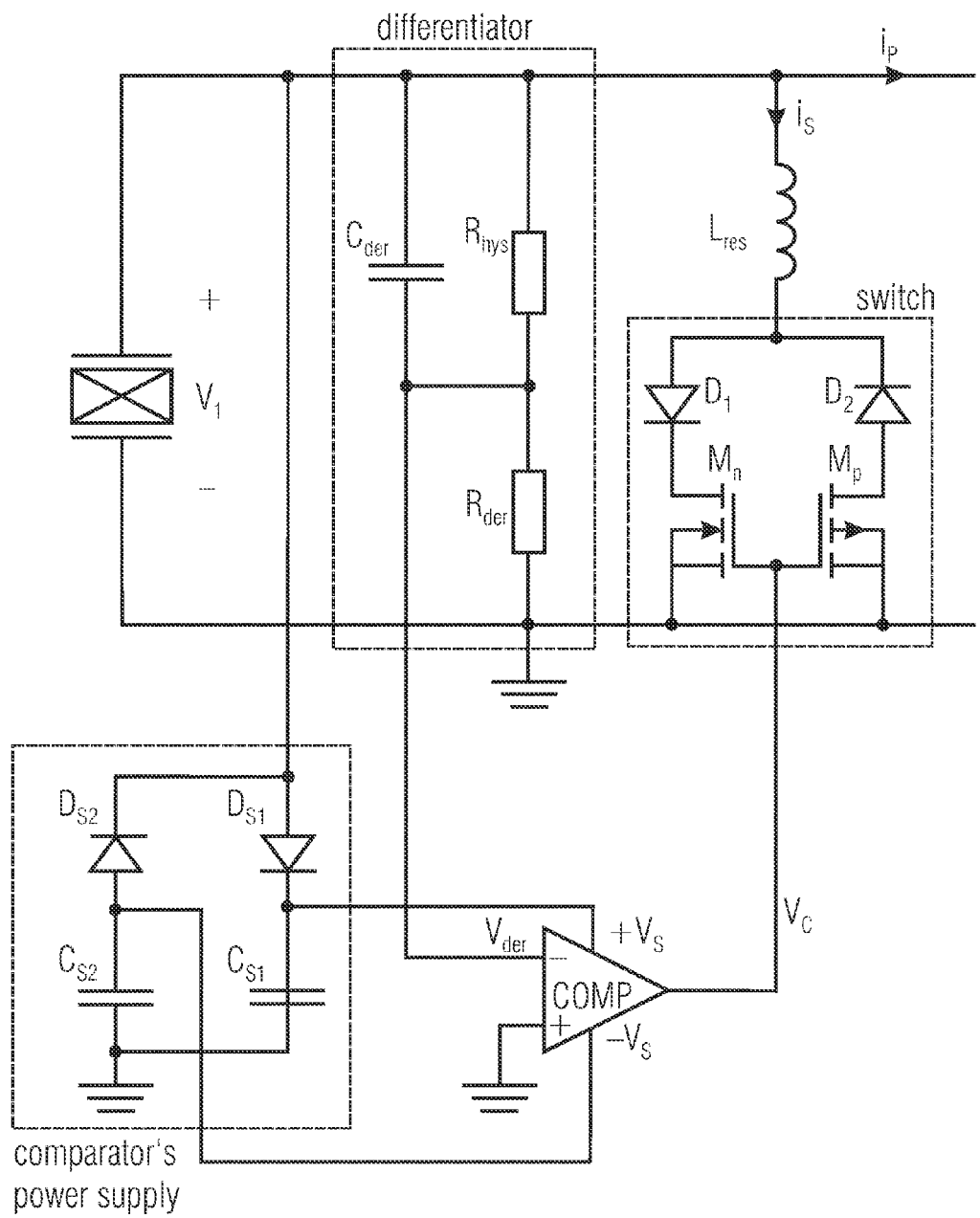
FIG. 4 shows a schematic circuit diagram of a self-powered peak detector circuit for positive and negative peaks.

FIG. 3 shows a schematic circuit diagram of a positive peak detector circuit with switch according to conventional technology. FIG. 4 shows a schematic circuit diagram of another self-powered peak detector circuit for positive and negative peaks according to conventional technology. The mode of operation of the peak detectors shown in FIGS. 3 and 4 is described above in the introduction.

Figure 5A:
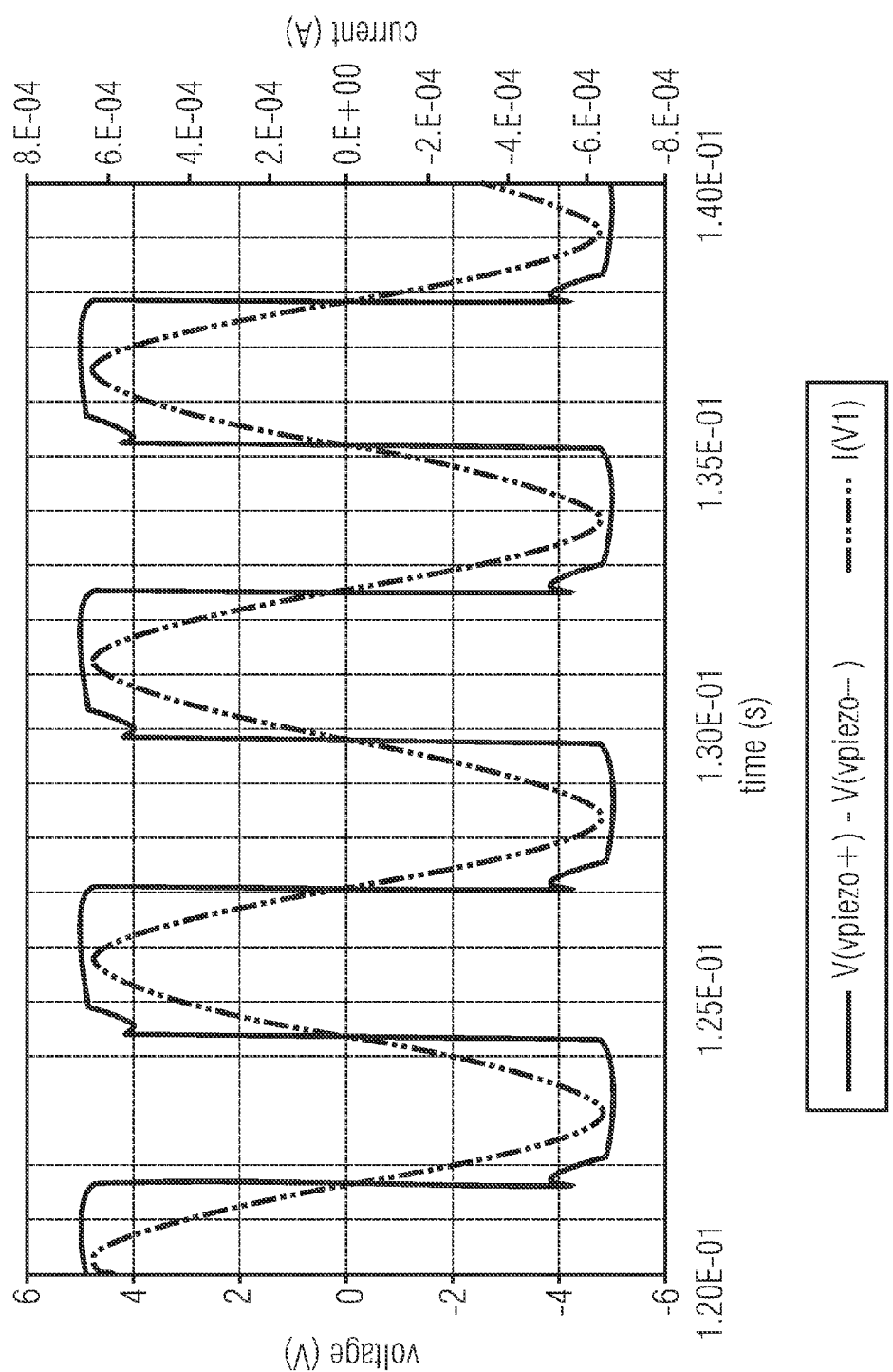
FIG. 5A illustrates piezoelectric voltage V(vpiezo+)−V(vpiezo−) and piezoelectric internal current I(V1) waveforms that are substantially in phase.
Figure 5B:
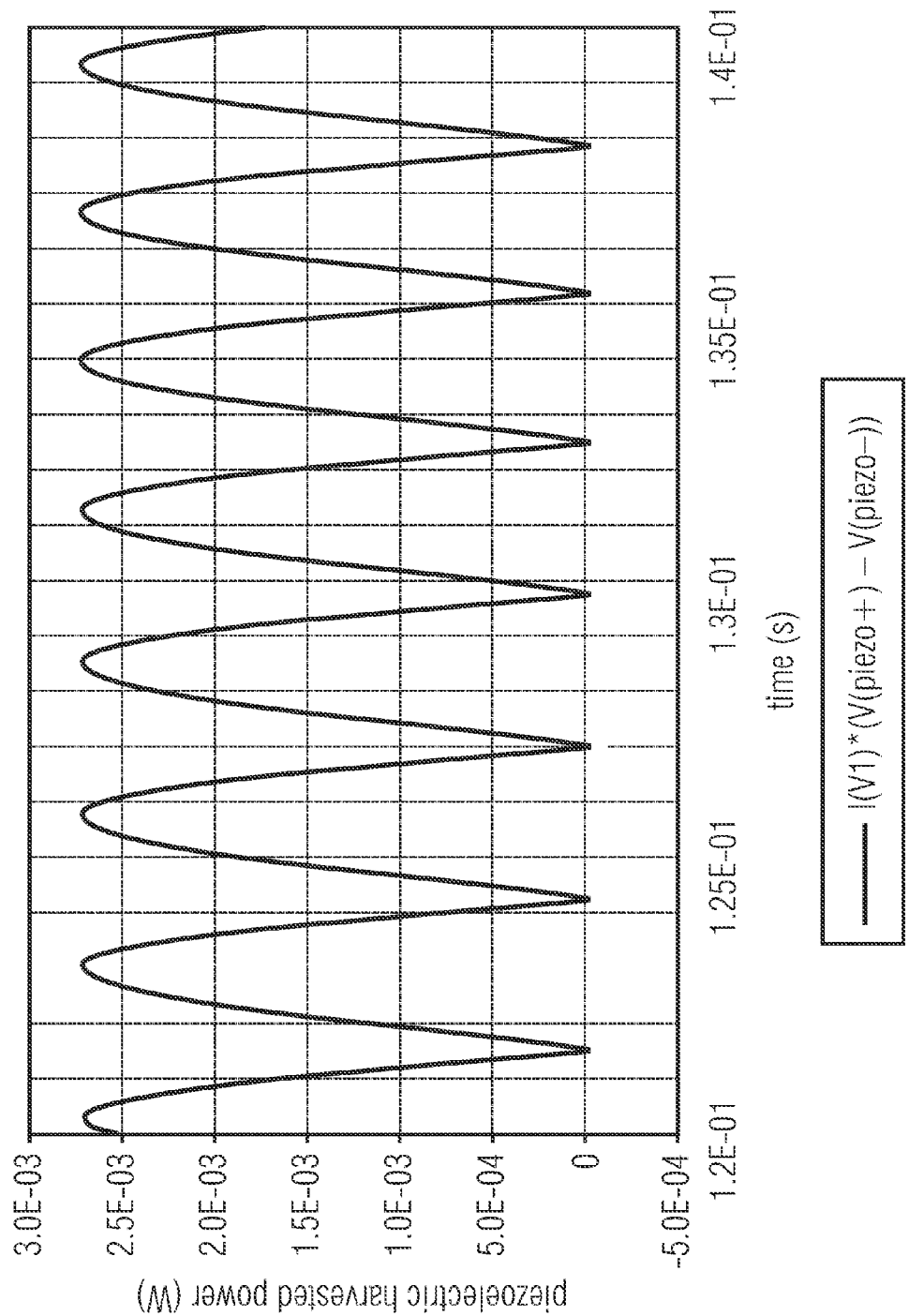
FIG. 5B illustrates the power supplied by a piezoelectric element over time when piezoelectric voltage and current are in phase, as in FIG. 5A.
Figure 6A:
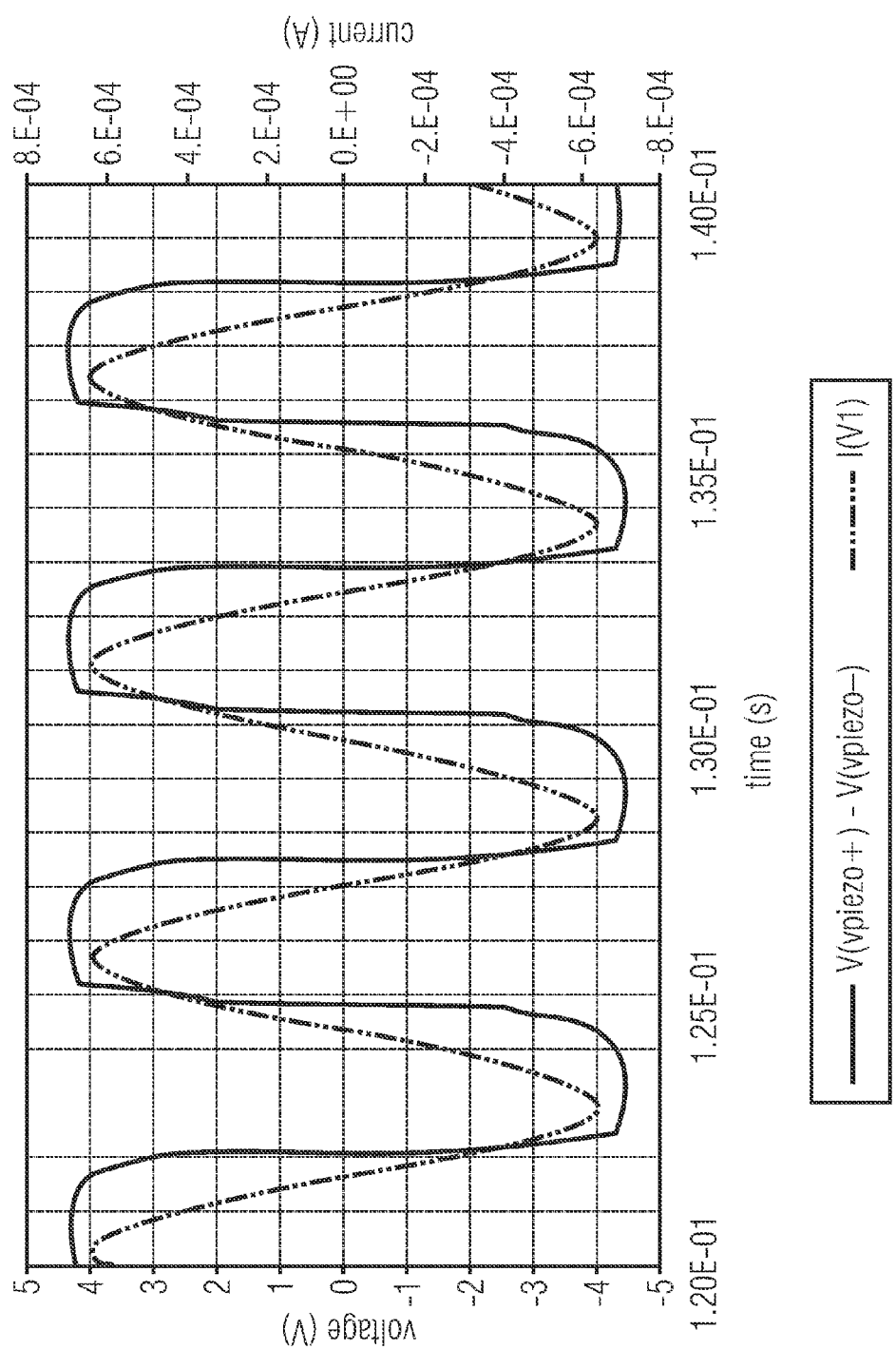
FIG. 6A illustrates piezoelectric voltage and current waveforms when the piezoelectric voltage inversion is done after the peak displacement of the piezoelectric element takes place.
Figure 6B:
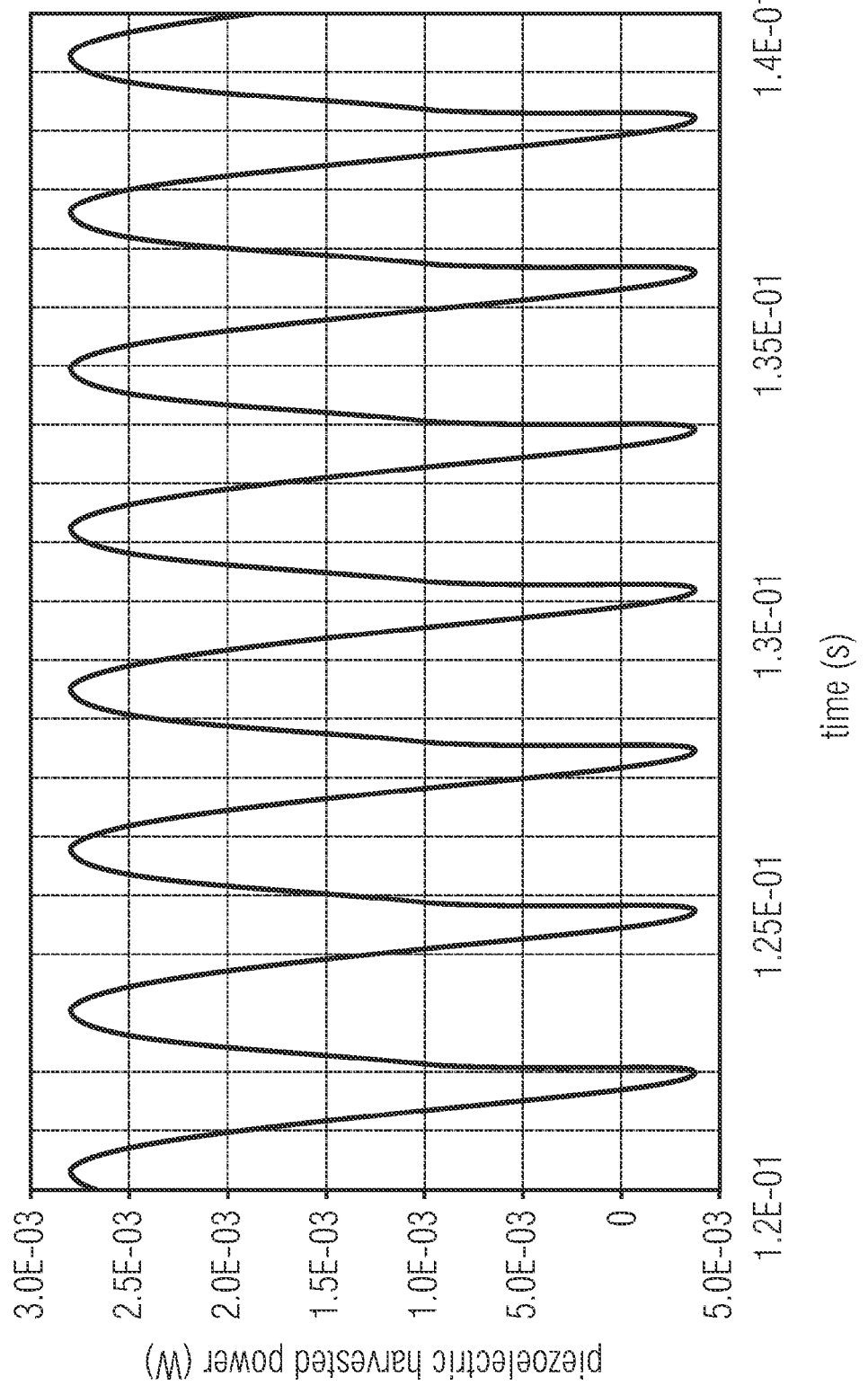
FIG. 6B illustrates the power supplied by the piezoelectric element whose voltage and current waveforms are shown in FIG. 6A.
Figure 7A:
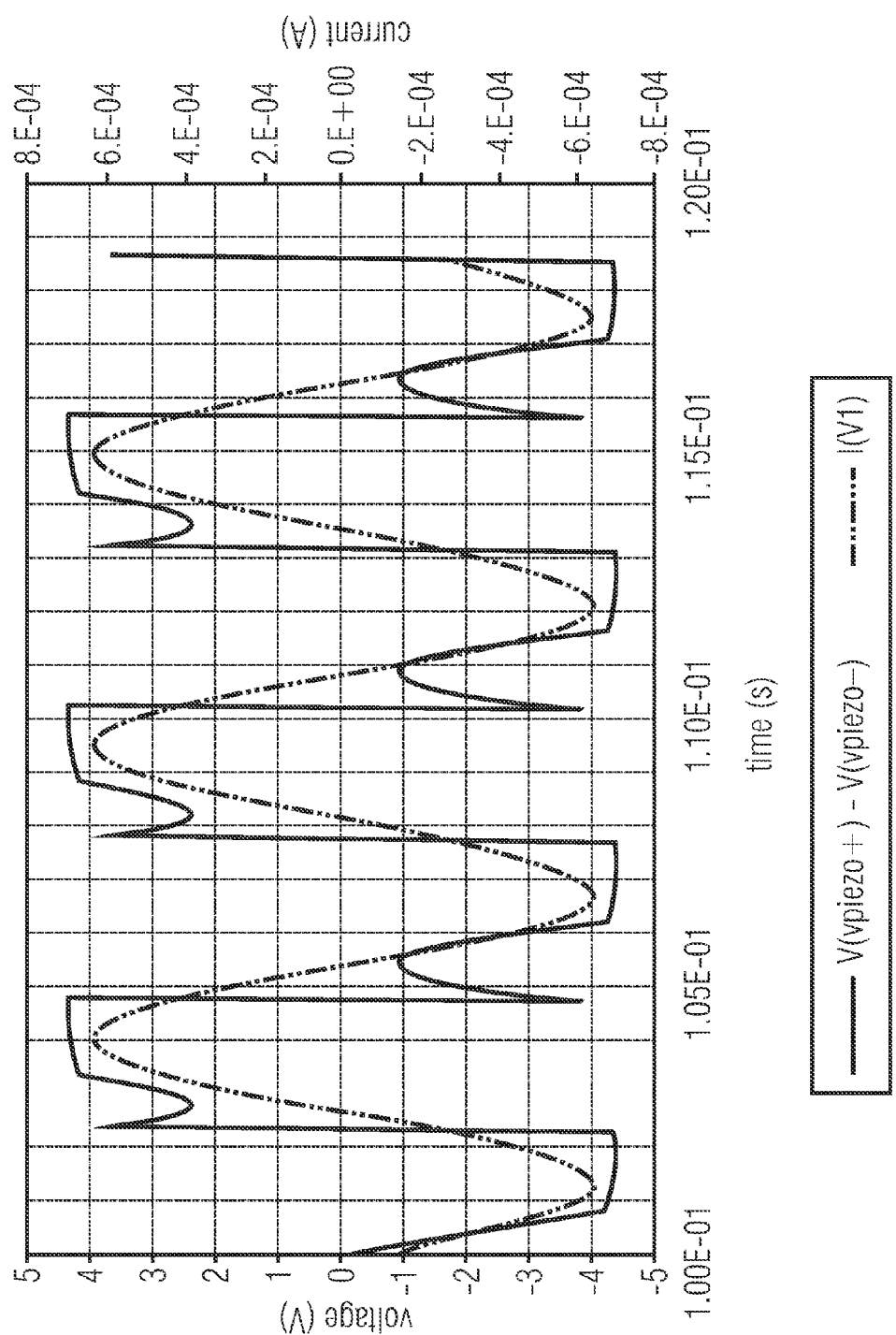
FIG. 7A illustrates piezoelectric voltage and current waveforms when the piezoelectric voltage inversion is done before the peak displacement of the piezoelectric element takes place.
Figure 7B:
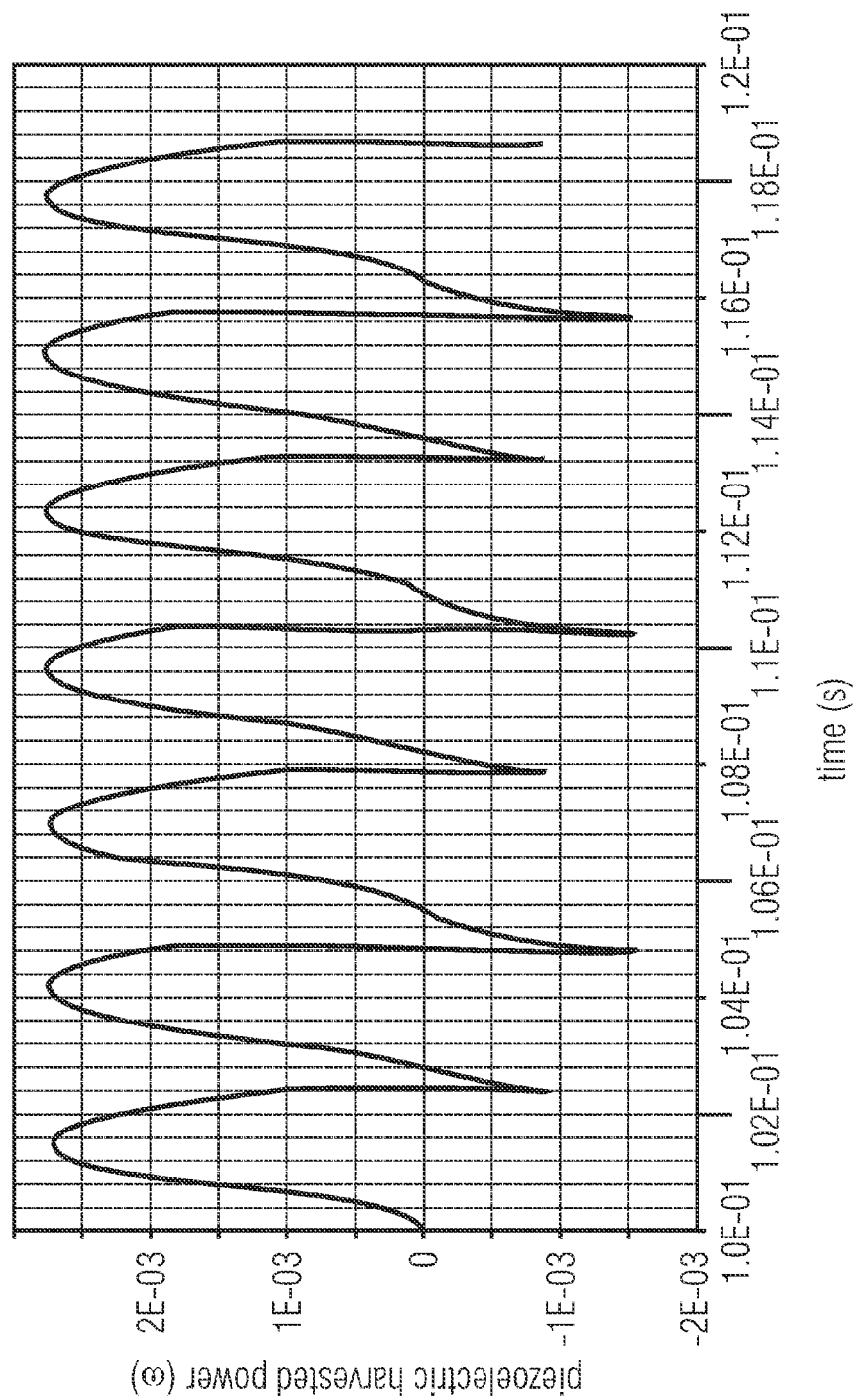
FIG. 7B illustrates the power supplied by the piezoelectric element whose voltage and current waveforms are shown in FIG. 7A.
Figure 8:
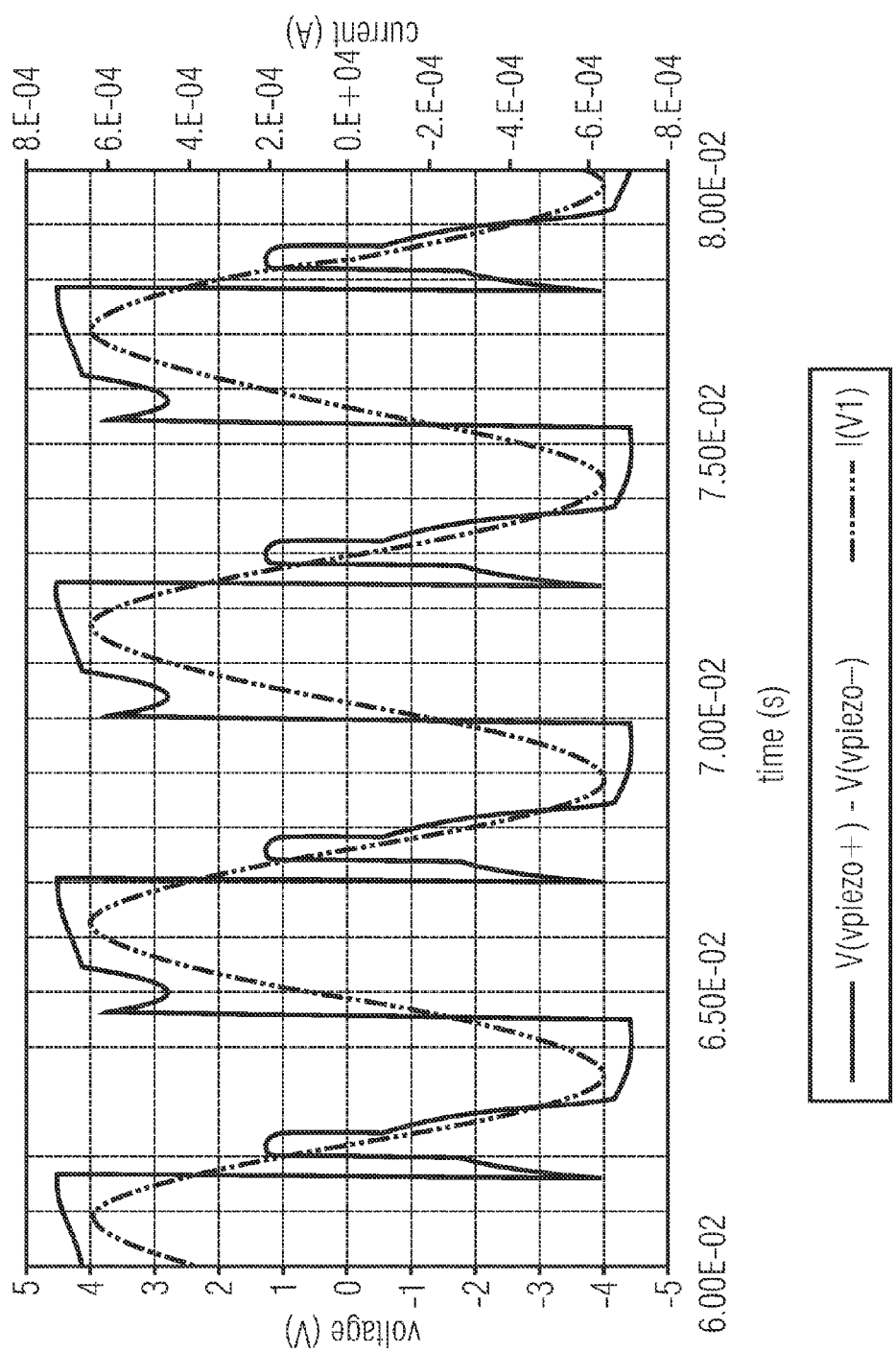
FIG. 8 illustrates piezoelectric voltage and current waveforms when the piezoelectric voltage inversion is done before the peak displacement of the piezoelectric element takes place and this fact causes more than one peak detection per half-cycle.

FIGS. 5A, 6A, 7A, and 8 illustrate typical waveforms of the piezoelectric voltage $v_1$ which is expressed in FIGS. 5A, 6A, 7A, and 8 as V(vpiezo+)−V(vpiezo−). In FIGS. 5A, 7A, and 8 it can be observed that the piezoelectric voltage overshoots more or less when changing its polarity. These overshoots may cause false peak detections of the peak detectors according to conventional technology depicted in FIGS. 3 and 4. FIG. 8 shows the simulation waveforms of the piezoelectric voltage and current that illustrates the case of false voltage peak detection. Furthermore, FIG. 8 illustrates how such a false peak detection may cause the AC/DC converter to perform one or even two additional switching events. It can be seen that after a transition from positive to negative the piezoelectric voltage bounces back up from a value of approximately −4V to a value of approximately −2V. The peak at −4V is falsely detected by the conventional-technology peak detector(s) as a peak that triggers a switching event. Due to the switching event and possibly a resonating effect the piezoelectric voltage rises to a value of approximately +1V. However, as the piezoelectric element is currently excited in a manner that generates a negative piezoelectric voltage, the piezoelectric voltage decreases again to approximately −0.5V. The peak at +1V is again falsely detected by the conventional-technology peak detector(s) and a further switching event is triggered. The piezoelectric voltage decreases rapidly to approximately −4V without overshoot and continues to approximately −4.5V where the true switching-event-relevant negative peak occurs. Note that the piezoelectric voltage also overshoots after a transition from negative to positive but that the peak detector does not falsely detect this as a switching-event-relevant peak.

Figure 9:
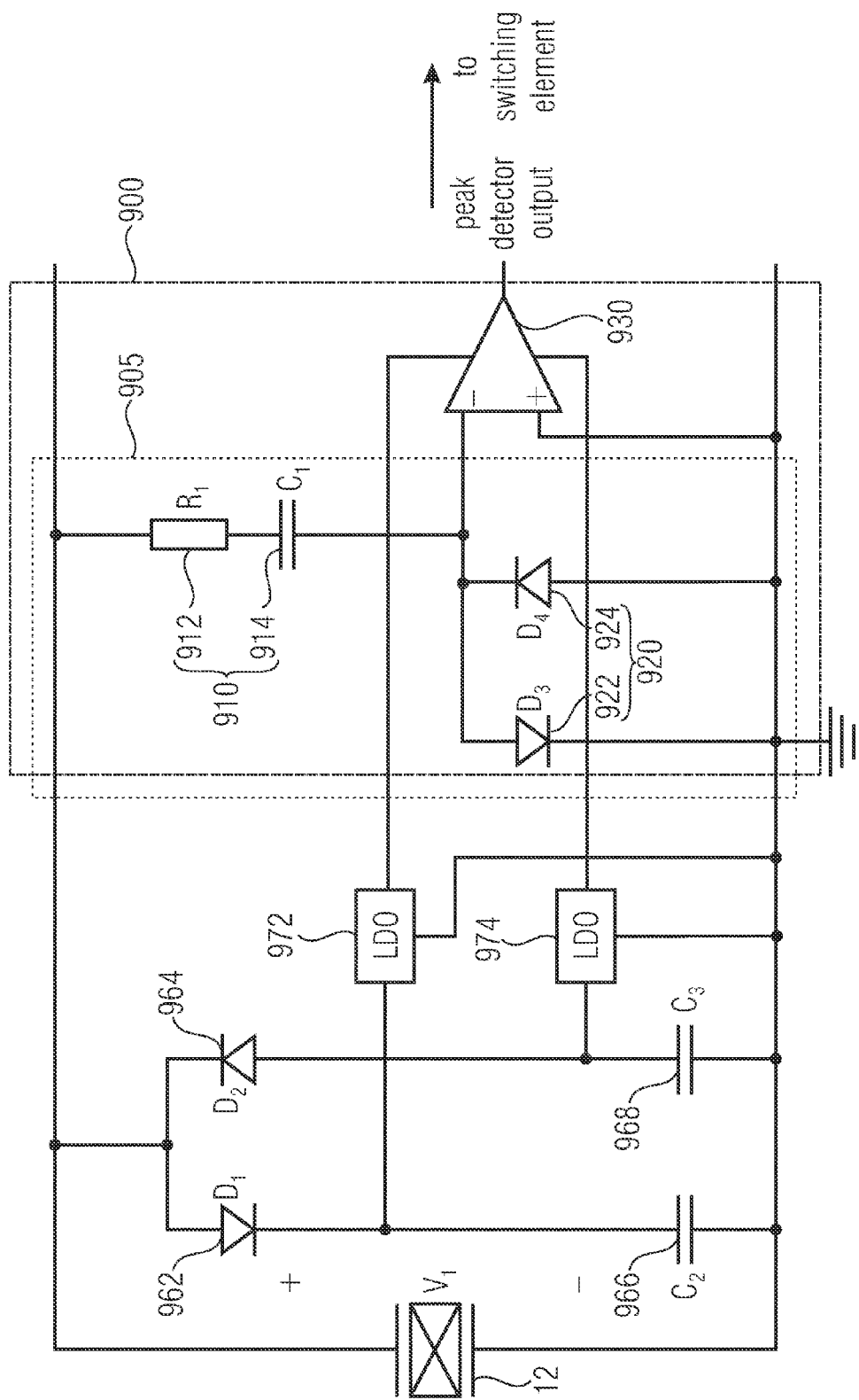
FIG. 9 shows a schematic circuit diagram of a peak detector according to the teachings disclosed herein.

Taking into consideration the peak detector of FIG. 4, a new peak detector circuit is presented in FIG. 9. The peak detector is composed by a resistor $R_1$, a capacitor $C_1$, two diodes, $D_3$ and $D_4$, with an anti-parallel connection and a comparator. A capacitor $C_D$ in parallel with a resistor $R_D$ has been taken as equivalent model of the diodes. The transfer function of the proposed peak detector is:

$$\frac{V_{out}}{V_{in}} = \frac{s/(R_1 C_D)}{s^2 + s\left(\frac{1}{R_D C_D} + \frac{1}{R_1 C_1} + \frac{1}{R_1 C_D}\right) + \frac{1}{R_1 C_1 R_D C_D}}$$

This transfer function has a constant of $1/(R_1 C_D)$, a zero at the origin and a complex conjugate pole at $$\omega_p = \sqrt{\frac{1}{R_1 C_1 R_D C_D}}.$$

Figure 10:
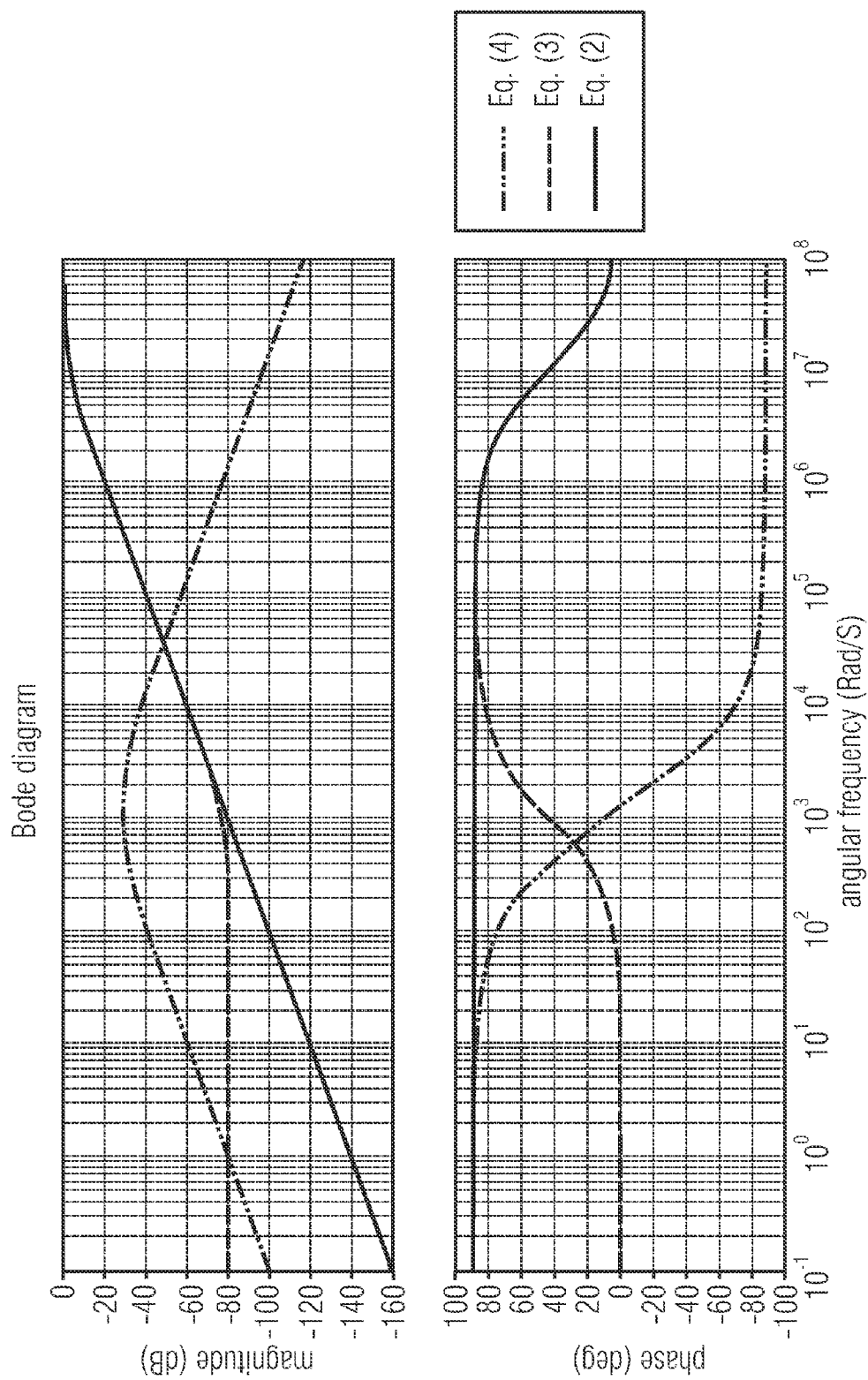
FIG. 10 illustrates Bode plots of three different peak detector circuits.

FIG. 10 shows the bode plot for the transfer functions of the peak detector illustrated in FIG. 4 without the hysteresis resistor $R_{hys}$ (thick solid line), of the peak detector illustrated in FIG. 4 with the hysteresis resistor $R_{hys}$ (dashed line), and of the peak detector according to the teachings disclosed herein and depicted in FIG. 9 (thin solid line). The corresponding transfer functions are:

FIG. 4 without $R_{hys}$:     thick solid line $$\frac{V_{out}}{V_{in}} = \frac{s}{s + \frac{1}{R_{der}C_{der}}}$$

FIG. 4 with $R_{hys}$:     dashed line $$\frac{V_{out}}{V_{in}} = \frac{s + \frac{1}{R_{hys}C_{der}}}{s + \frac{R_{der} + R_{hys}}{R_{der}R_{hys}C_{der}}}$$

FIG. 9:     thin solid line $$\frac{V_{out}}{V_{in}} = \frac{\frac{s}{(R_1 C_D)}}{s^2 + s\left(\frac{1}{R_D C_D} + \frac{1}{R_1 C_1} + \frac{1}{R_1 C_D}\right) + \frac{1}{R_1 C_1 R_D C_D}}$$

The solution presented here as a peak detector circuit has a higher rejection to false peak detections when the piezoelectric voltage inversion is done before the peak displacement than the state-of-the art peak detector because it acts as a differentiator for low frequency signals and as an integrator for high frequency signals.

The bode plot of the peak detector depicted in FIG. 9 shows that it is (behaves as) a differentiator for low frequencies and an integrator at high frequencies. The bode plot of the peak detector according to FIG. 4 without the hysteresis resistor $R_{hys}$ is a first order high pass filter while the differentiator with hysteresis acts as a differentiator for a certain bandwidth. It becomes clear that the peak detectors depicted in FIG. 4 (without $R_{hys}$ and with $R_{hys}$) generate false detections for rapid peaks, i.e., peaks that have a significant high frequency components.

Going back to FIG. 9, the actual peak detector 900 according to the teachings disclosed herein comprises a filter 905 and a comparator 930. The comparator 930 comprises a first comparator input and a second comparator input, wherein the first comparator input is an inverting input and the second comparator input is a non-inverting input. The second comparator input is connected to connector 1216. The first comparator input is connected to an output of the filter 905 and is configured to receive a filtered signal from the filter 905.

The filter comprises a first filter branch 910 and a second filter branch 920. The first filter branch extends between a first peak detector input terminal (connected to the "+"-terminal of the piezoelectric element 12) and the first comparator input terminal (inverting input). The first filter branch 910 comprises a series connection of the resistor $R_1$ and of the capacitor $C_1$. The capacitor $C_1$ is an energy storing element.

The second filter branch 920 extends between the first comparator input terminal (inverting input) and the electrical mass potential. The second filter branch 920 comprises two diodes 922 ($D_3$) and 924 ($D_4$) which are connected in an anti-parallel configuration. The two diodes form a clipper circuit. A clipper circuit is a device designed to prevent the output of a circuit from exceeding a predetermined voltage level. Depending on the threshold voltage(s) of the diodes 922 and 924, the voltage across the clipper circuit (i.e., from the first comparator input to the second comparator input) may assume any value within a voltage range that is delimited by clipping threshold(s) of the clipper threshold. The clipping threshold(s) may be identical to the threshold voltage(s) of the diodes 922, 924, or the clipping threshold may be a function (or functions) of thereof.

As described above, the anti-parallel configuration of the two diodes 922, 924 may be approximated by a parallel connection of the resistor $R_D$ and the capacitor $C_D$.

The peak detector 900 is connected to a power supply comprising two diodes 962 ($D_1$) and 964 ($D_2$), two capacitors 966 ($C_2$) and 968 ($C_3$), and two low-dropout regulators (LDO) 972 and 974. During a positive half-cycle of the operation of the piezoelectric element 12, the capacitor 966 is charged via the diode 962. During a negative half-cycle of the operation, the capacitor 968 is charged via the diode 964. The voltage across the capacitor 966 is provided as an input to the first LDO 972. Likewise, the voltage across the capacitor 968 is provided as an input to the second LDO 974. The first and second LDOs 972, 974 provide regulated power supply voltages to the comparator 930. As an alternative to the LDOs 972, 974, a Zener diode may be used to limit the voltage supply of comparator 930. Other circuits for providing a stable supply voltage may also be used.

Briefly, the functionality of the peak detector 900 is as follows. When a positive (negative) peak voltage is reached on the piezoelectric element 12, the voltage on the inverting input of the comparator 930 changes its polarity from positive (negative) to negative (positive) acting as a differentiator. Since the voltage on the non-inverting input is higher (lower) than the voltage on the inverting input, the output voltage of the comparator 930 changes its value from −Vdd(+Vdd) to +Vdd(−Vdd).

Figure 11:
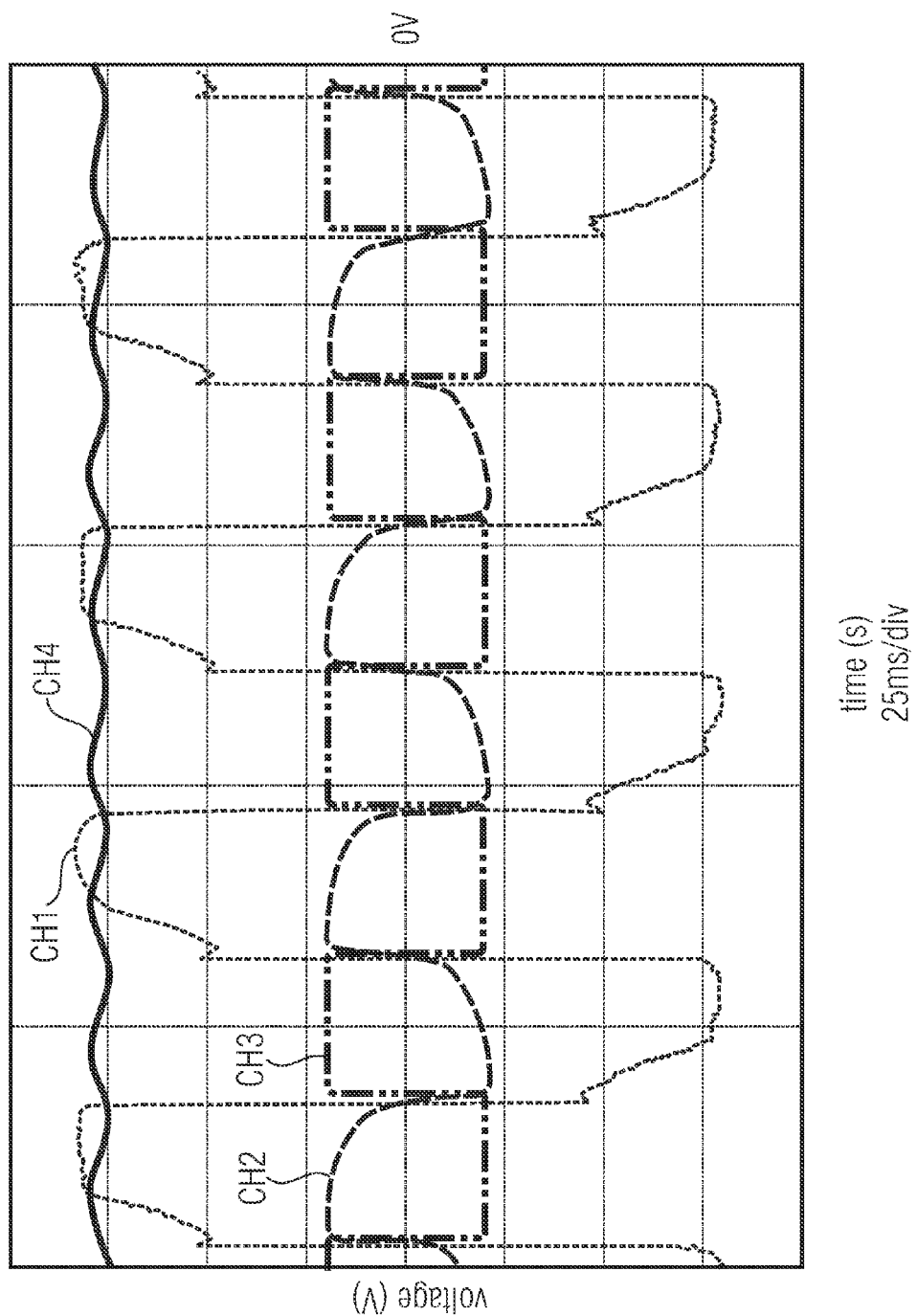
FIG. 11 illustrates steady state waveforms of voltages occurring in a modified parallel SSHI converter comprising a peak detector according to the teachings disclosed herein.

FIG. 11 shows steady state measured waveforms of the parallel SSHI circuit and its control circuit of FIG. 9. CH1 corresponds to the piezoelectric voltage, CH2 is the voltage on the negative input of the comparator 930 (voltage on the inverting input of the comparator 930), CH3 is the output voltage of the comparator 930 (control signal for the MOSFETs of an SSHI converter), and CH4 corresponds to the DC output voltage of the parallel SSHI converter. For CH1 CH3 and CH4, the scale is 5V/division while for CH2, the scale is 500 mV/division.

It can be seen that the voltage at the inverting input of the comparator 930 is not (or only negligibly) affected by the overshoots in the piezoelectric voltage which occur slightly after a transition of the piezoelectric voltage from negative to positive and from positive to negative. As a result, the comparator 930 switches (i.e., generates a rising edge or a falling edge) only after a "true" maximum/minimum has occurred (the maxima occur approximately at +16V and the minima occur approximately at −15.5V).

Figure 12:
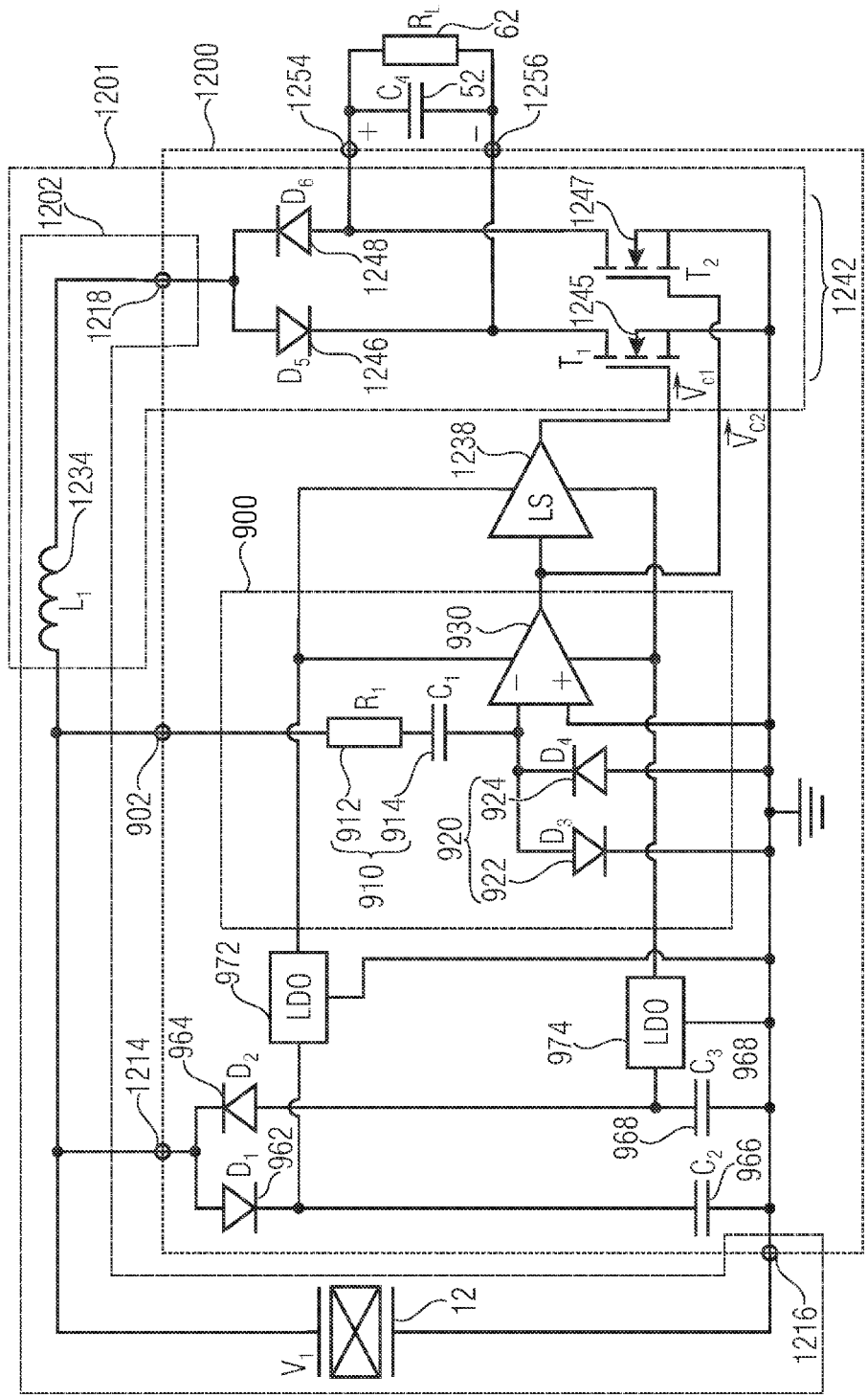
FIG. 12 shows a schematic circuit diagram of a modified parallel SSHI converter comprising a peak detector as described above.

A peak detector according to the teachings disclosed herein may be used with a variety of AC-DC converters that have controllable switching elements and therefore utilize control signals for the controllable switching elements, such as a series SSHI converter, a parallel SSHI converter, or a synchronized rectifier (active rectifier). As an example, FIG. 12 shows a schematic of a modified parallel SSHI converter 1200 comprising a peak detector 900 according to the teachings disclosed herein.

The modified parallel SSHI converter 1200 is connected to a piezoelectric element 12 via AC side terminals 1214 and 1216 which are connected to an inductor 1234 and a rectifier bridge 1242. The rectifier bridge 1242 of the modified parallel SSHI converter 1200 comprises a first bridge branch and a second bridge branch which are connected in a parallel configuration between the AC side terminals 1216 and 1218. The first bridge branch comprises a diode 1246 ($D_5$) and a n-channel MOSFET 1245 ($T_1$) of the enhancement type. The second bridge branch comprises a diode 1248 ($D_6$) and a p-channel MOSFET 1247 ($T_2$). A first DC-side terminal 1256 of the modified parallel SSHI converter 1200 is connected to a node between the diode 1248 ($D_6$) and the MOSFET 1247 ($T_2$) of the second bridge branch. A second DC-side terminal 1254 of the modified parallel SSHI converter 1200 is connected to a node between the diode 1246 ($D_5$) and the MOSFET 1245 ($T_1$) of the first bridge branch.

Both bridge branches comprise output nodes that are connected to one of the pairs of output terminals 1254, 1256. The output nodes are (electrically) between the controllable switching elements and the other switching elements (i.e., the diodes) of the bridge branches. Accordingly, the output node of the first bridge branch is connected to the output terminal 1254 and the output node of the second bridge terminal is connected to the output terminal 1256 of the parallel SSHI converter 1200 according to the embodiment of FIG. 12. A parallel circuit comprising the filter capacitor 52 and the output load 62 extends between the first output terminal 1254 and the second output terminal 1256.

The two MOSFETs 1245 and 1247 are controlled by one control signal. The gate of n-channel MOSFET 1245 is connected to an output of the peak detector 900 which provides the control signal $v_{CTRL1}$. The gate of n-channel MOSFET 1245 is connected to an output of a positive level shifter 1238. An input of the positive level shifter 1238 is connected to the output of the peak detector 900 carrying the control signal $v_{CTRL2}$. The positive level shifter 1238 processes the control signal $v_{CTRL2}$ and produces the control signal $v_{CTRL1}$ on the basis of $v_{CTRL2}$. The control signals $v_{CTRL1}$ and $v_{CTRL2}$ control the n-channel MOSFET 1245 and the p-channel 1247 in an alternating manner.

A first partial circuit 1201 useful for understanding the operation of the modified parallel SSHI converter 1200 comprises the rectifier bridge 1242 and the inductor 1234 as an energy storing element. The two controllable switching elements 1245, 1247 of the rectifier bridge 1242 enable a low-ohmic connection (substantially a short-circuit) between the pair of input terminals 1216, 1218 to be formed via the first bridge branch or the second bridge branch. In this manner, a second partial circuit 1202 comprising the energy storing element 1234, the pair of input terminals 1216, 1218, and the energy source 12 (e.g., the piezoelectric element) may be substantially short-circuited and the energy storing element 1234 is connected in parallel to the energy source 12. Accordingly, the rectifier circuit 1200 may be regarded as a parallel SSHI converter. Note that the energy storing element 1234 is considered to be a part of the first partial circuit 1201 and also of the second partial circuit 1202. The grouping of several elements within the first partial circuit 1201 and the second partial circuit 1202 is done for explanatory purposes so that is becomes more readily clear, which components are affected by, for example, a substantial short-circuit caused by the rectifier bridge 1242.

The modified parallel SSHI topology according to the embodiment shown in FIG. 12 is just composed by two diodes 1246, 1248 and two MOSFETs 1245, 1247 which reduce the voltage drops of the diodes and MOSFETs with respect to some parallel and series SSHI circuits according to conventional technology. Since two diodes of the rectifier bridge have been substituted by two active MOSFETs 1245, 1247, the power harvested by the modified parallel SSHI 1200 has increased in comparison with the other SSHI topologies. Moreover, no further diode or transistors may be used which increases the efficiency as well.

The modified parallel SSHI converter 1200 typically has four different phases of operation, two of which are rectifying or rectification phases and the two other phases being inversion phases of the operation of the modified parallel SSHI converter 1200. A rectification phase is followed by an inversion phase, i.e., the rectification phases and the inversion phases follow an alternating pattern.

In a first rectification phase, the piezoelectric element 12 currently generates a piezoelectric voltage $v_1$ that is positive and greater (regarding the magnitude) than a rectified voltage at the filter capacitor 52 plus the voltage gap of one diode 1246 or 1248 and a possible voltage drop over a controllable switching element 1245 or 1247. The controllable switching element 1247 is controlled to be in a conducting state by the peak detector 900 and the control signal $v_{CTRL2}$. This fact and the fact that the piezoelectric voltage $v_1$ is greater than the rectified voltage causes the diode 1246 ($D_5$) to become conductive so that a current path is formed, the current path starting from a first terminal of the piezoelectric element 12 via the energy storing element or inductor 1234, the first input terminal 1216, the diode 1246 ($D_5$), the filter capacitor 52 and the load 62, the controllable switching element 1247, and the second input terminal 1218 back to a second terminal of the piezoelectric element 12. The electrical current thus charges the filter capacitor 52.

When the piezoelectric voltage $v_1$ reaches its positive peak, diode 1246 ($D_5$) conducts and the control signal $v_{CTRL2}$ changes its polarity. Thus, the MOSFET 1247 stops conducting (i.e., turns off) and the MOSFET 1245 starts conducting due to a corresponding polarity change of the control signal $v_{CTRL1}$ generated by the positive level shifter 1238, thereby connecting the inductor 1234 in parallel to the piezoelectric element 12. During a second phase of the operation of the rectifier circuit 1200 an inversion of the piezoelectric voltage $v_1$ is performed. The inversion is made possible by the formation of a resonant circuit due to the parallel connection of the internal capacitance of the piezoelectric element 12 and the inductor 1234. In other words, during the second phase of the operation of the rectifier circuit 1200 a temporary conducting path via the rectifier bridge 1242 is formed along a bridge branch comprising the diode 1246 ($D_5$) and the MOSFET 1245 ($T_1$). The temporary conducting path substantially bypasses the pair of output terminals 1254, 1256 and substantially short-circuits the second circuit 1202 which comprises the energy storing element 1234 (i.e., the inductor), the pair of input terminals 1216, 1218, and the energy source 12 (i.e., the piezoelectric element) that is connectable to the pair of input terminals 1216, 1218.

Once the inversion is completed and the piezoelectric voltage $v_1$ reaches a negative peak value, diode 1246 ($D_5$) does not conduct anymore and the diode 1248 ($D_6$) starts conducting. During the rectification phase of the negative half-cycle, $D_6$ and $T_1$ conduct.

A further phase of the operation of the rectifying circuit is an inversion phase of the negative half-cycle. When the piezoelectric voltage $v_1$ reaches its negative peak, the peak detector 900 causes the control signal $v_{CTRL2}$ to change its polarity from positive to negative. Thus, the MOSFET 1245 stops conducting and the MOSFET 1247 starts conducting again connecting the inductor 1234 in parallel to the piezoelectric element 12. During the inversion phase of the negative half-cycle the bridge branch comprising the MOSFET 1247 ($T_2$) and the diode 1248 ($D_6$) form a temporary conducting path via the rectifier bridge 1242 which substantially bypasses the output terminals 654, 656 and which substantially short-circuits the second circuit 1202. Once the inversion is completed and the piezoelectric voltage $v_1$ reaches a positive value, diode 1246 ($D_5$) starts conducting and the cycle starts over again with the rectification phase of the positive half-cycle. During the rectification phase of the positive half-cycle, the diode 1246 ($D_5$) and the MOSFET 1247 ($T_2$) conduct.

The peak detector 900 is configured to sense the piezoelectric voltage $v_1$ and to generate the control signal $v_{CTRL2}$ on the basis of the sensed piezoelectric voltage $v_1$. For example, the peak detector 900 may be configured to detect local maxima and local minima of the piezoelectric voltage $v_1$ and the control signal $v_{CTRL2}$ may be switched from a positive level to a negative level upon detection of a local maximum or minimum, or vice versa. The positive level shifter 1238 further processes the control signal $v_{CTRL2}$ to generate the control signal $v_{CTRL1}$ for the MOSFET 1245.

During the rectification of the AC power, the modified parallel SSHI converter 1200 substantially acts as a half-synchronous rectifier since the circuit has two diodes 1246, 1248 and two MOSFETs 1245, 1247. Thus, the efficiency during this phase (these phases) is increased with respect to the other existing SSHI topologies. A synchronous rectification of the diodes is also possible employing the control circuit for synchronous rectification that appears in the European patent application 10192761.4 entitled "Diodenersatzschaltung, Aufwärtswändlerschaltung, Abwärtswandlerschaltung and Brückengleichrichterschaltung" of the inventor M. Pollack. Moreover, if the two diode 1246 ($D_5$), 1248 ($D_6$) are substituted by two active MOSFETs, the efficiency may increase, in particular if the peak detector 900 consumes relatively little power. A synchronous rectifier may also be selected for the design of the application specific integrated circuit (ASIC) since diodes designed with, for example, some CMOS technologies may have a voltage drop of 1.8V for a continuous reverse voltage of 20 V. Discrete MOSFETs that may offer better efficiency results in SSHI converters are designed for high frequency applications although the vibration frequencies employed for exciting the piezoelectric elements are relatively low, e.g., below 110 Hz. The cause is that when the piezoelectric element is connected in parallel with the inductor through the MOSFET and the diode, a resonant LC circuit is established with a resonant frequency of $2\pi\sqrt{(LC)}$ and the low capacitances associated to high frequency transistors provide better results.

Besides the peak detector 900 the teachings disclosed herein thus also relate to a rectifier circuit or SSHI converter 1200 comprising a pair of input terminals 1216, 1214, a pair of output terminals 1254, 1256, and a first circuit 1201 interconnecting the pair of input terminals 1216, 1214. The first circuit 1201 comprises an energy storing element 1234 and a rectifier bridge 1242, wherein the rectifier bridge 1242 comprises at least one controllable switching element 1245, 1247 per bridge branch, wherein an output of the rectifier bridge 1242 supplies the pair of output terminals 1254, 1256 and wherein the at least one controllable switching element 1245, 1247 per bridge branch is configured to provide a temporary conducting path via the rectifier bridge 1242 which substantially bypasses the pair of output terminals 1254, 1256 and which substantially short-circuits a second circuit 1202 comprising the energy storing 1234 element, the pair of input terminals 1216, 1218, and an energy source 12 connectable to the pair of input terminals 1216, 1218. Furthermore, the SSHI converter may comprises a peak detector 900 according to the teachings disclosed herein.

According to further embodiments of the present invention, the energy storing element (or energy storage element) and the rectifier bridge may be connected in series.

The rectifier bridge 1242 may be configured to function both as an energy transferring component from the pair of input terminals 1216, 1218 to the pair of output terminals 1254, 1256 and as an inverter for the pair of input terminals.

Each bridge branch may comprise a diode component 1246, 1248 and the at least one controllable switching element 1245, 1247.

According to at least some further embodiment of the teachings disclosed herein, the rectifier circuit 1242 may further comprise a controller configured to generate at least one control signal for the at least one controllable switching element per bridge branch on the basis of a sense signal indicating a state of the energy source. In particular, the controller may be a peak detector 900 according to the teachings disclosed herein.

The controller may be configured to cause a switching of the at least one controllable switching element 1245, 1247 from a conducting state to a non-conducting state, or vice versa, upon a detection of a peak in the sense signal.

The energy storing element 1234 may form a resonant circuit with the energy source 12 while the second circuit 1202 is short-circuited via the rectifier bridge 1242.

According to at least some further embodiments of the teachings disclosed herein, the energy storing element 1234 may be connectable in parallel to the energy source while the second circuit 1202 is short-circuited via the rectifier bridge 1242.

According to some further embodiments, the energy source 1 may be a piezoelectric element.

Further embodiments of the teachings disclosed herein provide a method for rectifying an electrical current generated by an energy source. The method comprises applying the electrical current to a first circuit comprising a rectifier bridge and an energy storing element so that the rectifier bridge conducts the electrical current to an output of the rectifier bridge along a first rectification path associated with a first current flow direction of the electrical current. The method further comprises detecting a first specific pattern in a sense signal associated with the electrical current and reconfiguring the rectifier bridge, in response to detecting the first specific pattern, by switching a controllable switching element of the rectifier bridge from a non-conducting state to a conducting state. In this manner, the electrical current is conducted within the rectifier bridge along a first inversion path that substantially short-circuits a second circuit comprising the energy storing element and the energy source and bypasses an output of the rectifier bridge. The rectifier bridge is then again reconfigured or allowed to perform a self-reconfiguration in response to a change of the current flow direction from the first current flow direction to a second current flow direction so that the rectifier bridge conducts the electrical current to the output of the rectifier bridge along a second rectification path associated with the second current flow direction.

The detection of the first pattern in the sense signal may be based on a method for detecting a peak in an electrical input voltage for an alternating-current/direct-current converter according to the teachings disclosed herein. The mentioned method for detecting the peak comprises receiving an input signal for a peak detector and filtering the input signal with a filter having differentiating transfer characteristic for a low frequency range and an integrating transfer characteristic for a high frequency range of the input signal, to obtain a filtered signal, so that peaks of the input signal to the peak detector which have primarily frequency components in the low frequency range cause a relatively strong variation of the filtered signal and peaks of the input signal to the peak detector which have primarily frequency components in the high frequency range are substantially integrated and cause a relatively weak variation of the filtered signal. The method for detecting further comprises comparing the filtered signal with a comparator threshold and generating an output signal on the basis of a result of comparing the filtered signal with the comparator threshold, the output signal indicating a relation of the filtered signal with respect to the comparator threshold.

Figure 13:
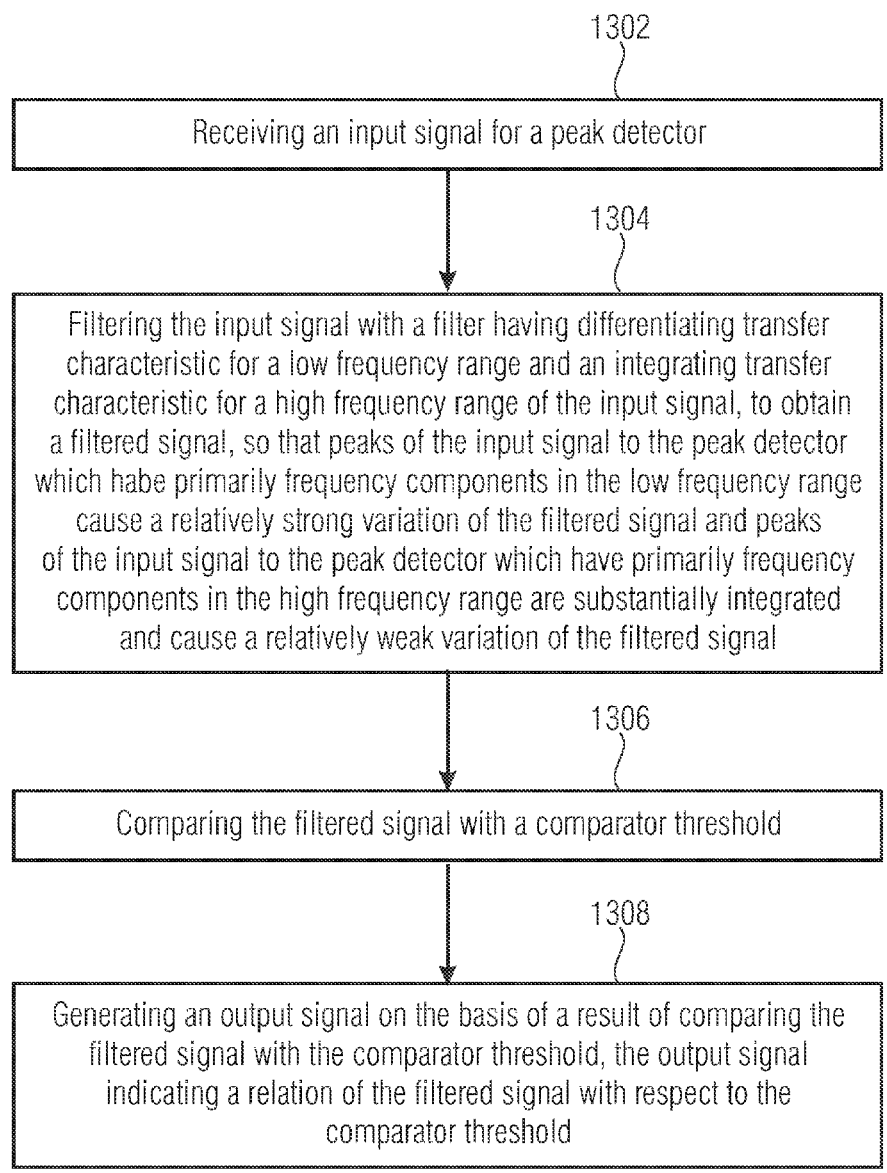
FIG. 13 shows a schematic flow diagram of a method for detecting a peak in an input signal.

FIG. 13 shows a schematic flow diagram of a method for detecting a peak in an electrical input voltage for an alternating-current/direct-current (AC-DC) converter. At a step 1302 an input signal for a peak detector is received. At a step 1304 the input signal is filtered with a filter having a differentiating transfer characteristic for a low frequency range and an integrating transfer characteristic for a high frequency range of the input signal. In this manner a filtered signal may be obtained. Peaks of the input signal to the peak detector which have primarily frequency components in the low frequency range cause a relatively strong variation of the filtered signal and peaks of the input signal to the peak detector which have primarily frequency components in the high frequency range are substantially integrated and cause a relatively weak variation of the filtered signal.

At a step 1306 of the method illustrated in FIG. 13 the filtered signal is compared with a comparator threshold. At a step 1308 an output signal is generated on the basis of a result of comparing the filtered signal with the comparator threshold, the output signal indicating a relation of the filtered signal with respect to the comparator threshold.

FIGS. 14A to 22B show waveforms of different signals that occur in the peak detector for a triangle input signal at different frequencies. The frequencies are: 2 Hz, 5 Hz, 10 Hz, 50 Hz, 100 Hz, 200 Hz, 1 kHz, 10 kHz, and 50 kHz. In a similar manner, FIGS. 23A to 27B show waveforms of different signals for a rectangle input signal at different frequencies.

Figure 14A:
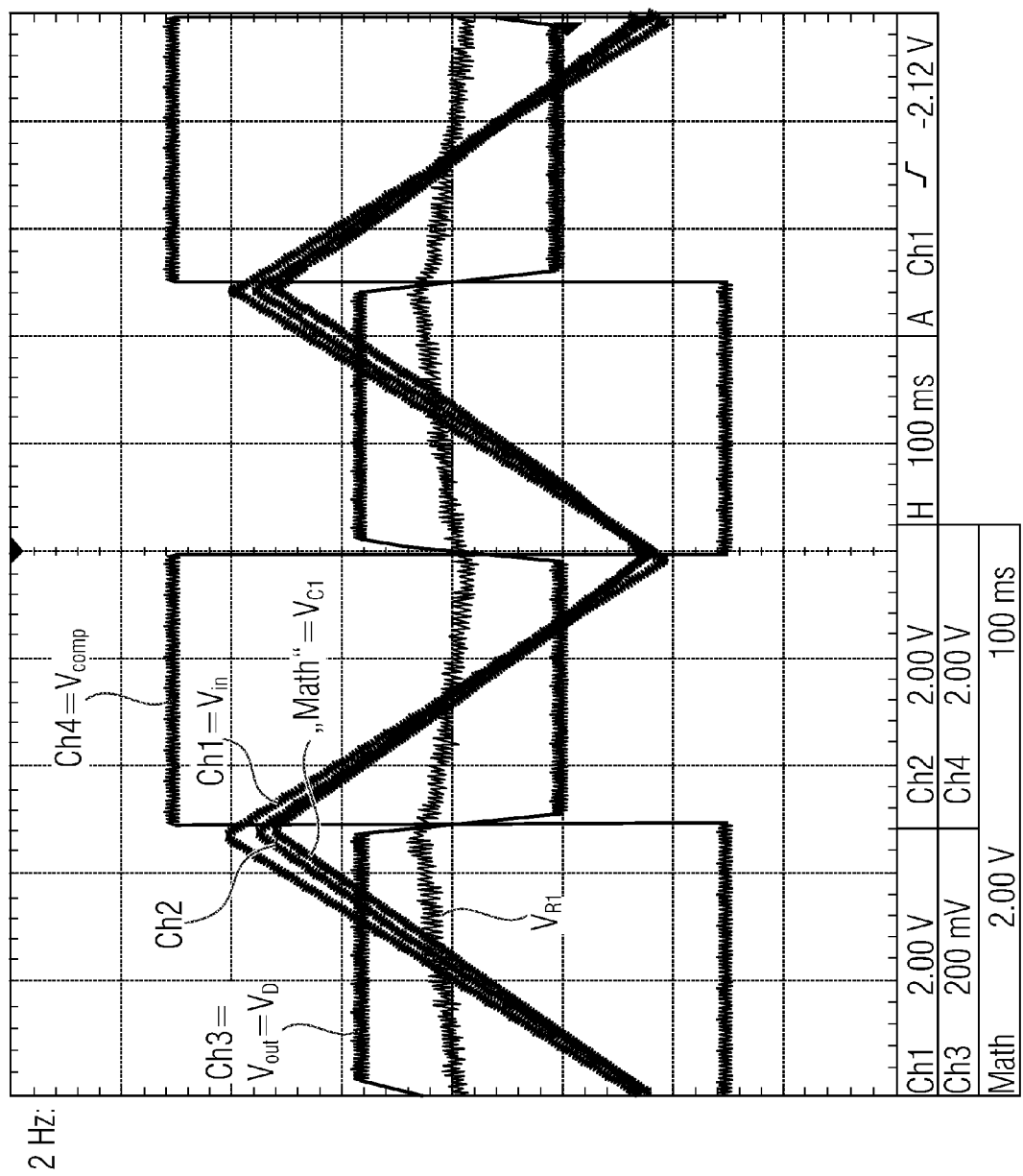
FIGS. 14A and 14B show waveforms of different signals that occur in the peak detector for a triangular input signal of 2 Hz.
Figure 14B:
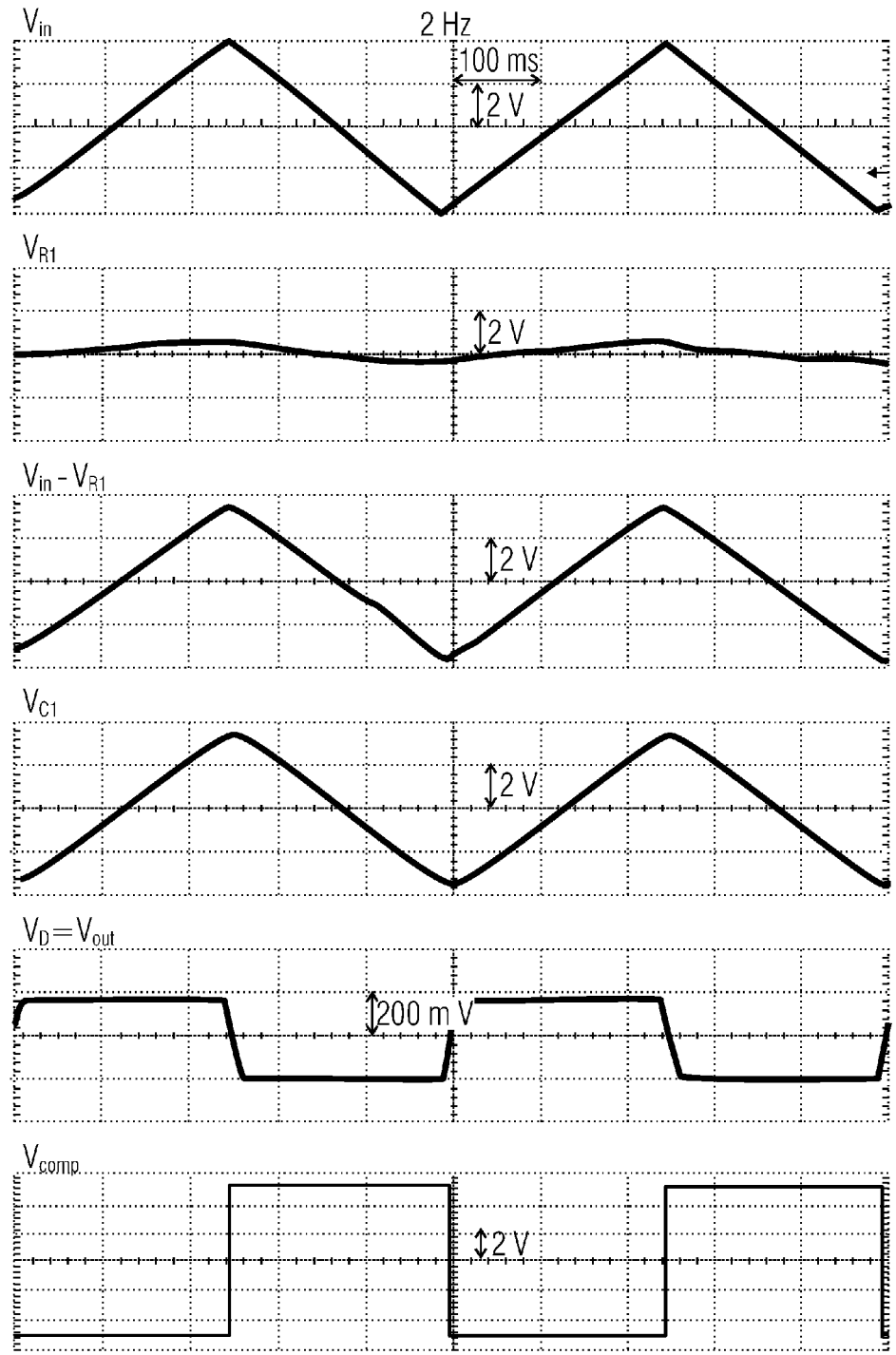

FIGS. 14A and 14B show waveforms of different signals that occur in the peak detector for a triangular input signal of 2 Hz. FIG. 14A shows all the signals together in one plot, whereas FIG. 14B shows the different signals separately for clearer representation.

The input signal $V_{in}$ is a triangle signal with a frequency of 2 Hz and is represented in channel 1 (Ch1, 2V/div). The input signal $V_{in}$ corresponds to the voltage between the AC side terminals 1214 and 1216 in FIG. 12 (also see FIG. 9, where $V_{in}$ corresponds to the voltage output by the piezo element 12). In channel 2 (Ch2) of the diagram in FIG. 14A the voltage of the node between the resistor $R_1$ 912 and the capacitor $C_1$ 914 relative to the reference potential (e.g., in FIGS. 9 and 12: the electric potential of the lower terminal of the piezo element 12) is shown. In other words, Ch2 shows the voltage $V_{in}$–$V_{R1}$, where $V_{R1}$ (2V/div) is the voltage that is dropped over the resistor $R_1$ 912 in FIGS. 9 and 12. The voltage $V_{R1}$ is also represented in FIGS. 14A and 14B. The channel "Math" (2V/div) in the diagrams in FIGS. 14A and 14B shows the voltage $V_{C1}$ dropped over the capacitor $C_1$ 914. As the frequency of the input signal $V_{in}$ of 2 Hz is relatively low, the capacitor voltage $V_{C1}$ is able to substantially follow the triangle waveform of the input voltage $V_{in}$. The capacitor voltage $V_{C1}$ is the input voltage $V_{in}$ diminished by the resistor voltage $V_{R1}$ and the voltage $V_D$ over the antiparallel diodes 922, 924 (represented in Ch3 of the diagrams in FIGS. 14A and 14B). The diode voltage $V_D$ is also the output voltage of the filter and thus corresponds to the filtered input voltage which is applied to an input of the comparator 930. The diode voltage is clipped at approximately +/−200 mV due to the threshold voltages of the two diodes 922, 924. While the diode voltage $V_D$ is at or close to the threshold voltage of one of the diodes 922, 924, said diode is normally conducting, i.e., an electric current may flow through the series connection of resistor $R_1$, capacitor $C_2$, and the conducting diode 922 or 924. Moreover, this electric current is proportional to the resistor voltage $V_{R1}$, due to Ohm's law $V_{R1}=R_1*I$ so that the electric current can be determined from the waveform of $V_{R1}$ in FIGS. 14A and 14B.

Note that the diode voltage $V_D$ substantially follows the variation of the input voltage $V_{in}$ after a peak has occurred in the input voltage $V_{in}$ until the diode voltage $V_D$ has reached the other threshold voltage. The slope of the input voltage $V_{in}$ between −260 ms and −210 ms is approximately 4V/230 ms=17.4V/s. The diode voltage $V_D$ has a slope of approximately 370 mV/20 ms=18.5V which matches very well with the variation of the input voltage $V_{in}$. In other words, the peak in the input voltage $V_{in}$ causes the diode voltage $V_D$ to be pushed away from the threshold voltage of the diode which had been conducting just prior to the peak in the input voltage $V_{in}$ into the non-conducting voltage range of the antiparallel diodes 922, 924. Thus, the electric current that is flowing through the filter portion (resistor $R_1$, capacitor $C_1$, and antiparallel diodes 922, 924) of the peak detector is abruptly cut off so that the capacitor 914 cannot be charged or decharged during this period. Accordingly, the capacitor 914 substantially maintains its capacitor voltage $V_{C1}$ at the value the capacitor voltage $V_{C1}$ had reached just prior to the peak in the input voltage.

The measurements were done employing 1 Megaohm resistor and 3.3 nF capacitor in the peak detector.

The output signal $V_{comp}$ of the comparator 930 is shown in FIGS. 14A and 14B in channel 4 (Ch4, 2V/div). As the comparator threshold is at 0V relative to the reference potential, the comparator output typically toggles whenever the diode voltage $V_D$ crosses 0V (exceptions may apply if the diode voltage $V_D$ is too weak and/or too high in frequency, in which case the comparator 930 may not be able to follow anymore).

Figure 15A:
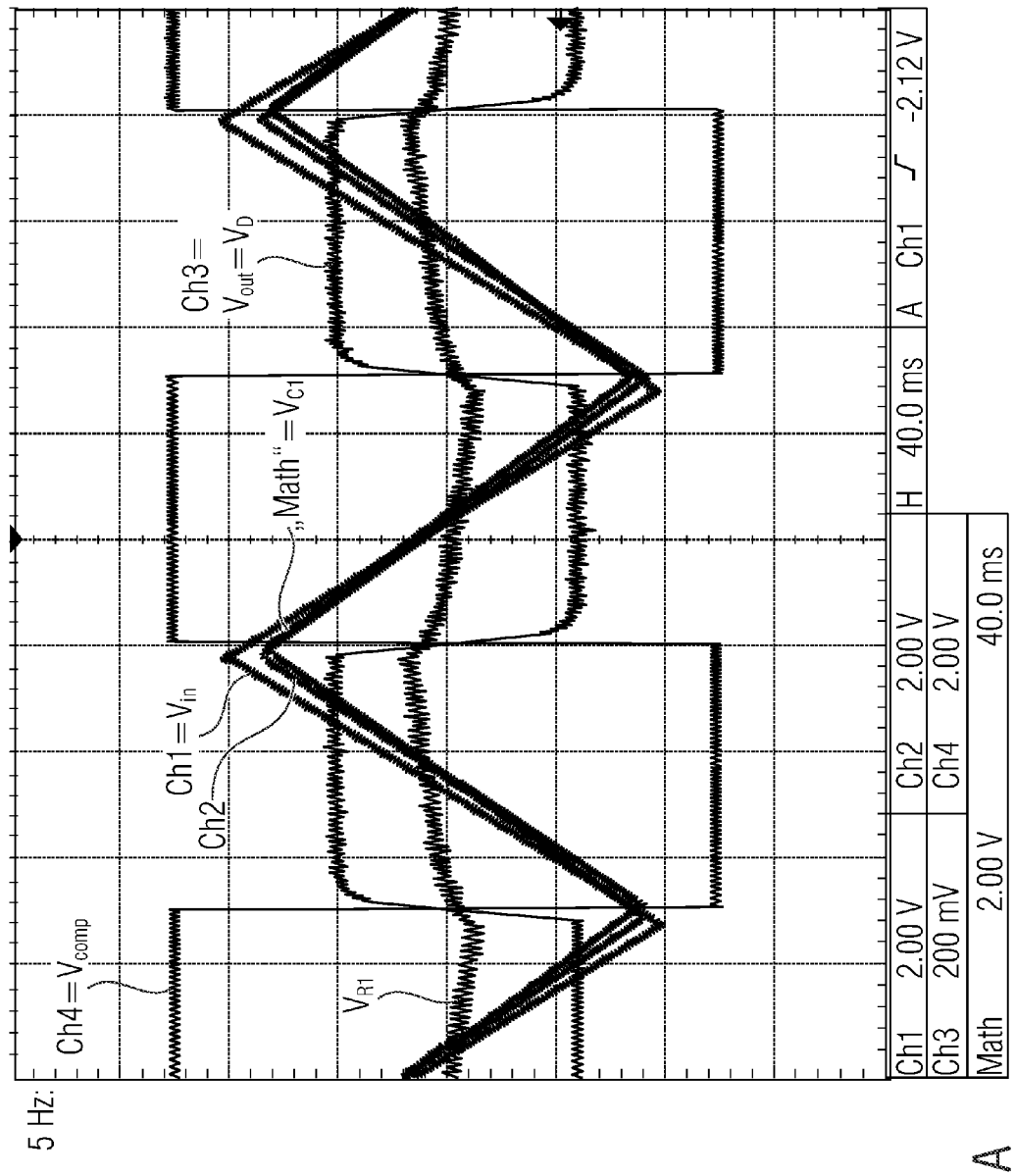
FIGS. 15A and 15B show waveforms of different signals that occur in the peak detector for a triangular input signal of 5 Hz.
Figure 15B:
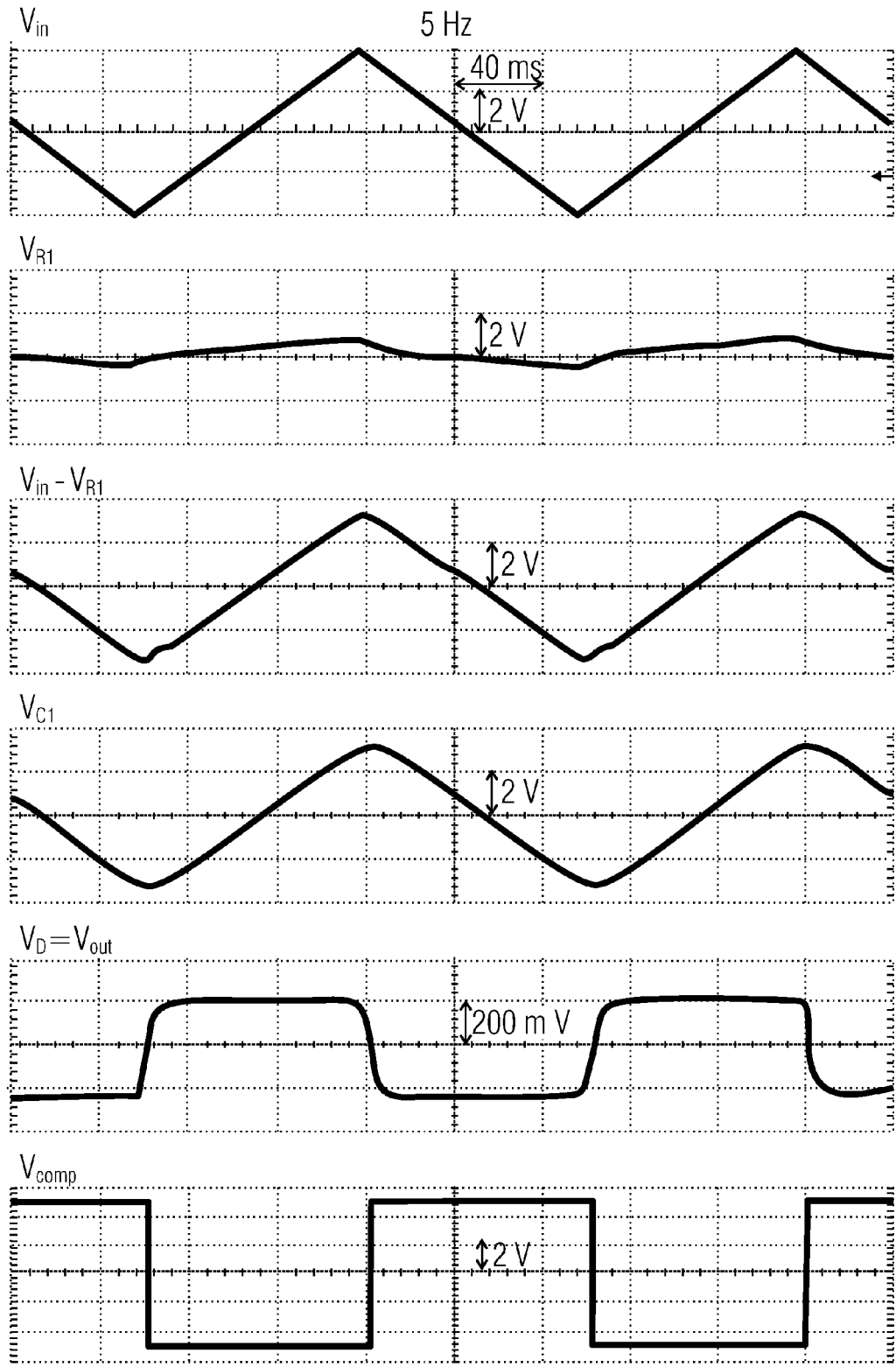

FIGS. 15A and 15B show waveforms of different signals that occur in the peak detector for a triangular input signal of 5 Hz. The signals have similar waveforms as in the 2 Hz case of FIGS. 14A and 14B so that reference is made to the above description.

Figure 16A:
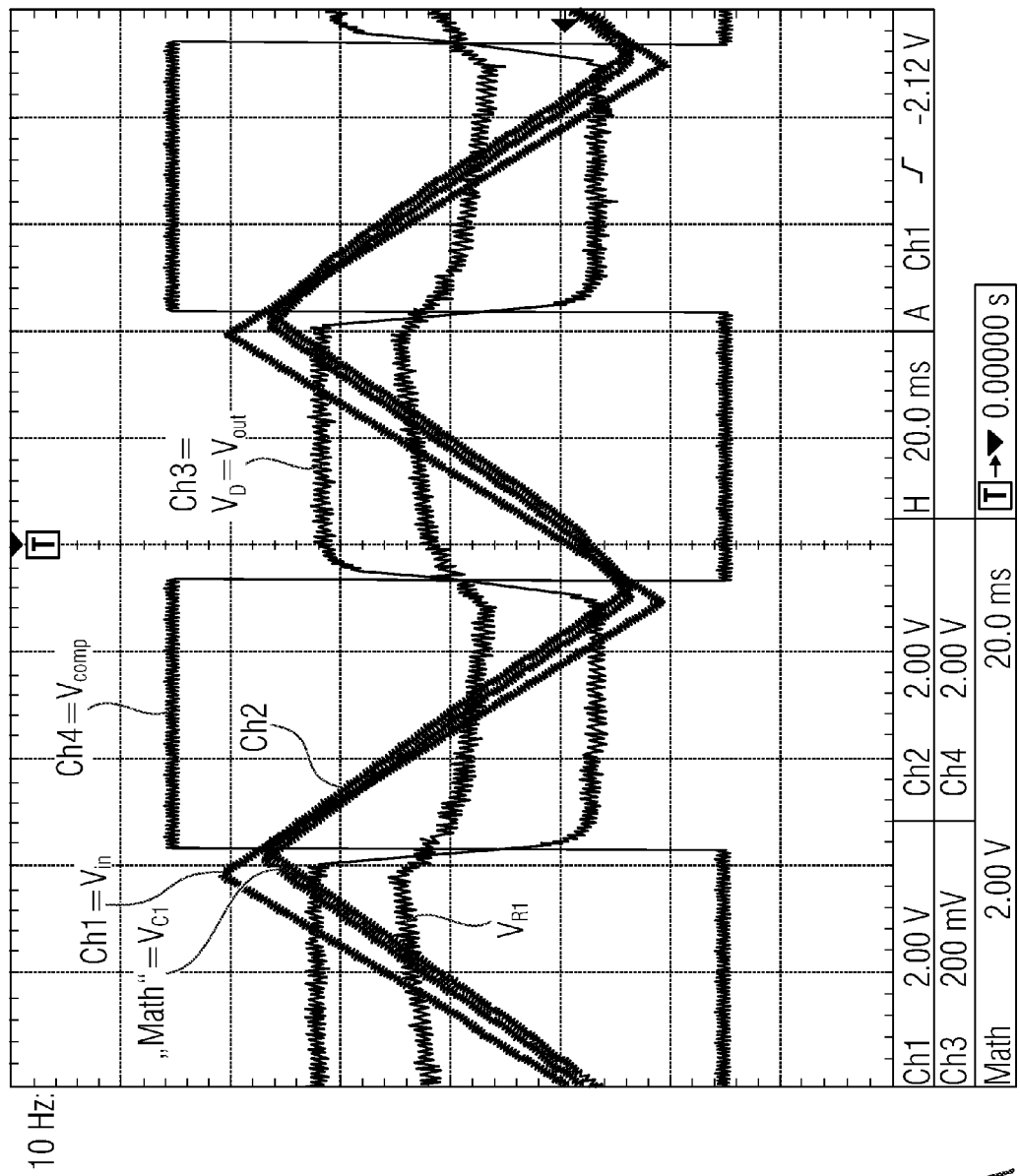
FIGS. 16A and 16B show waveforms of different signals that occur in the peak detector for a triangular input signal of 10 Hz.
Figure 16B:
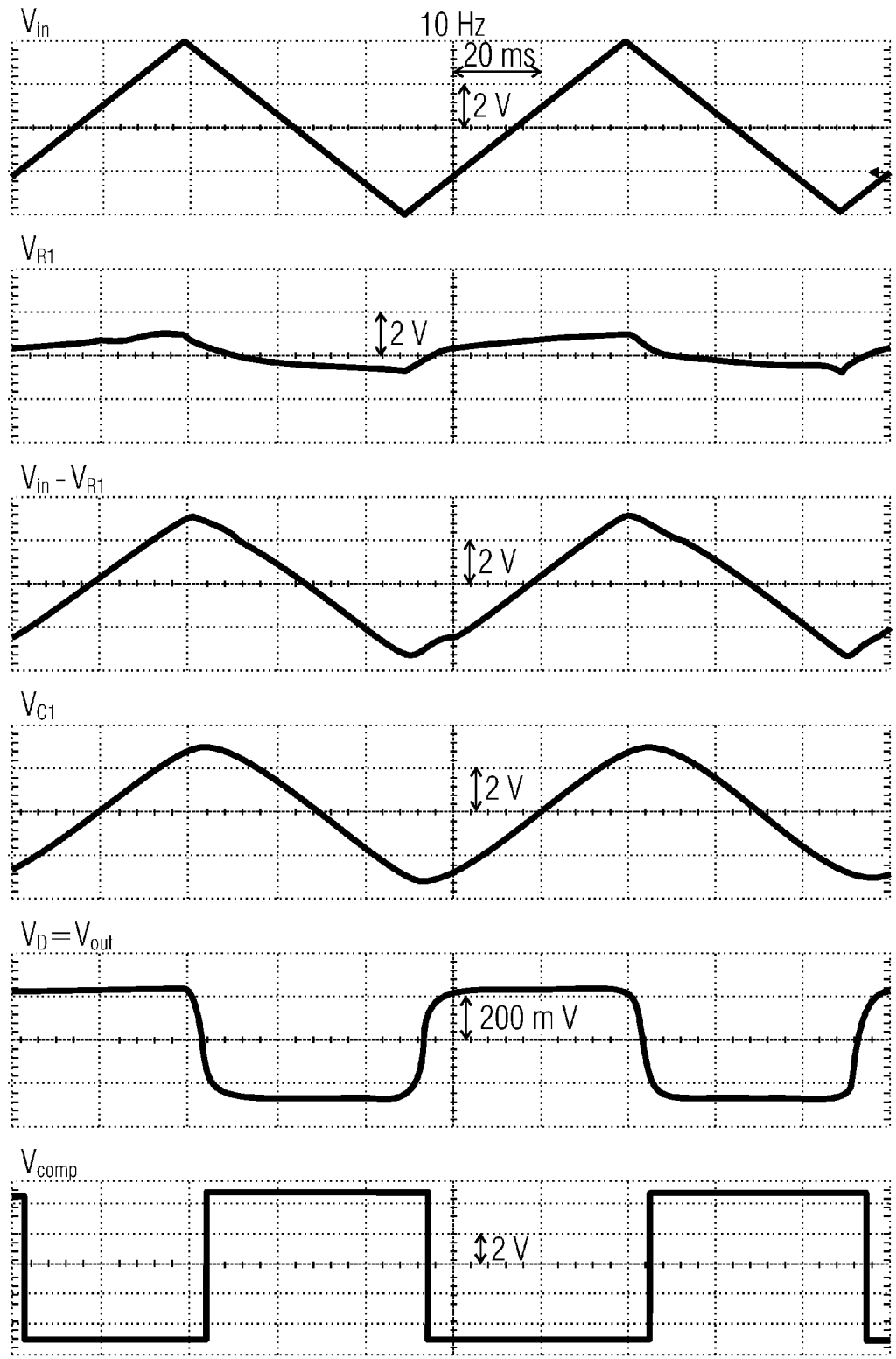

FIGS. 16A and 16B show waveforms of different signals that occur in the peak detector for a triangular input signal of 10 Hz. The signals still have similar waveforms as before and reference is made to the above description. Note however that the resistor voltage $V_{R1}$ is greater in the 10 Hz case than in the 2 Hz case. Furthermore it can be seen that the slope of the resistor voltage $V_{R1}$ is relatively small just prior to a peak in the input voltage and relatively high in the other direction after the peak of the input voltage, i.e., it resembles the charging-discharging curve of an RC circuit. On the other hand, the capacitor voltage $V_{C1}$ is still relatively similar to the triangle waveform of the input voltage $V_{in}$, however with the slope around the peak becoming gradually smaller so that the capacitor voltage $V_{C1}$ has a rounded peak.

Figure 17A:
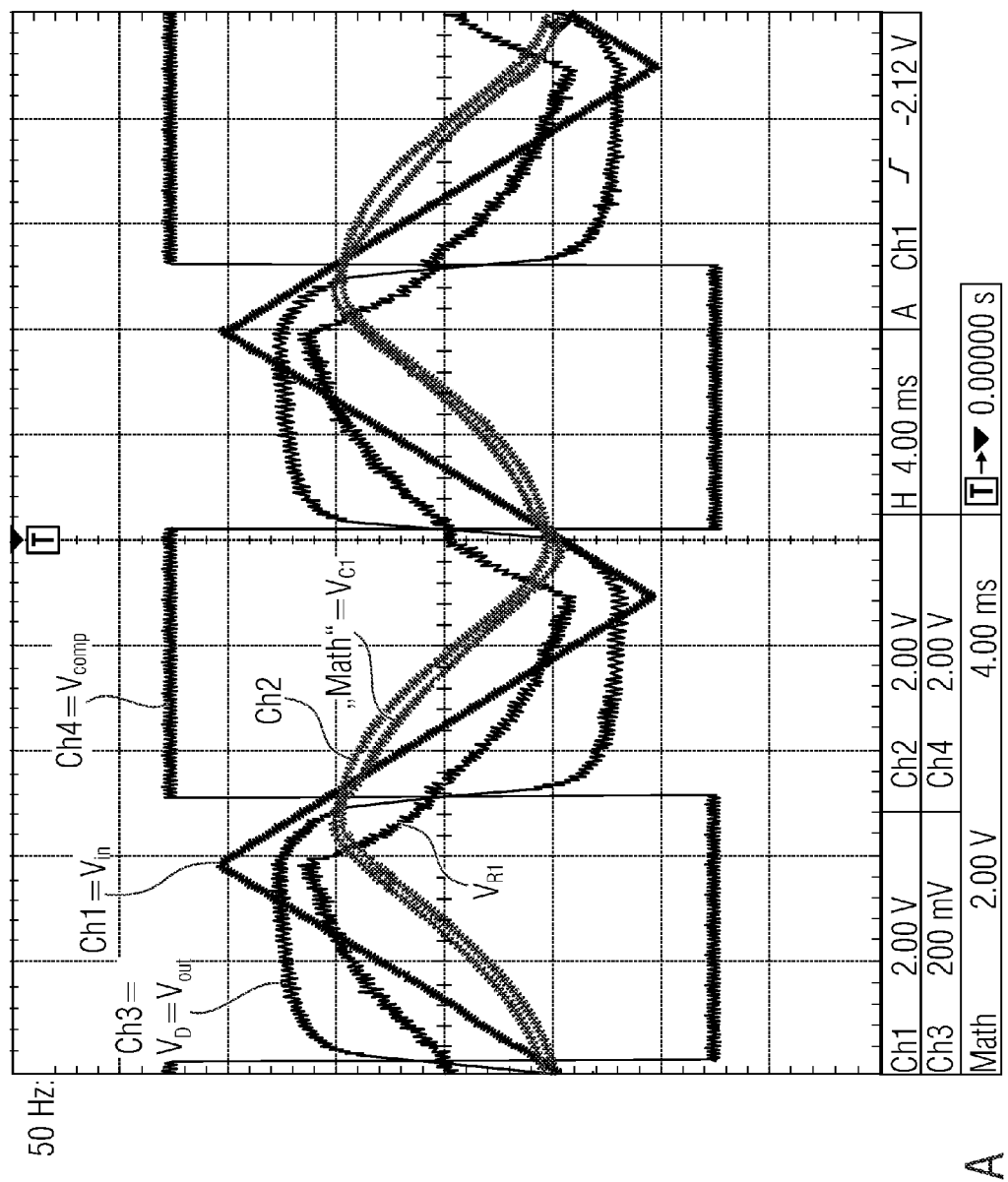
FIGS. 17A and 17B show waveforms of different signals that occur in the peak detector for a triangular input signal of 50 Hz.
Figure 17B:
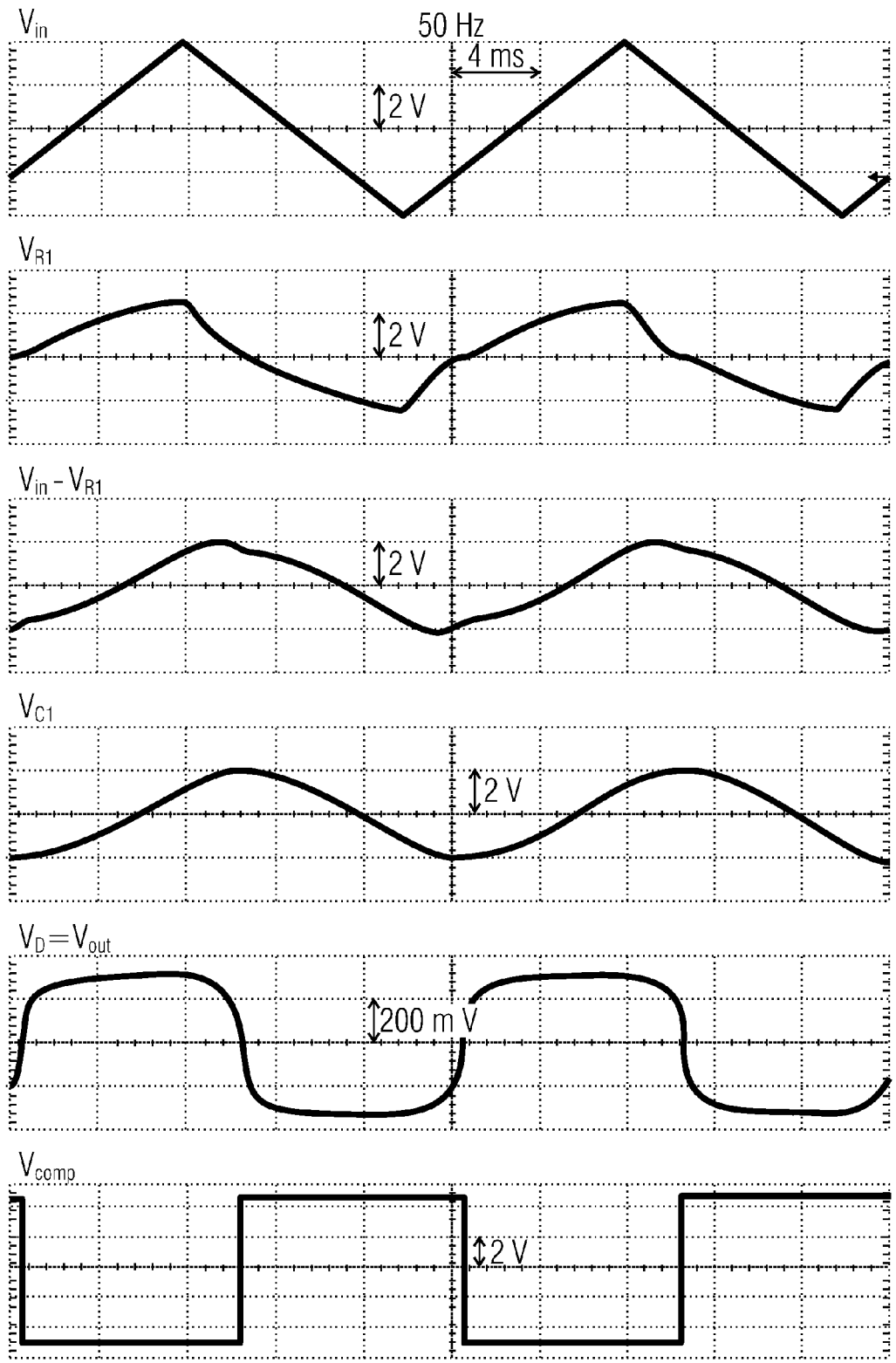

FIGS. 17A and 17B show waveforms of different signals that occur in the peak detector for a triangular input signal of 50 Hz. At this frequency the exponential charging and decharging waveform of the resistor voltage $V_{R1}$ typical for an RC circuit becomes more and more apparent.

Figure 18A:
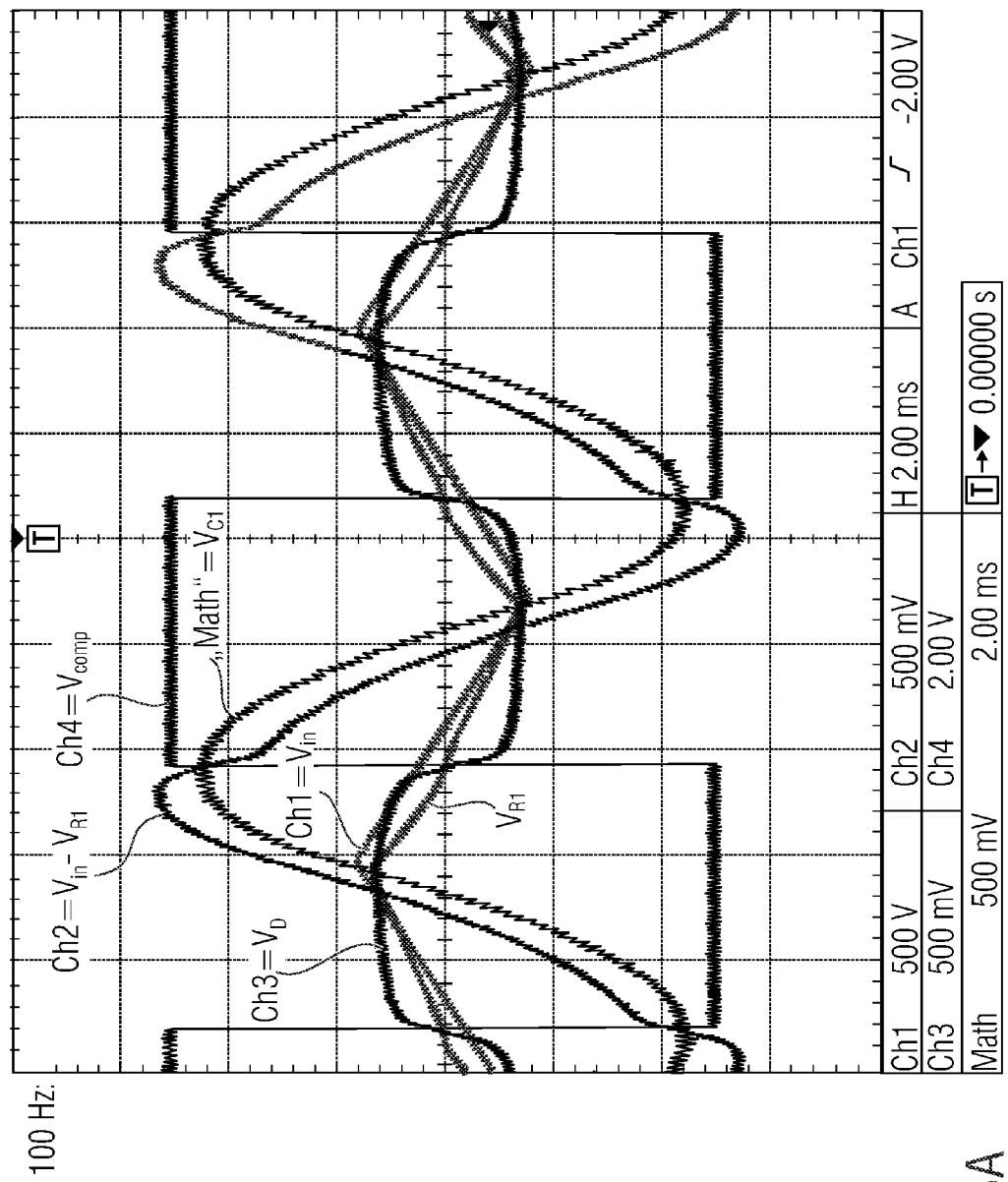
FIGS. 18A and 18B show waveforms of different signals that occur in the peak detector for a triangular input signal of 100 Hz.
Figure 18B:
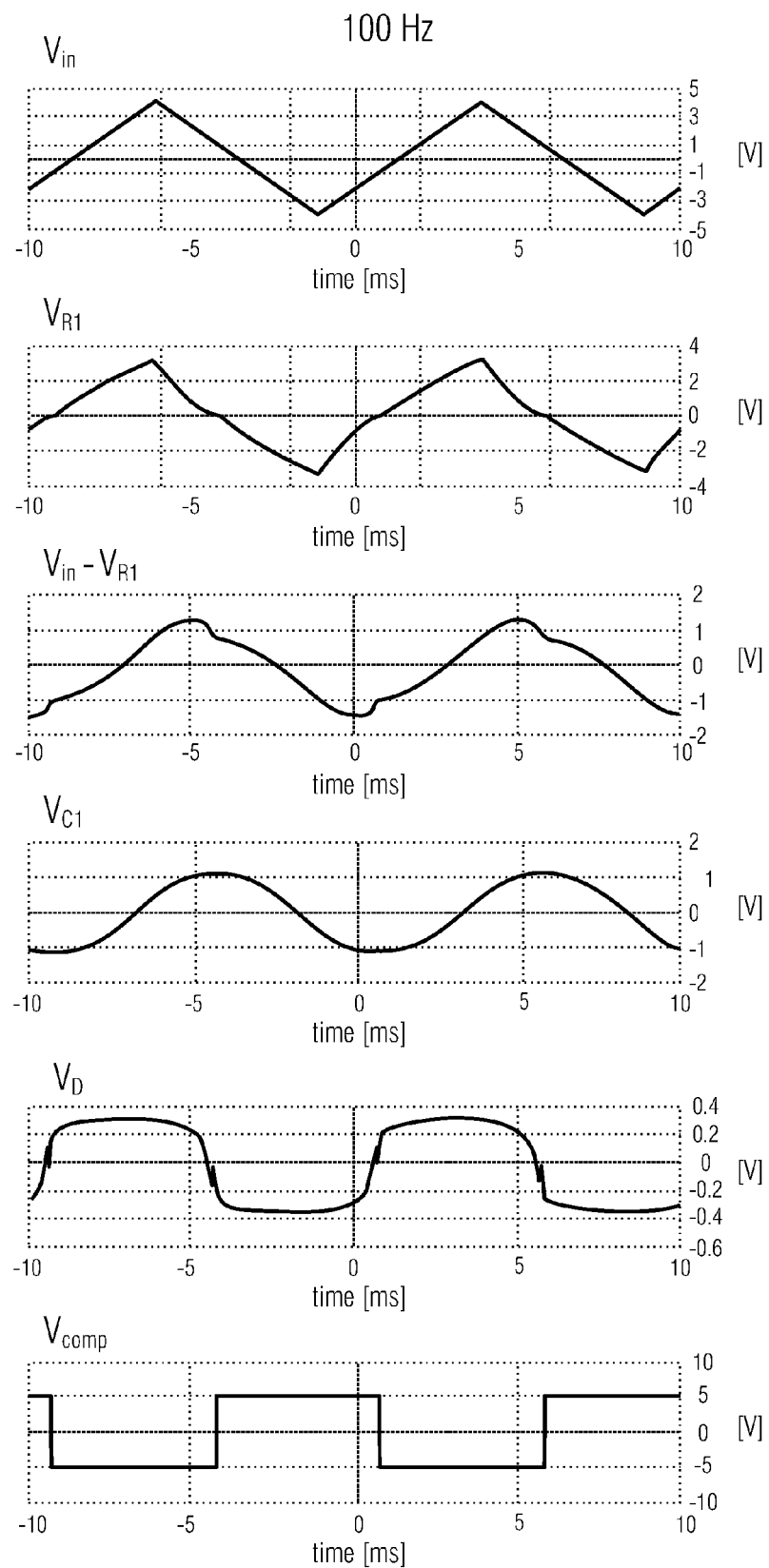

FIGS. 18A and 18B show waveforms of different signals that occur in the peak detector for a triangular input signal of 100 Hz.

Figure 19A:
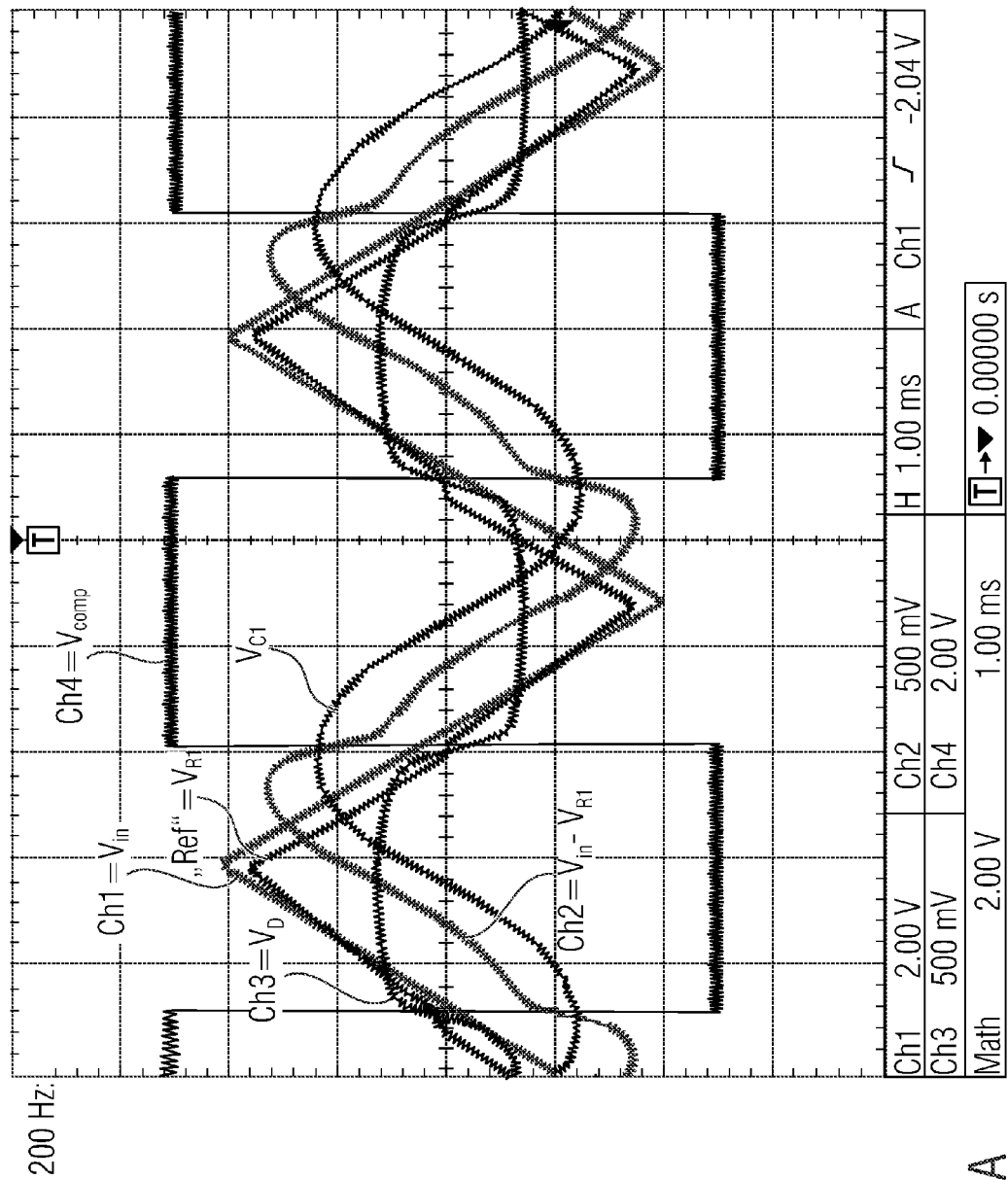
FIGS. 19A and 19B show waveforms of different signals that occur in the peak detector for a triangular input signal of 200 Hz.
Figure 19B:
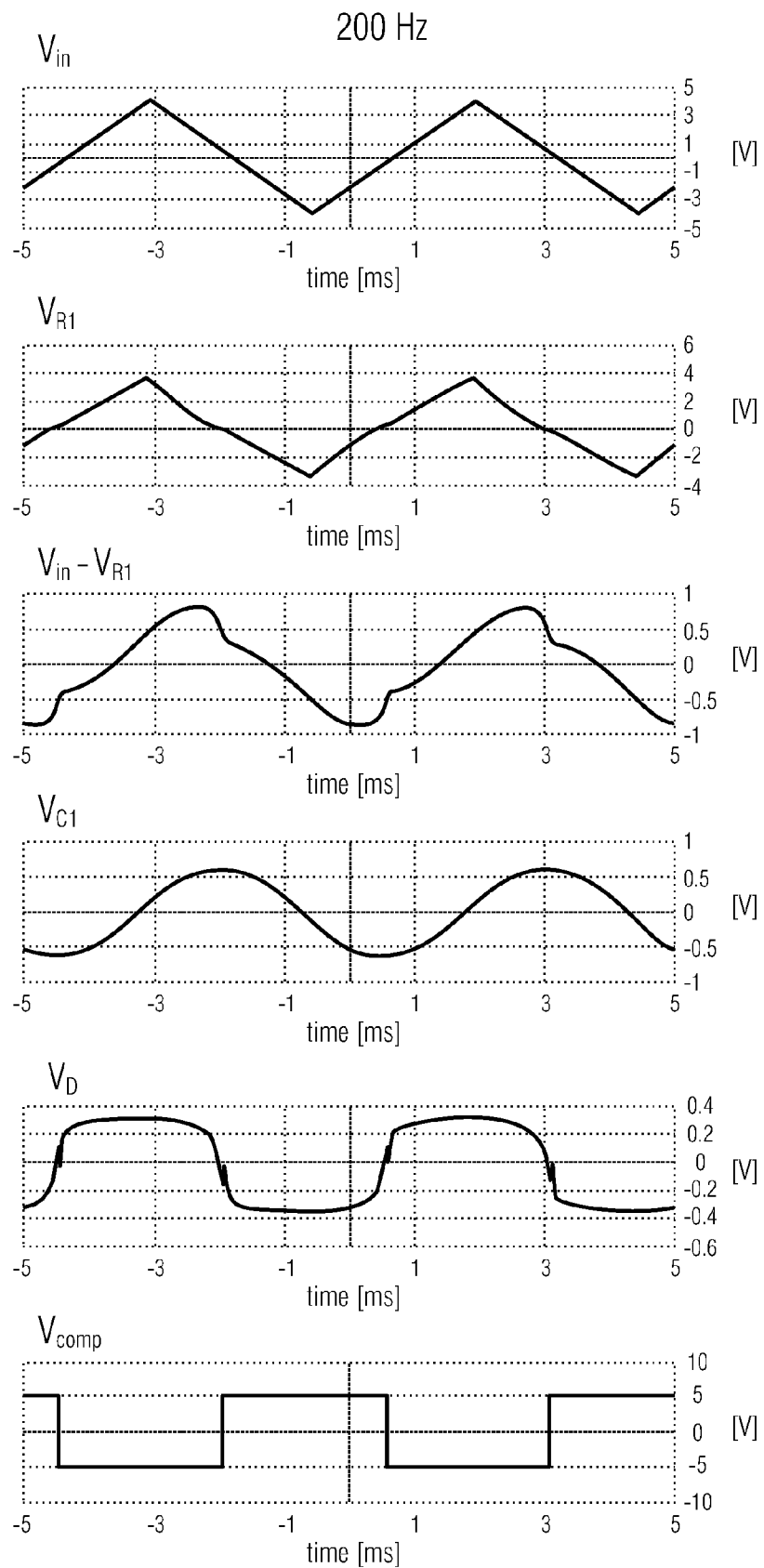

FIGS. 19A and 19B show waveforms of different signals that occur in the peak detector for a triangular input signal of 200 Hz. Note the small spikes in the diode voltage $V_D$ around −4.5 ms, −2 ms, and 0.7 ms which are probably caused by the commutation of the output of comparator 930 at these instants.

Figure 20A:
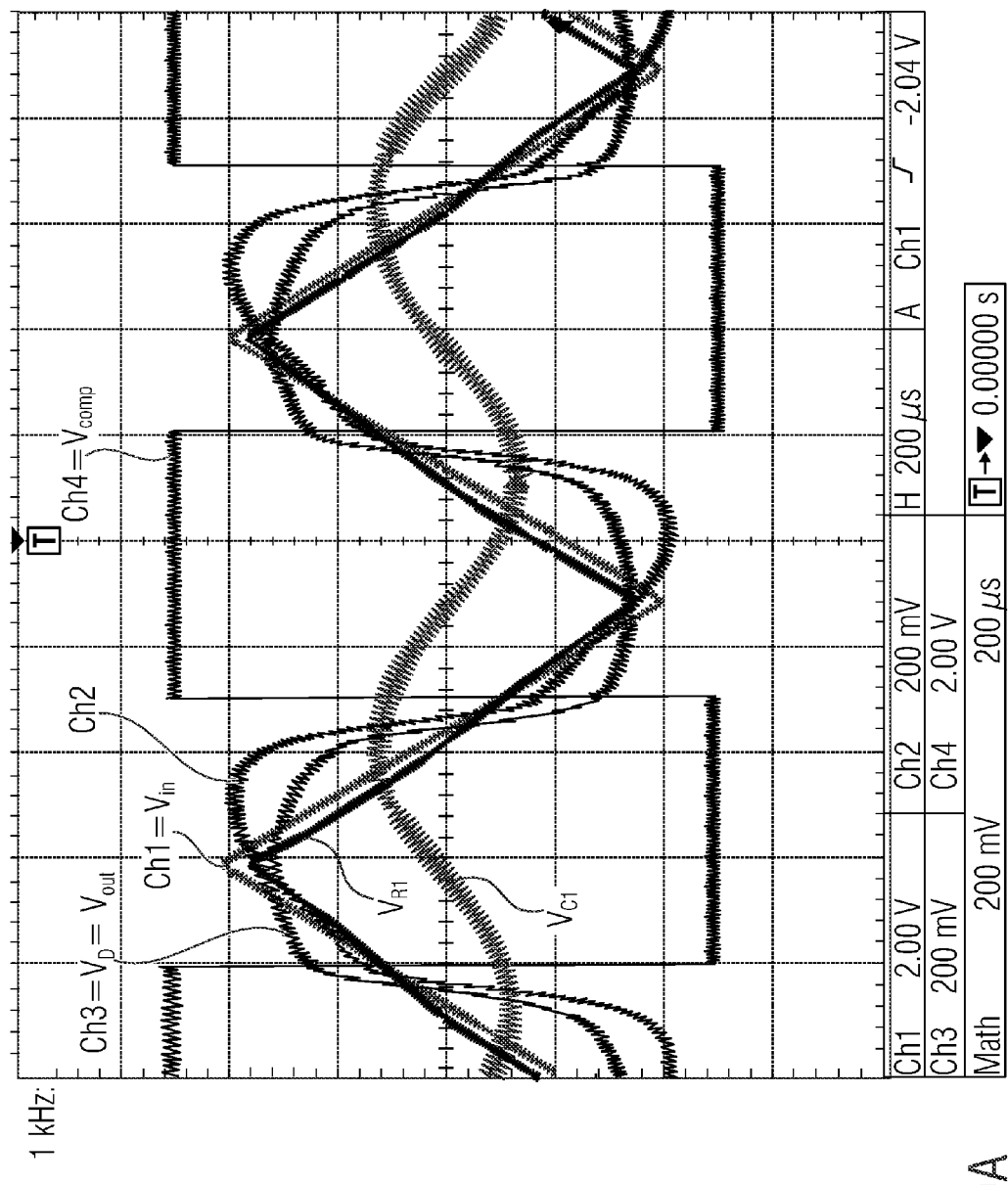
FIGS. 20A and 20B show waveforms of different signals that occur in the peak detector for a triangular input signal of 1 kHz.
Figure 20B:
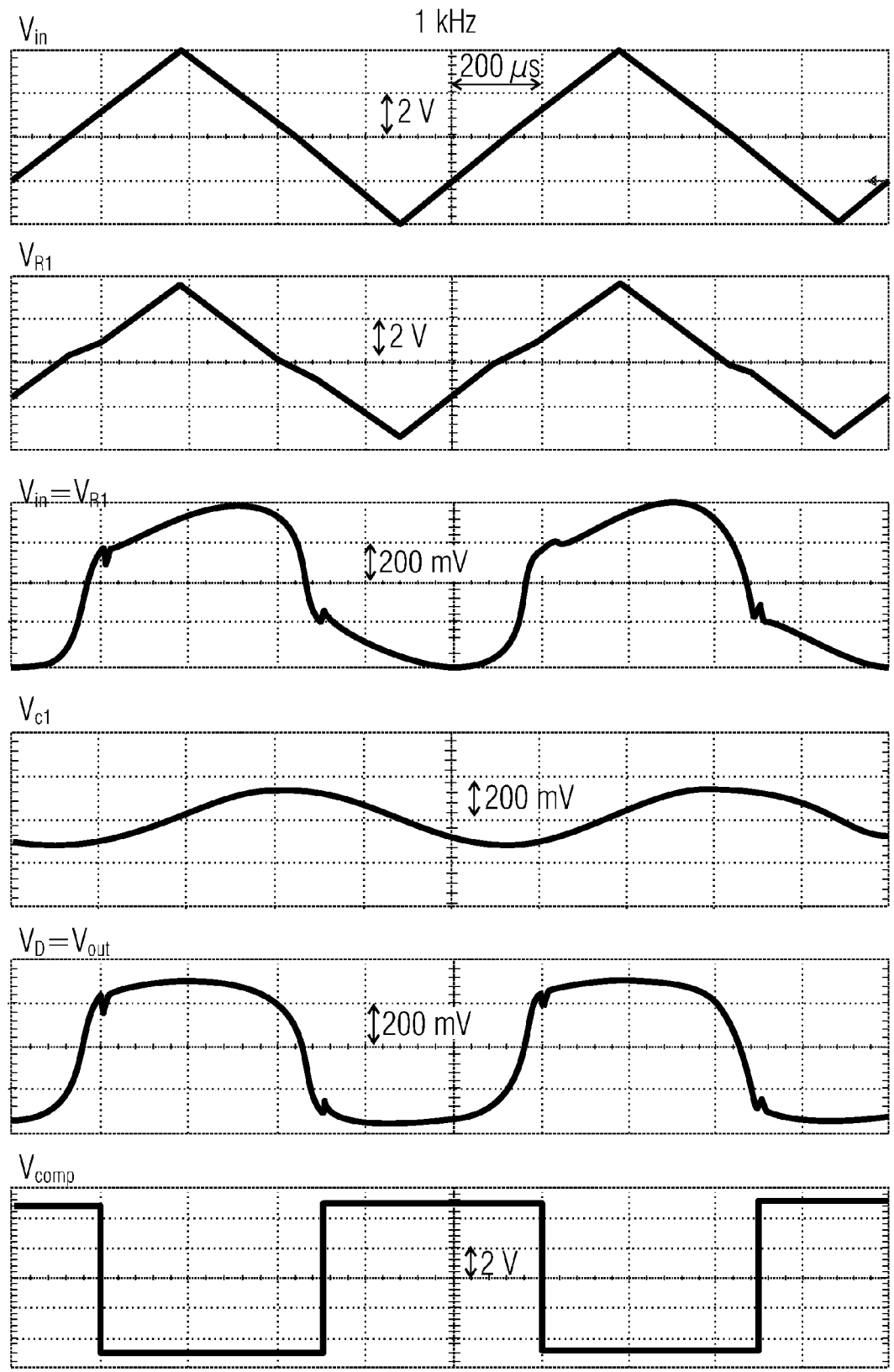

FIGS. 20A and 20B show waveforms of different signals that occur in the peak detector for a triangular input signal of 1 kHz.

Figure 21A:
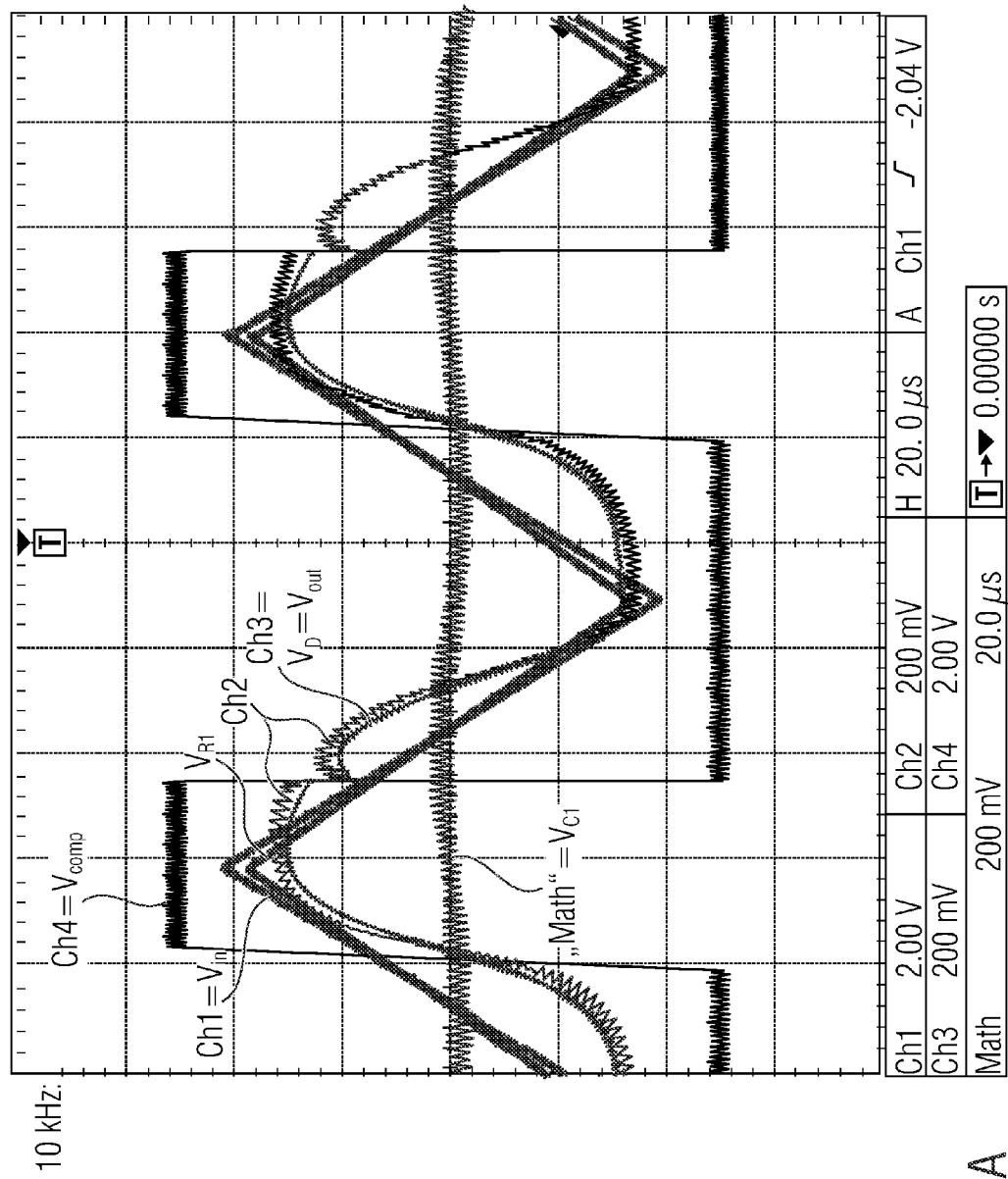
FIGS. 21A and 21B show waveforms of different signals that occur in the peak detector for a triangular input signal of 10 kHz.
Figure 21B:
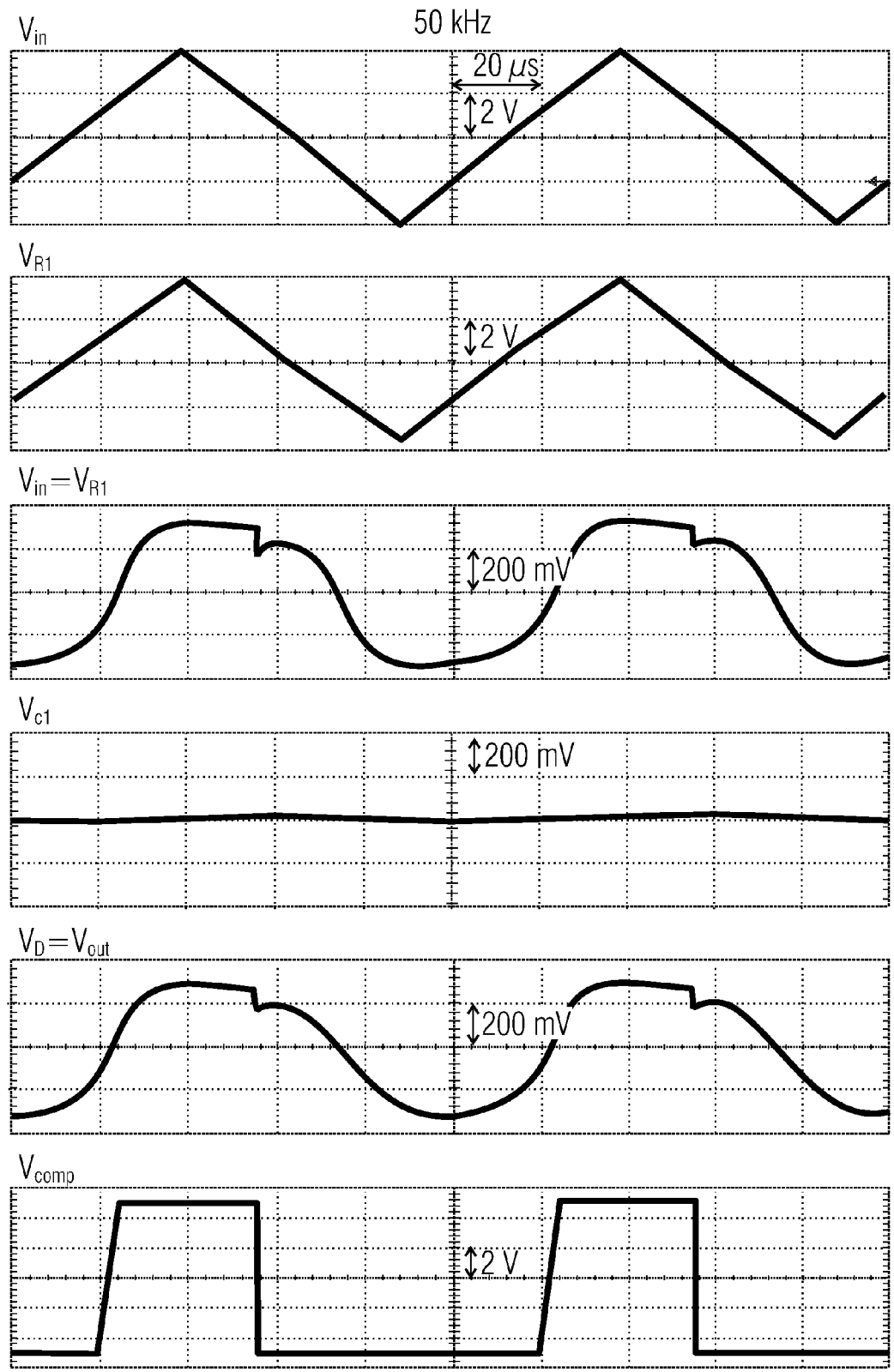

FIGS. 21A and 21B show waveforms of different signals that occur in the peak detector for a triangular input signal of 10 kHz. When comparing the behavior for 10 kHz with the behavior for lower frequencies as illustrated in FIGS. 14A to 20B, it can be seen that the reaction of the comparator 930 to a zero-crossing of the diode voltage $V_D$ occurs relatively late. For example, at t=−74 μs the diode voltage $V_D$ crosses zero to become positive. However, the corresponding commutation of the output of the comparator's 930 occurs only at t=−44 μs, i.e., 30 μs later. While this delay of the comparator 930 may be regarded as being negligible at lower frequencies, at 10 kHz a delay of 30 μs corresponds to 30% of the duration of one period cycle.

Figure 22A:
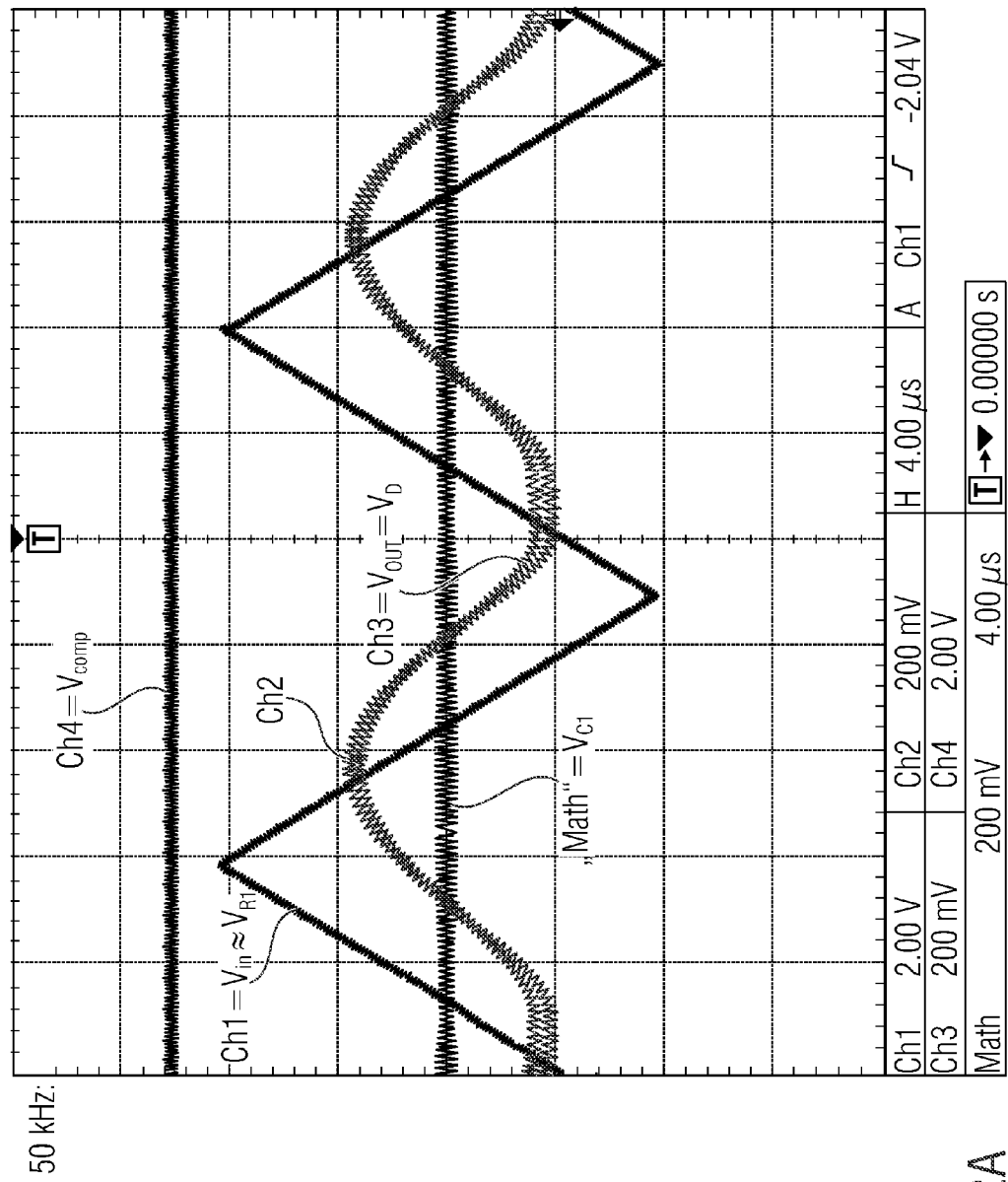
FIGS. 22A and 22B show waveforms of different signals that occur in the peak detector for a triangular input signal of 50 kHz.
Figure 22B:
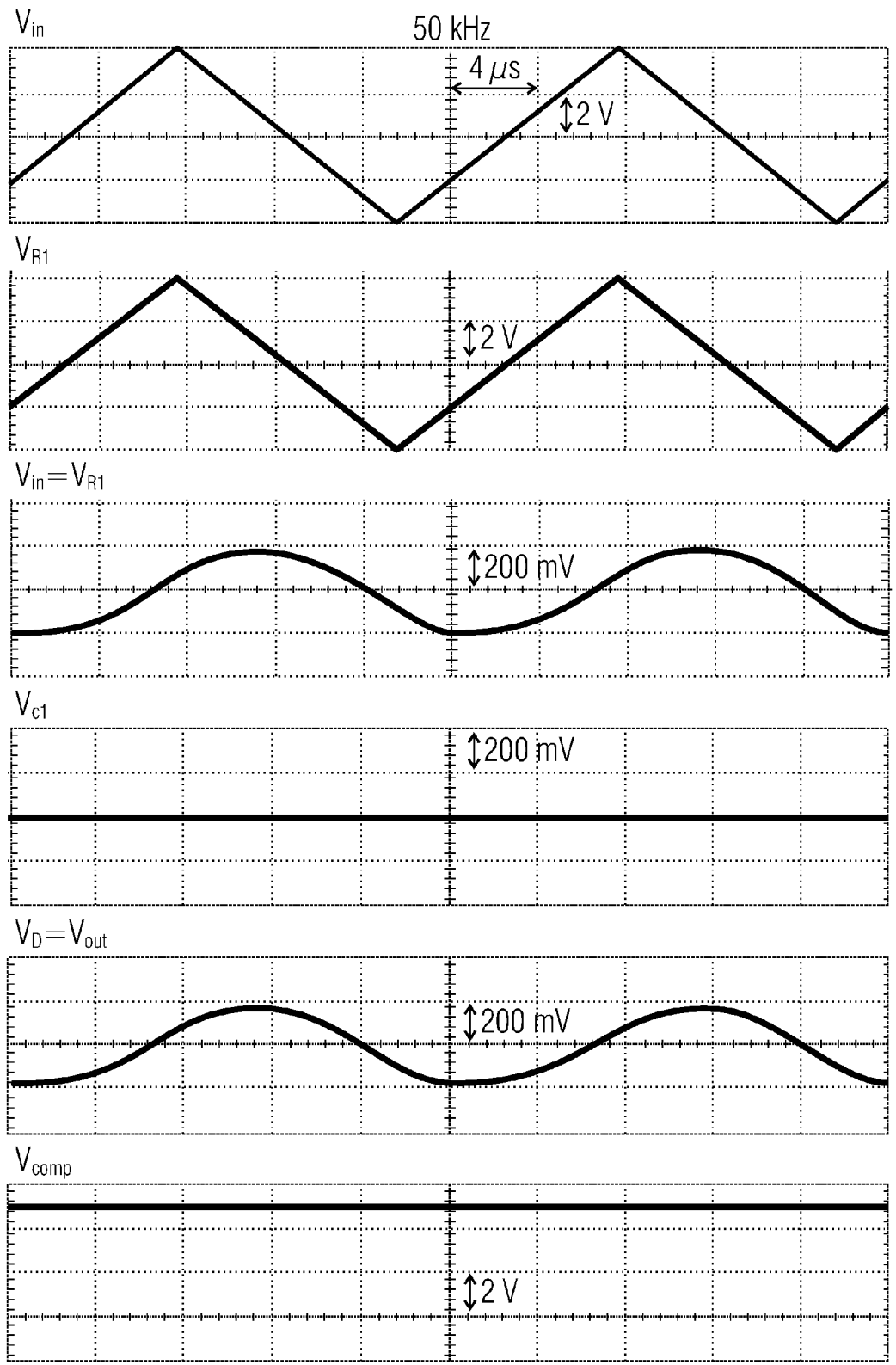

FIGS. 22A and 22B show waveforms of different signals that occur in the peak detector for a triangular input signal of 50 kHz. The capacitor voltage $V_{C1}$ is substantially zero, because the capacitor 914 does not have enough time to charge and decharge at this frequency. Moreover, at high frequencies a capacitor behaves increasingly as a short circuit which also explains why the capacitor voltage $V_{C1}$ is close to zero. Although the diode voltage $V_D$ still crosses the comparator threshold at 0V, the comparator 930 does not react to these zero crossings at this frequency (50 kHz) so that the comparator output voltage $V_{comp}$ remains at the high level of 5V.

The conclusion is that the bandpass filter has fast a constant gain in all the frequency range (Ch3 voltage (i.e. the diode voltage which is also the comparator input voltage) is between 180 mV and 400 mV) due to the operation of the diodes. Therefore, the comparator can respond to the output of the peak detector since there are no problems related with the input offset voltage of the comparator. For low frequencies, the peak detector acts as a differentiator (2 Hz, 5 Hz, 10 Hz). For medium frequencies (200 Hz to 1 kHz) the phase shift between the piezoelectric signal and the differentiator output is close to 0 degrees, and therefore the peak detector does not change the polarity of its output when a peak at the piezoelectric element takes place. For higher frequencies the phase shift starts to be positive and higher than 0 degrees but the comparator does not work correctly (10 kHz and 50 kHz).

The measurements were done employing 1 Megaohm resistor and 3.3 nF capacitor in the peak detector. The diodes have a threshold voltage of approximately 300 mV. Clearly, these values are only examples, and other values for the different components may be employed. The same is true for any voltage values and frequencies that are indicated throughout the description.

Conventional peak detectors employ a differentiator and not a bandpass filter. This is a major difference between the other peak detectors and the proposed peak detector. A simple differentiator has a low gain during the 90 degrees phase shift which causes problems due to the input offset voltage of the comparator. The authors of the circuit of FIG. 4 try to solve this problem adding the resistor $R_{hys}$, but they added a zero at the same time so the peak detector acts as a differentiator for a certain frequency range but not starting from very low frequencies (near 1 Hz). Moreover, for high frequencies, the gain is higher than in the range where the peak detector differentiates and this could cause false peak detections.

Figure 23A:
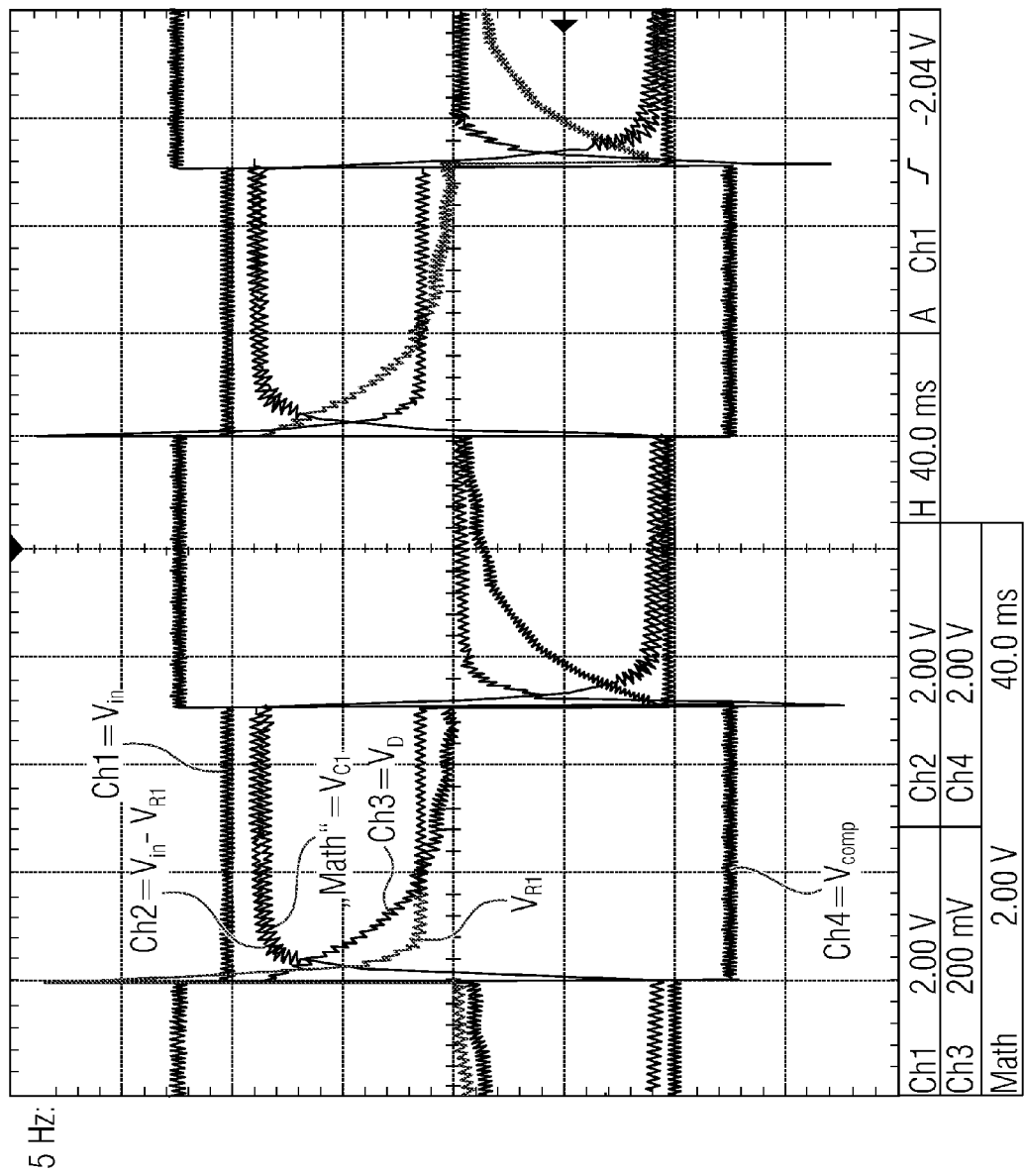
FIGS. 23A and 23B show waveforms of different signals that occur in the peak detector for a rectangular input signal of 5 Hz.
Figure 23B:
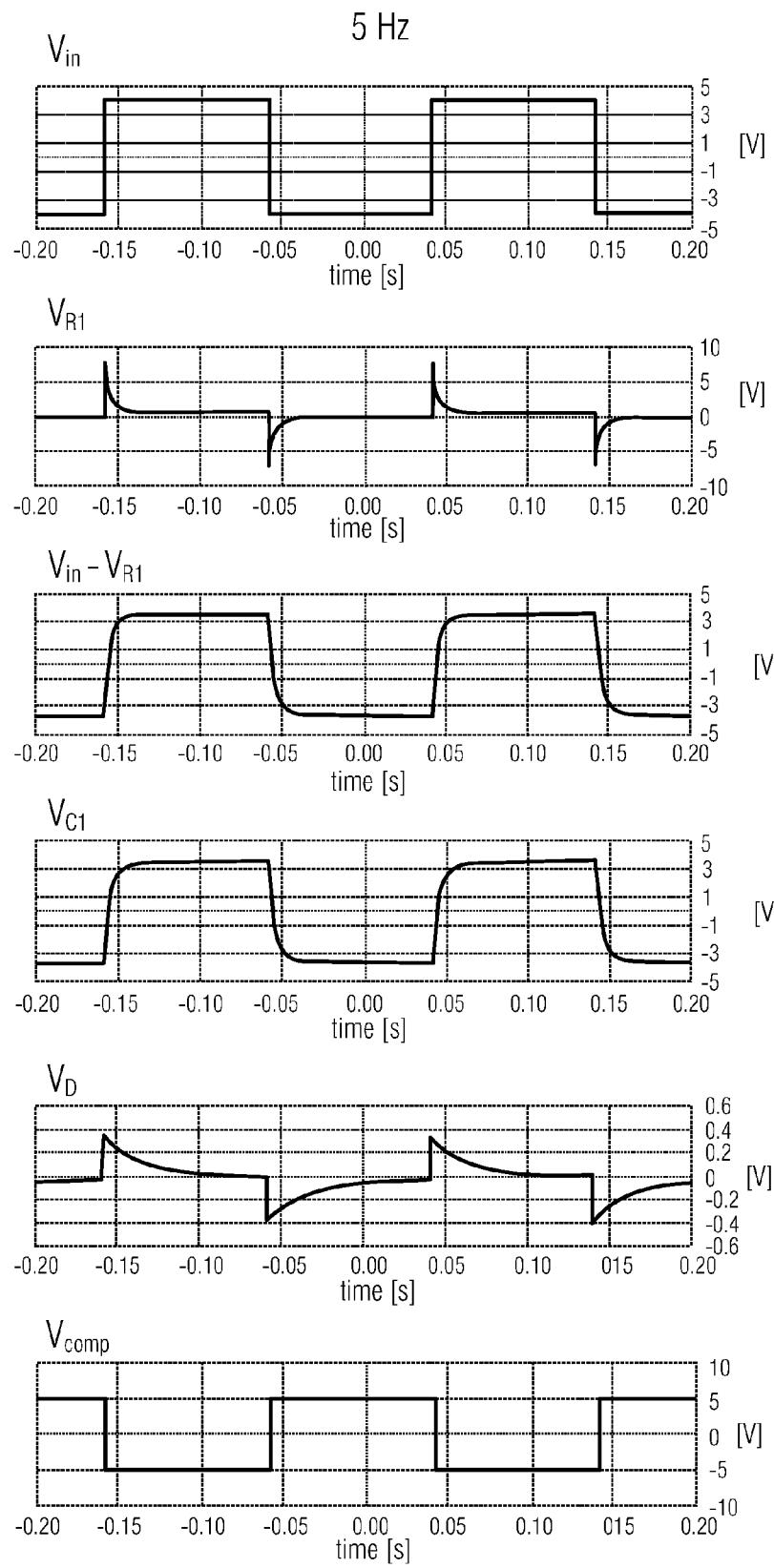

FIGS. 23A and 23B show waveforms of different signals that occur in the peak detector for a rectangular input signal of 5 Hz. The resistor voltage $V_{R1}$ and the capacitor voltage $V_{C1}$ show typical RC charging and decharging waveforms. As the frequency is relatively low compared to the time constant of the RC circuit made up by resistors $R_1$ 912 and capacitor $C_1$ 914, the resistor voltage $V_{R1}$ is close to zero after the capacitor $C_1$ 914 has been nearly completely charged to the input voltage minus the voltage drop of the conducting diode.

Figure 24A:
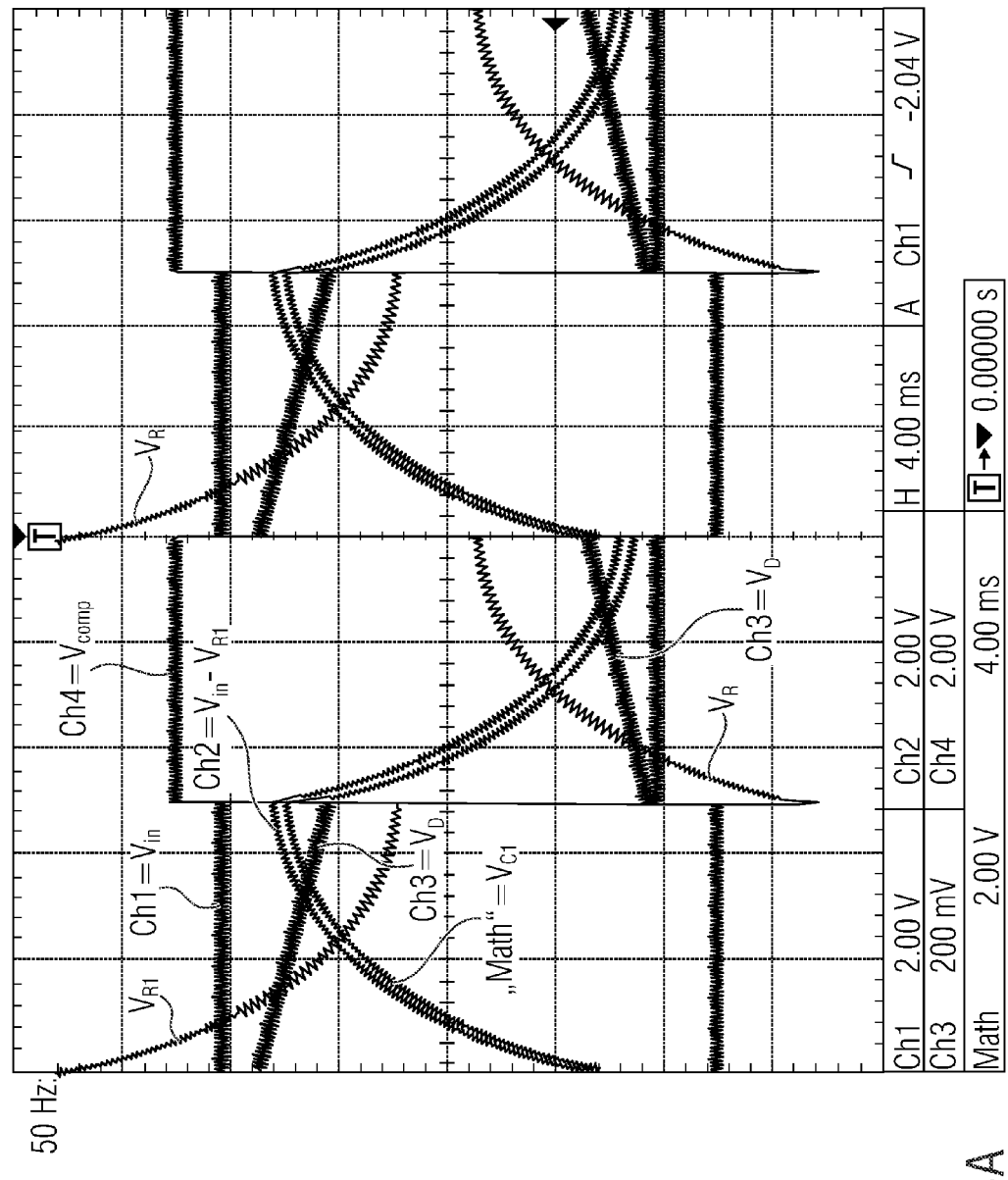
FIGS. 24A and 24B show waveforms of different signals that occur in the peak detector for a rectangular input signal of 50 Hz.
Figure 24B:
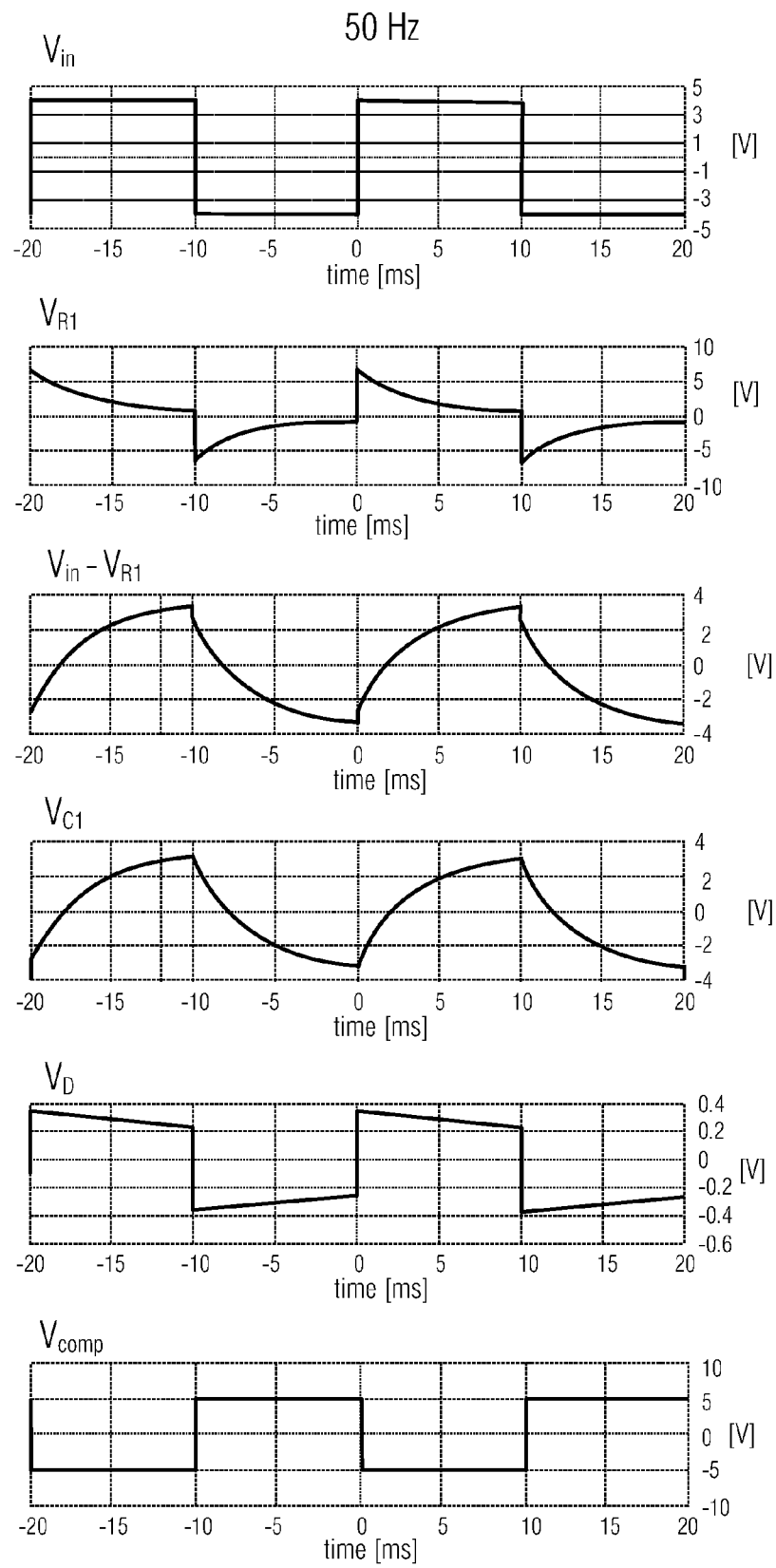

FIGS. 24A and 24B show waveforms of different signals that occur in the peak detector for a rectangular input signal of 50 Hz. Note in particular that the abrupt variation of the input voltage at t=−10 ms from +4V to −4V is reflected in the resistor voltage $V_{R1}$ and the diode voltage $V_D$, but not in the capacitor voltage $V_{C1}$. While the resistor voltage $V_{R1}$ drops by approximately 7.4V, the diode voltage $V_D$ drops by approximately 0.6V. This is enough to push the diode voltage from the upper conducting voltage range (between approximately 0.2V and 0.35V) to the lower conducting voltage range (between approximately −0.35V and −0.2V) so that diode $D_3$ 922 passes from the conducting state to the blocking state and diode $D_4$ 924 passes from the blocking state to the conducting state. At the same time, the diode voltage crosses the comparator threshold at 0V so that the comparator 930 reacts by commutating the comparator output signal from low (−5V) to high (+5V).

Figure 25A:
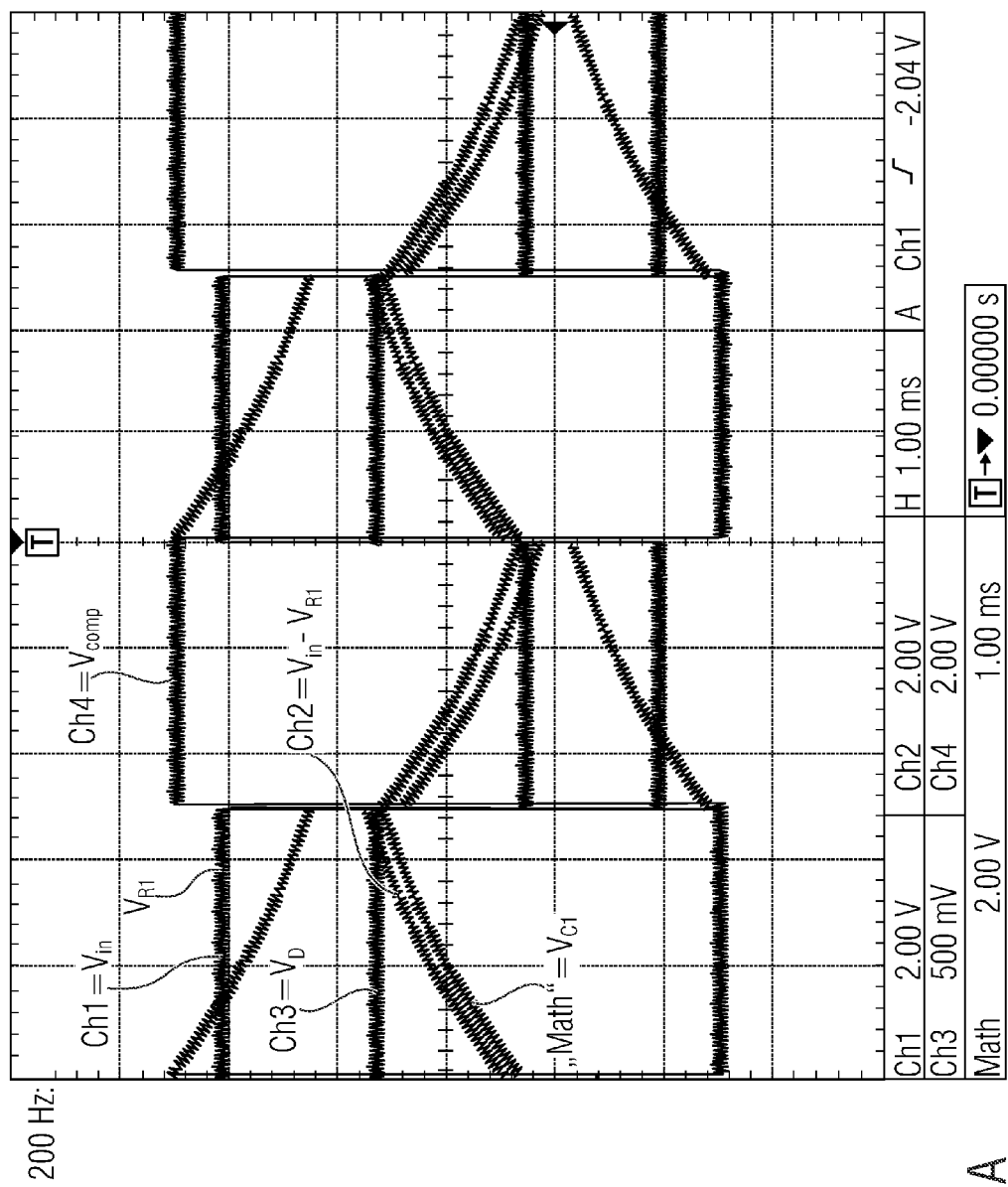
FIGS. 25A and 25B show waveforms of different signals that occur in the peak detector for a rectangular input signal of 200 Hz.
Figure 25B:
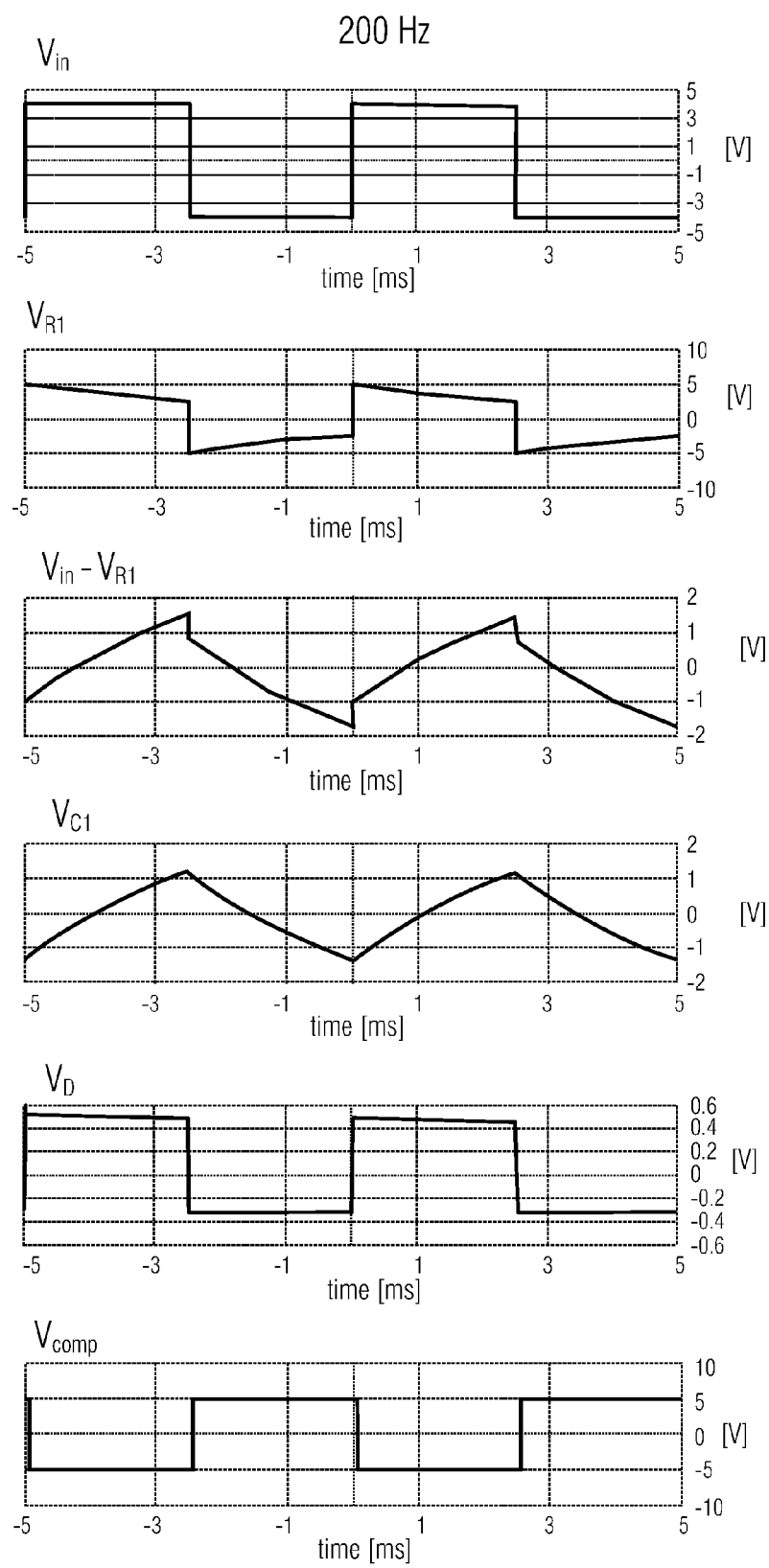

FIGS. 25A and 25B show waveforms of different signals that occur in the peak detector for a rectangular input signal of 200 Hz.

Figure 26A:
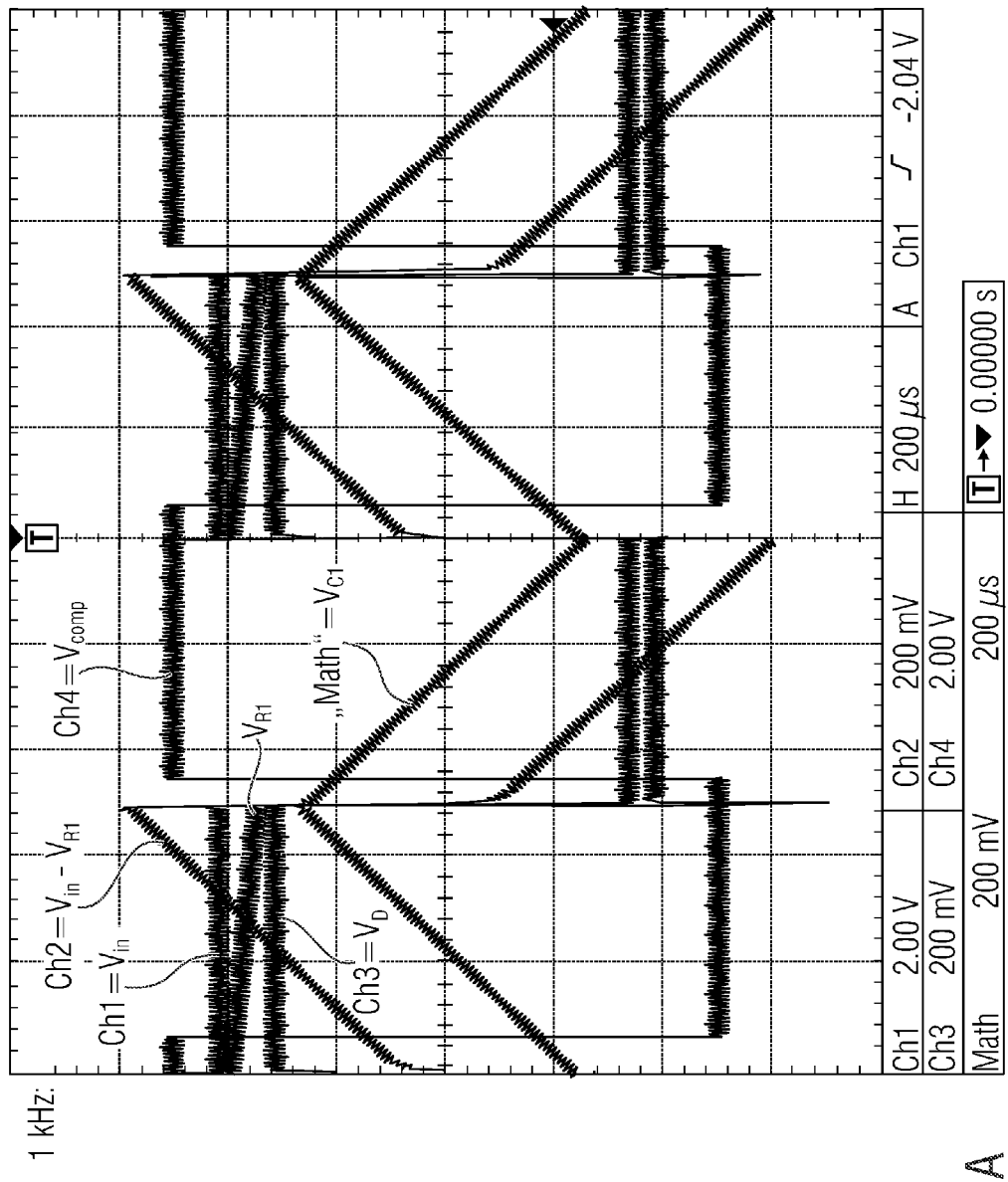
FIGS. 26A and 26B show waveforms of different signals that occur in the peak detector for a rectangular input signal of 1 kHz.
Figure 26B:
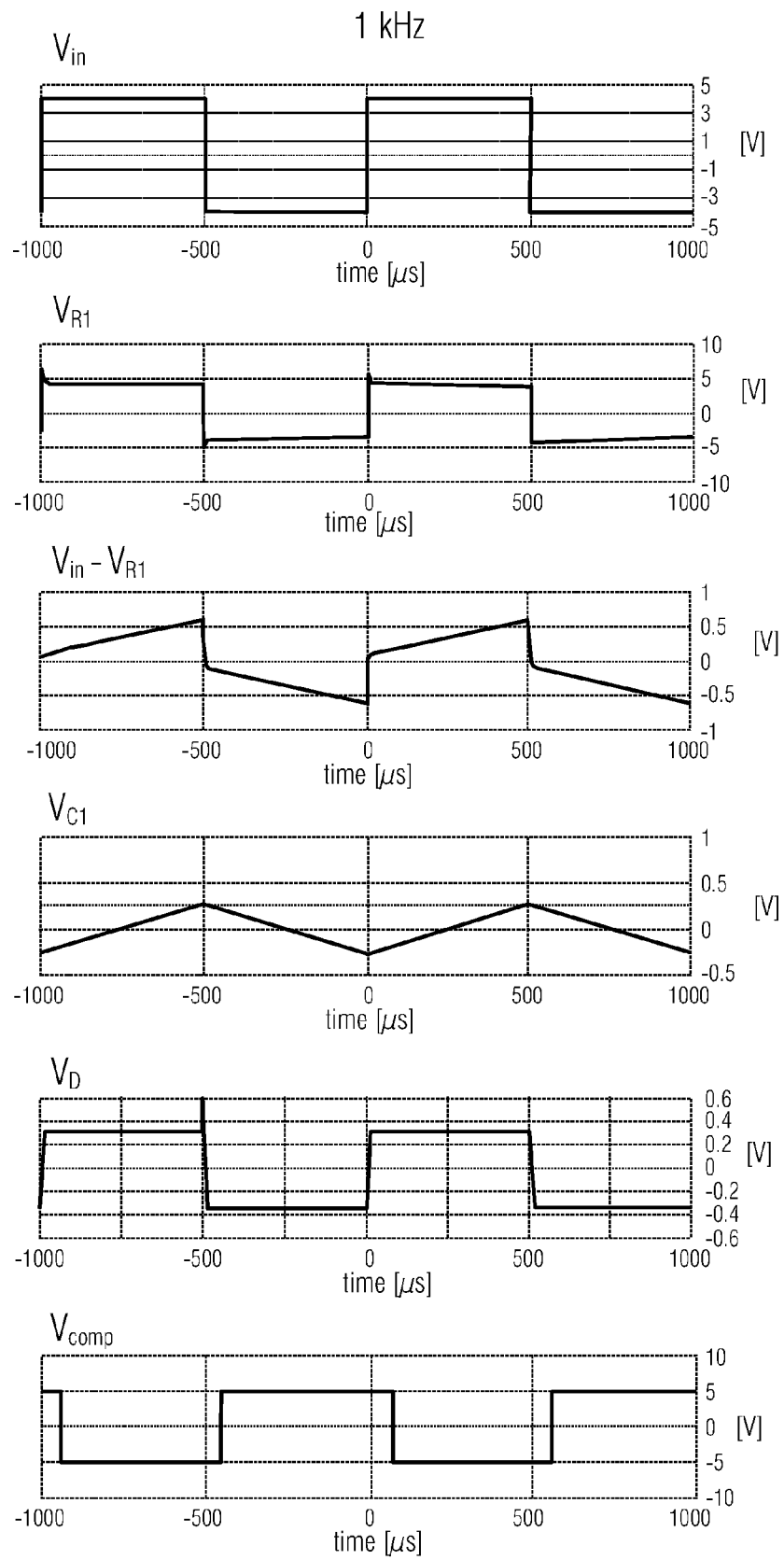

FIGS. 26A and 26B show waveforms of different signals that occur in the peak detector for a rectangular input signal of 1 kHz. The capacitor voltage $V_{C1}$ is relatively small (approximately 0.5V peak-to-peak, when disregarding the spurious spikes that occur when the input voltage $V_{in}$ passes abruptly from +1V to −1V).

Figure 27A:
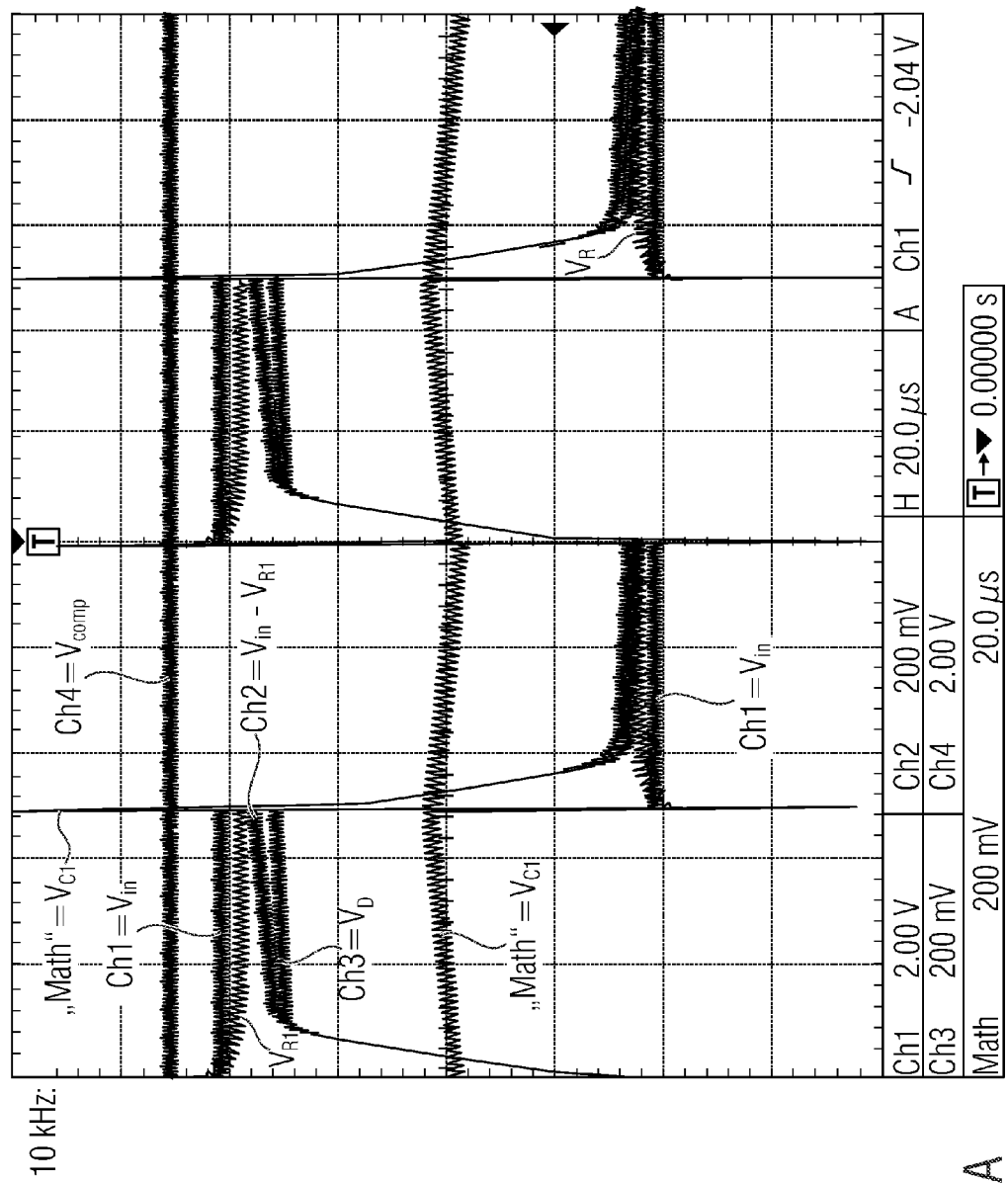
FIGS. 27A and 27B show waveforms of different signals that occur in the peak detector for a rectangular input signal of 10 kHz.
Figure 27B:
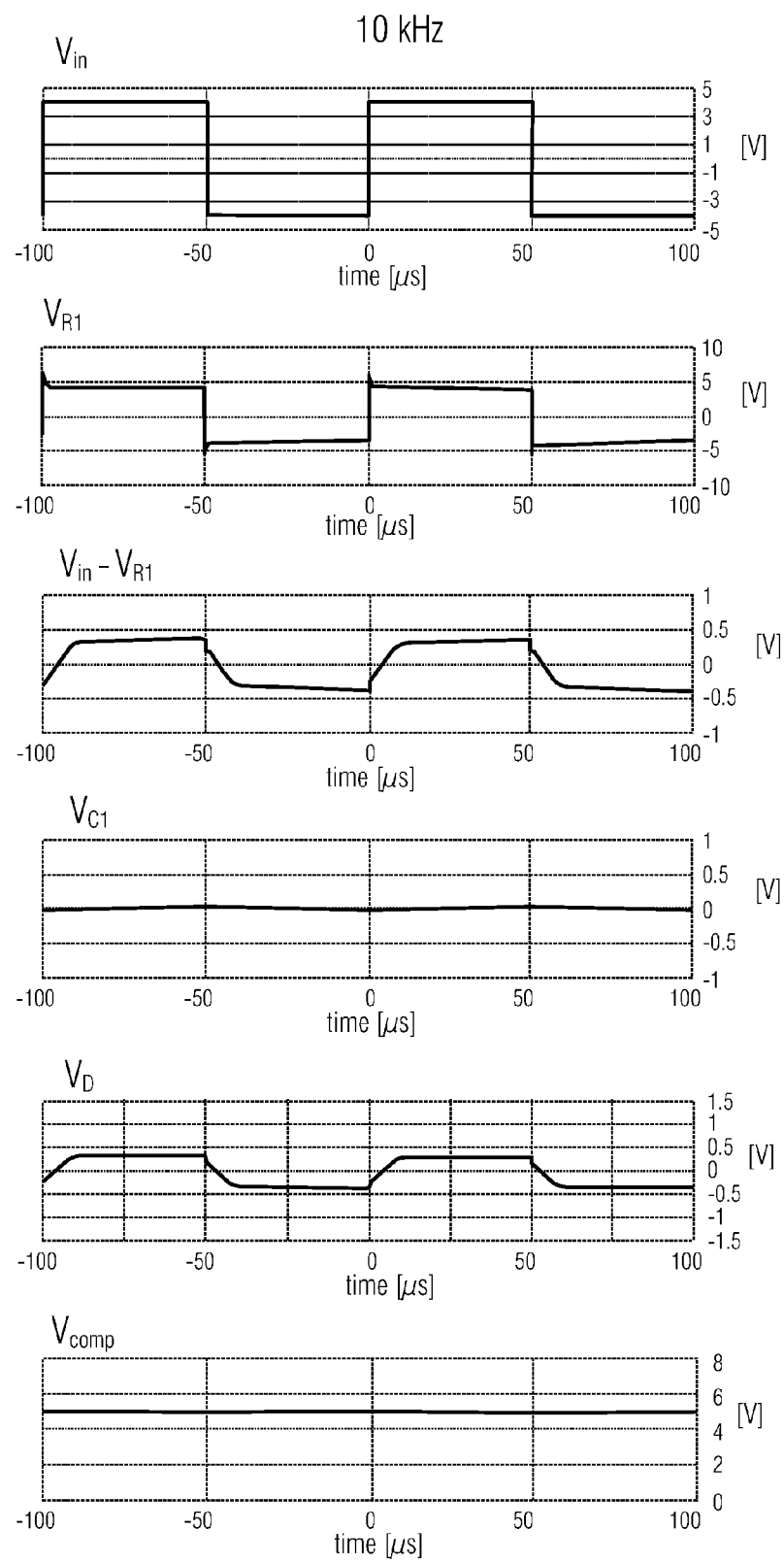

FIGS. 27A and 27B show waveforms of different signals that occur in the peak detector for a rectangular input signal of 10 kHz. It can be seen that the output voltage $V_{comp}$ of the comparator does not react to the diode voltage $V_D$ (i.e., the input voltage for the comparator 930) exceeding or falling below the comparator threshold voltage, but remains at the high level (+5V). Apparently, the diode voltage $V_D$ changes too fast from positive to negative and vice versa so that the comparator 930 is not able to follow anymore.

Figure 28:
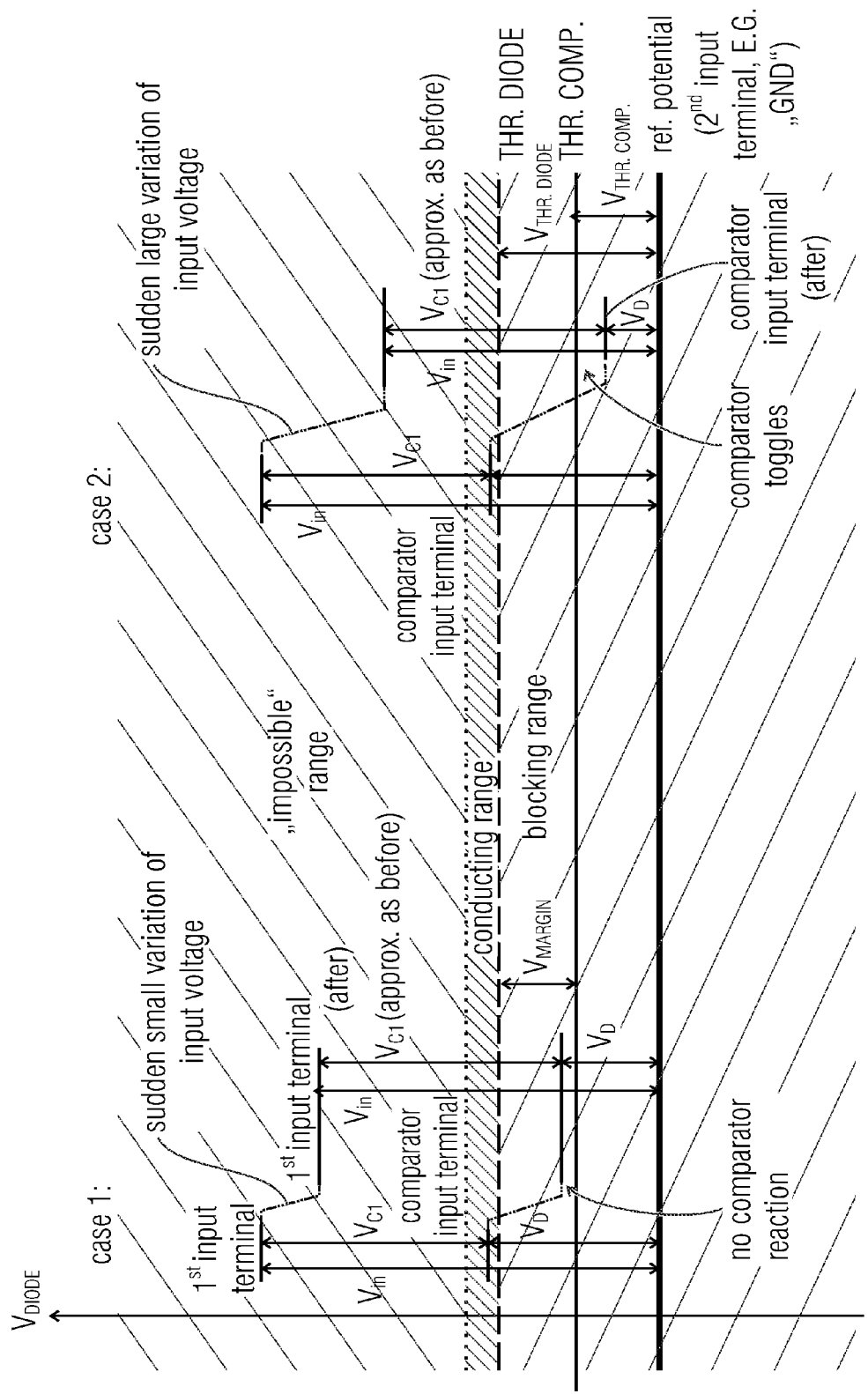
FIG. 28 shows a schematic illustration of electric potentials, voltages and thresholds of the diode and the comparator when a sudden small variation and a sudden large variation of the input voltage occurs.

FIG. 28 shows a schematic illustration of electric potentials, voltages and thresholds of the diode and the comparator when a sudden small variation and a sudden large variation of the input voltage occurs. A thick horizontal line indicated the reference potential (REF. POTENTIAL) which may be, for example, the electric potential of the second input terminal 1216. It is not necessary for the reference potential to be the ground potential of the circuit, but it may be so. In any event, the diode(s) $D_3$ 922 and/or $D_4$ 924 are connected to the reference potential with one of its or their terminals. FIG. 28 illustrates the situation for one diode. Without loss of generality, let us assume this to be diode $D_3$ 922. The diode $D_3$ has a blocking range and a conducting range which are separated by the threshold voltage (THR. DIODE) of the diode $D_3$. The comparator 930 also has a threshold voltage (THR. COMP.) which defines when the comparator commutates the comparator output voltage $V_{comp}$. The comparator threshold voltage is chosen to be within the blocking range of the diode with a margin voltage $V_{MARGIN}$ to the diode threshold voltage.

Two basic cases of operation of the diode $D_3$ may now be distinguished: Case 1 in which a small sudden variation of the input voltage $V_{in}$ occurs, and case 2 in which a large sudden variation of the input voltage $V_{in}$ occurs.

Case 1:

The input voltage $V_{in}$ is the voltage between the first and second input terminals of the peak detector. The input voltage $V_{in}$ is the sum of the capacitor voltage $V_{C1}$ and the diode voltage $V_D$ (possibly also the resistor voltage, which has been left out for the sake of clarity in FIG. 28). The diode voltage $V_D$ is so that the diode $D_3$ is slightly in the conducting range. Accordingly, the comparator input terminal is at an electric potential that is slightly above the diode threshold THR. DIODE. Due to the variation of the input voltage, the electric potential of the first input terminal is initially at a first value and then relatively quickly decreased to a new value. As the capacitor voltage $V_{C1}$ remains substantially constant, this variation of the input voltage $V_{in}$ is substantially assumed by the diode voltage $V_D$. However, the variation of the input voltage $V_{in}$ is smaller than the difference between the initial electric potential of the comparator input terminal and the comparator threshold so that the comparator does not toggle the comparator output signal, because the comparator input signal does not cross the comparator threshold THR. COMP.

Case 2:

Now a large sudden variation of the input voltage $V_{in}$ occurs which brings the potential of the comparator input terminal beneath the potential of the comparator threshold THR. COMP. This causes the comparator 930 to commutate or "toggle" the comparator output $V_{comp}$. Note that a slow variation of the input voltage $V_{in}$ by the same variation amplitude might give the capacitor enough time to decharge via the diode $D_3$ which at the same time remains in its conducting range while the variation of the input voltage $V_{in}$ lasts. The peak detector may be regarded as a self-impeding or self-inhibiting circuit, because it allows that the input voltage $V_{in}$ increases, but commutates the comparator output signal $V_{comp}$ as soon as a large and sudden variation of the input voltage $V_{in}$ in the falling direction occurs.

Figure 29:
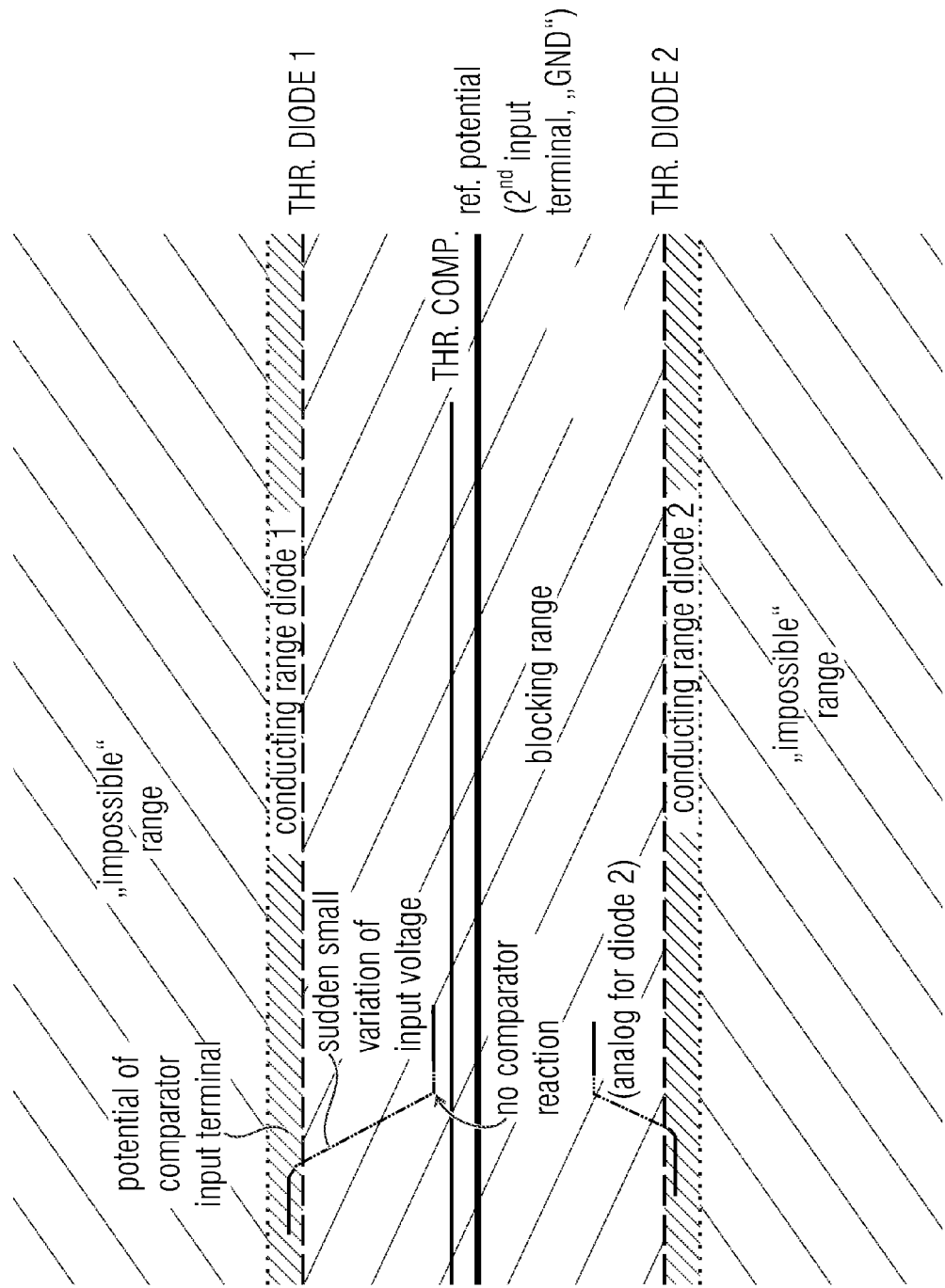
FIG. 29 shows a schematic illustration of electric potentials, voltages and thresholds of two diodes and the comparator when a sudden small variation of the input voltage occurs.

FIG. 29 shows a schematic illustration of electric potentials, voltages and thresholds of two diodes and the comparator when a sudden small variation of the input voltage occurs. FIG. 29 differs from FIG. 28 in that a further diode threshold THR. DIODE 2 is represented which is substantially symmetrical to the threshold THR. DIODE 1 of the first diode with respect to the reference potential. In a first case, the potential of the comparator 930 falls from the conducting range of diode 1 close to the comparator threshold THR. COMP., but without crossing the comparator threshold. This case corresponds to case 1 of FIG. 28. In the second case that is illustrated in FIG. 29, the potential of the comparator input terminal is initially in the conducting range of diode 2 and increases to a level that is lower than the comparator threshold THR. COMP without crossing the latter. In neither case the comparator shows a reaction, i.e. the comparator output $V_{comp}$ remains at its previous level.

Figure 30:
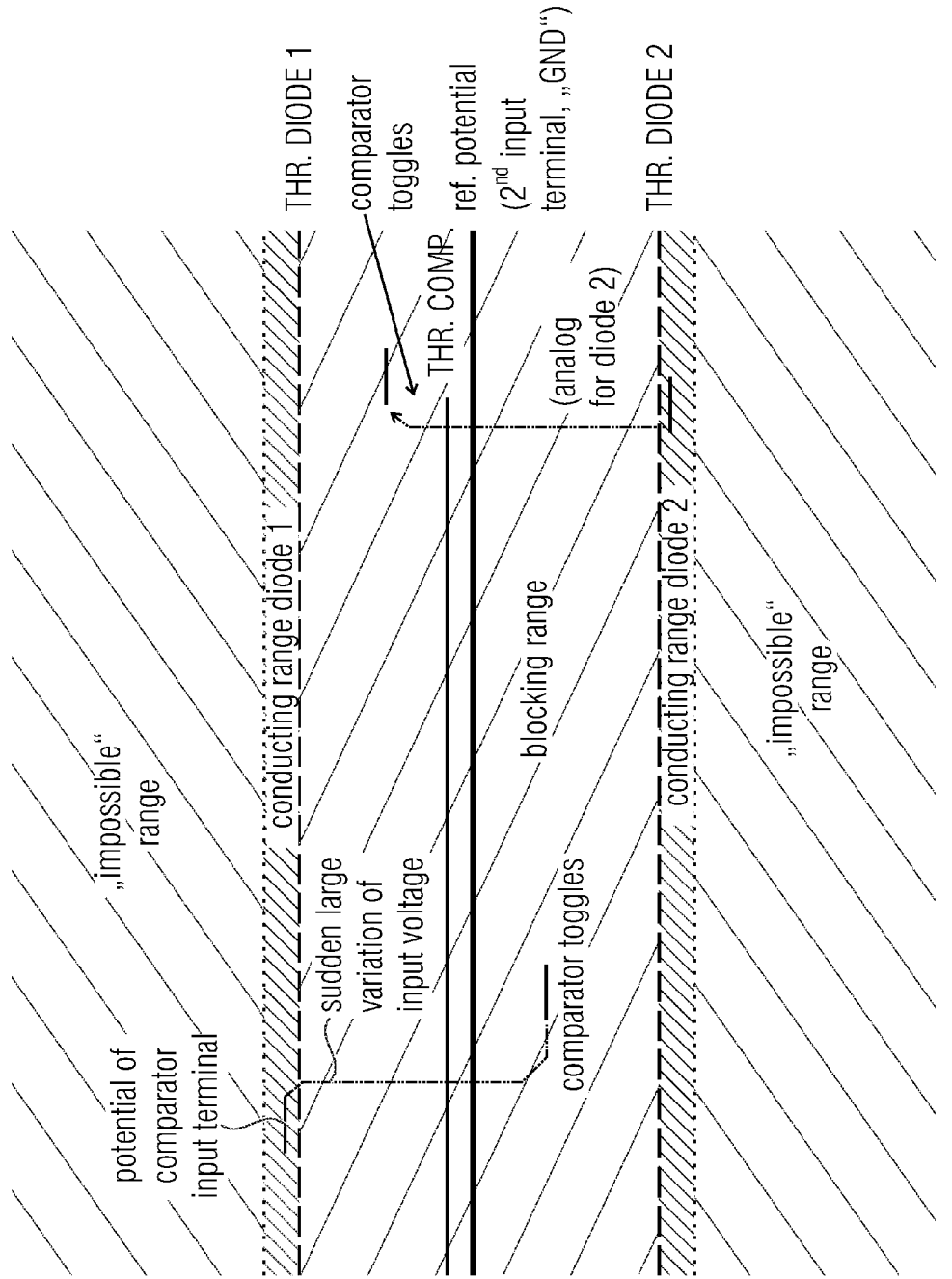
FIG. 30 shows a schematic illustration of electric potentials, voltages and thresholds of two diodes and the comparator when a sudden large variation of the input voltage occurs.

FIG. 30 shows a schematic illustration of electric potentials, voltages and thresholds of two diodes and the comparator when a sudden large variation of the input voltage occurs. FIG. 30 is similar to FIG. 29, but now relatively large sudden variations of the input voltage occur. In a first case depicted in the left half of FIG. 30, the comparator input voltage decreases relatively fast from the conducting range of diode 1 ($D_3$ 922 in FIGS. 9 and 12) and thereby crosses the comparator threshold THR. COMP, thus triggering the comparator 930 to toggle the comparator output $V_{comp}$. In the second case depicted in the right half of FIG. 30, the comparator input terminal initially has an electric potential in the conducting range of the second diode ($D_4$ 924 in FIGS. 9 and 12). Again, the variation of the input voltage $V_{in}$ is sufficiently large to bring the potential of the input comparator terminal across the comparator threshold THR. COMP., to thereby cause the comparator 930 to commutate the comparator output signal $V_{comp}$.

Figure 31:
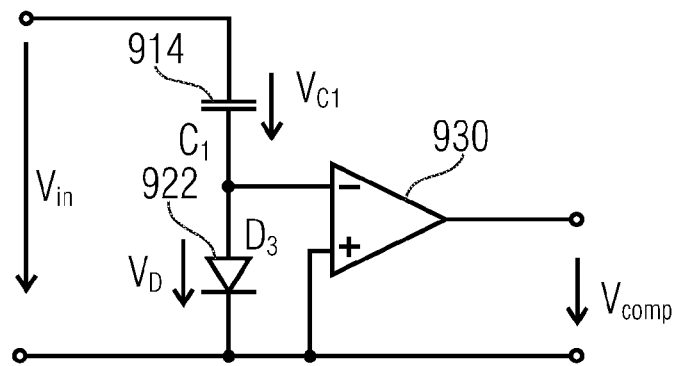
FIG. 31 shows a schematic circuit diagram of a peak detector according to at least some embodiments of the present invention.

FIG. 31 shows a schematic circuit diagram of a peak detector according to at least some embodiments of the present invention. In this implementation, the peak detector comprises a capacitor $C_1$ 914, a diode $D_3$ 922, and a comparator 930. With this peak detector, peaks in the input voltage $V_{in}$ can be detected while the input voltage is positive. A negative input voltage is typically blocked by the diode $D_3$ 922.

Figure 32:
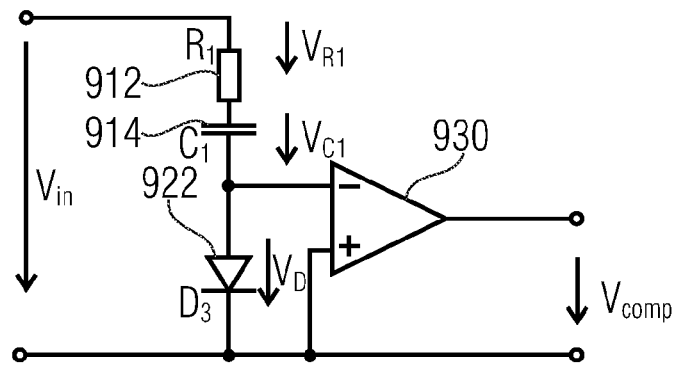
FIG. 32 shows a schematic circuit diagram of a peak detector according to at least some further embodiments of the present invention.

FIG. 32 shows a schematic circuit diagram of a peak detector according to at least some further embodiments of the present invention. In this implementation, the peak detector comprises the capacitor $C_1$ 914, the diode $D_3$ 922, the comparator 930, and in addition a resistor $R_1$ 912 which is connected in series with the capacitor $C_1$ 914. Again, only peaks in the input voltage $V_{in}$ can be detected that occur while the input voltage is positive. A negative input voltage is typically blocked by the diode $D_3$ 922.

Figure 33:
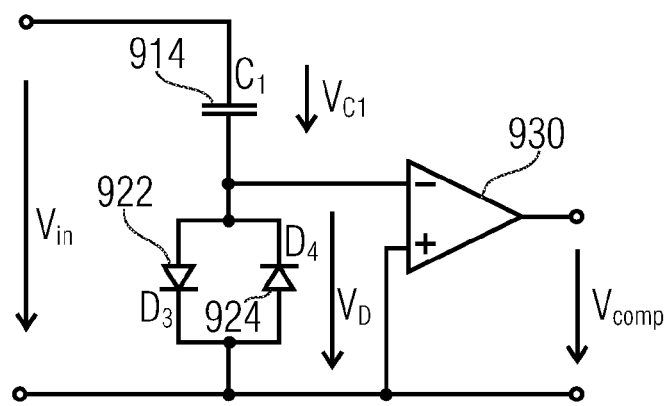
FIG. 33 shows a schematic circuit diagram of a peak detector according to at least some further embodiments of the present invention.

FIG. 33 shows a schematic circuit diagram of a peak detector according to at least some further embodiments of the present invention. In this implementation, the peak detector comprises the capacitor $C_1$ 914, the diode $D_3$ 922, and a further diode $D_4$ 924. With this peak detector, both positive and negative peaks can be detected, if the peaks fulfill the criteria for peaks that are to be detected by the peak detector, in particular with respect to frequency and amplitude.

Figure 34A:
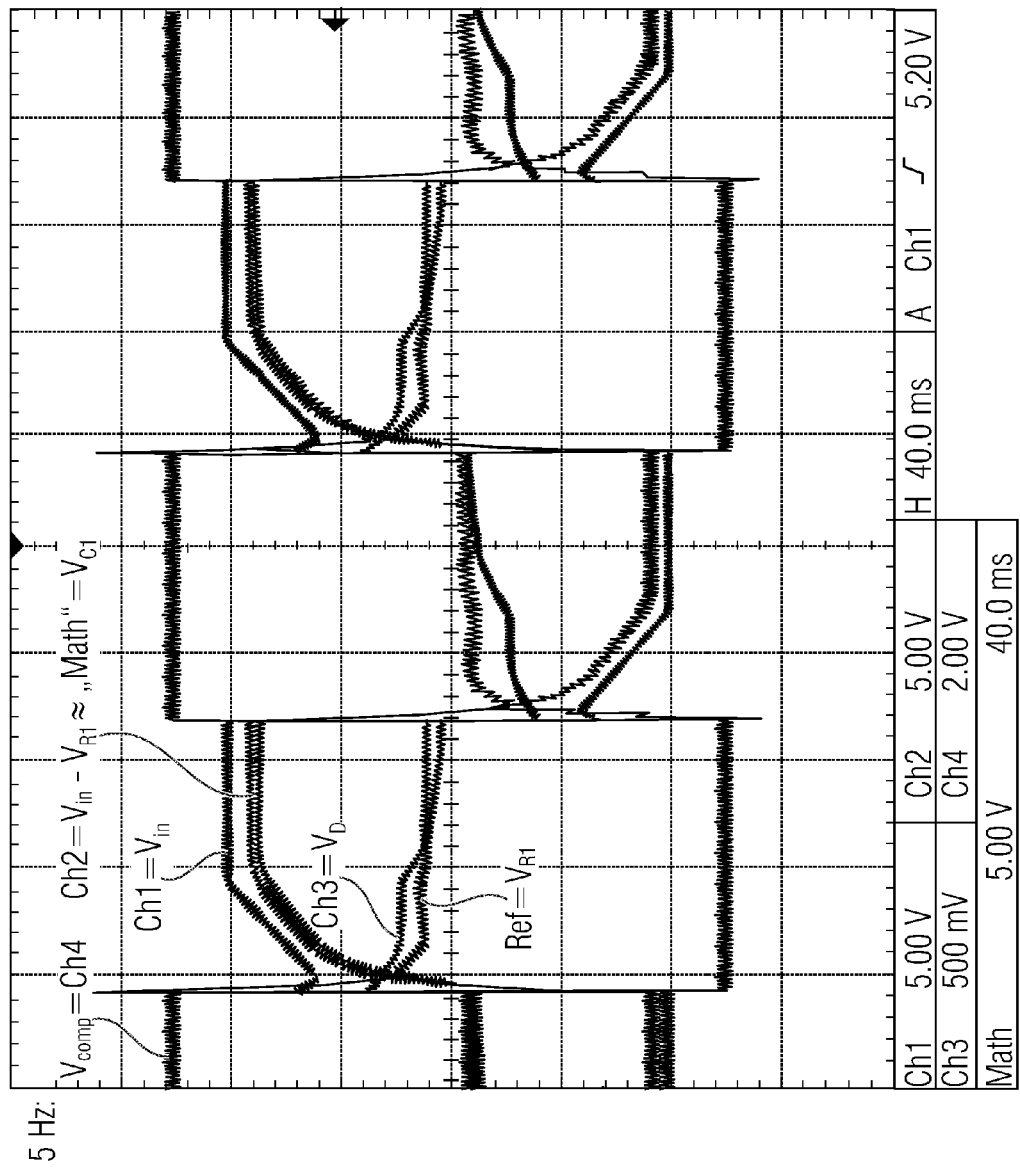
FIGS. 34A and 34B show waveforms of different signals that occur in the peak detector for an arbitrary input signal of 5 Hz having a small spurious peak that the peak detector is capable of filtering out.
Figure 34B:
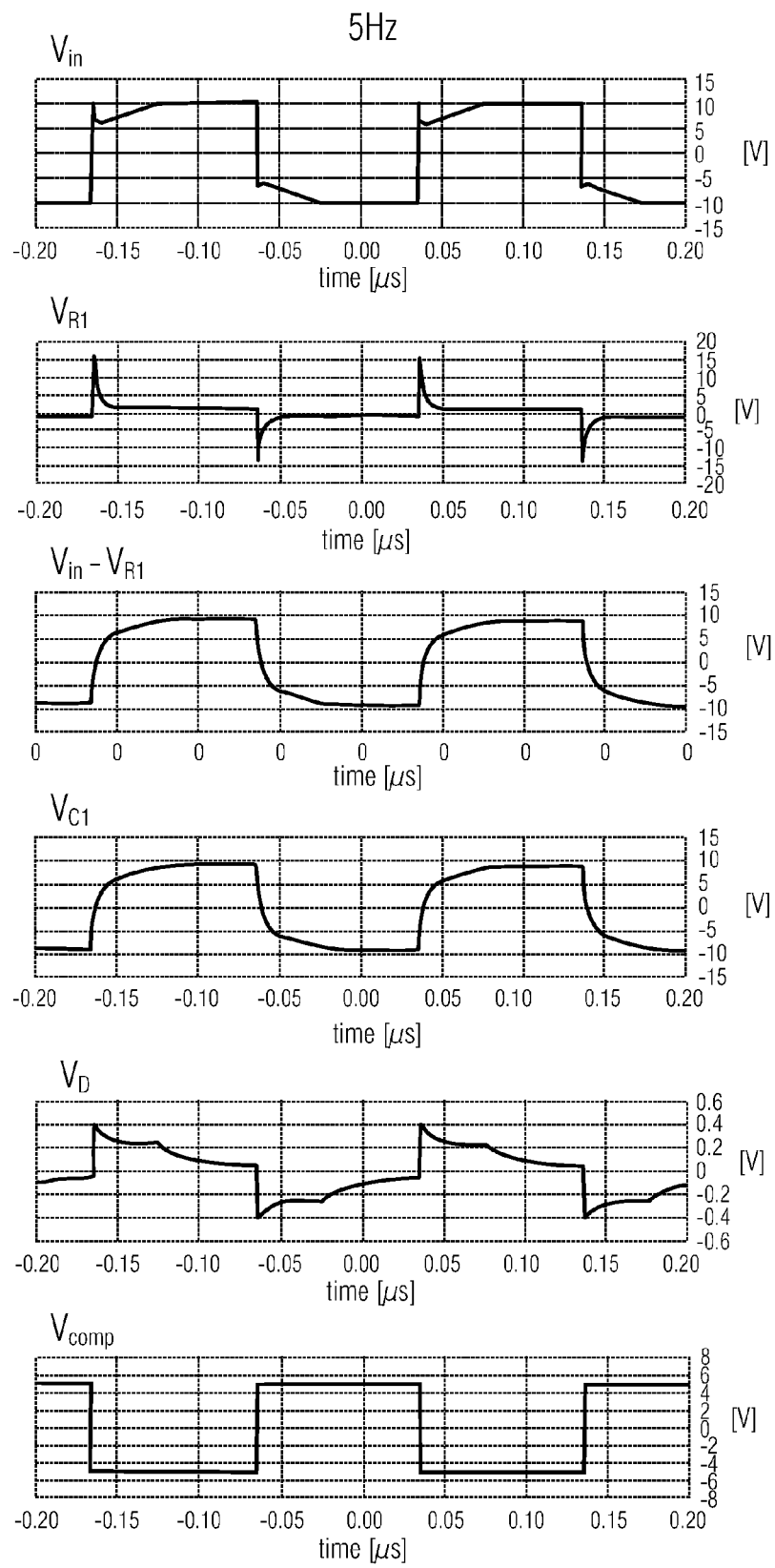

FIGS. 34A and 34B show waveforms of different signals that occur in the peak detector for an arbitrary input signal of 5 Hz having a small spurious peak that the peak detector is capable of filtering out.

Figure 35A:
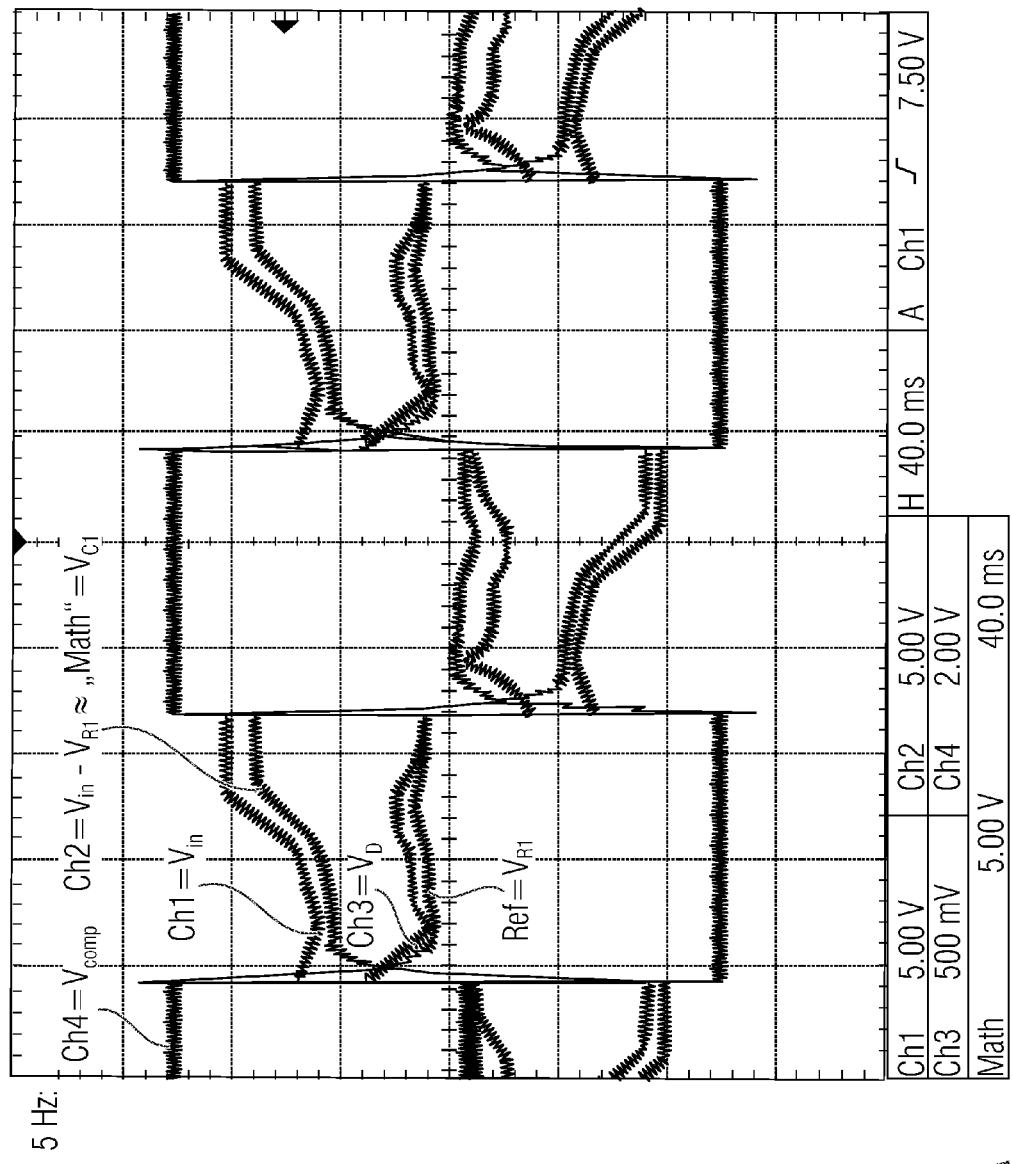
FIGS. 35A and 35B show waveforms of different signals that occur in the peak detector for an arbitrary input signal of 5 Hz having another spurious peak that the peak detector is also capable of filtering out.
Figure 35B:
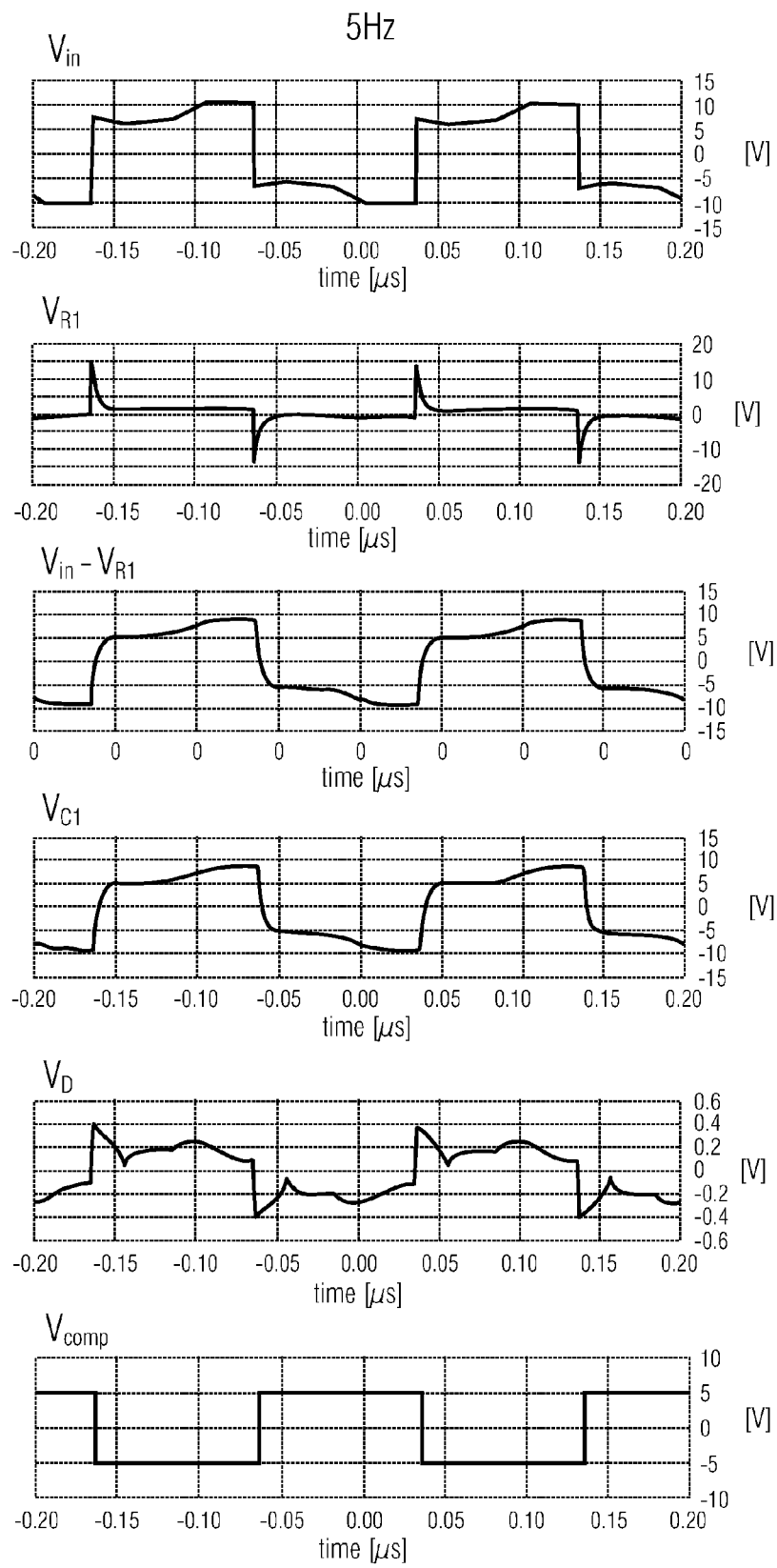

FIGS. 35A and 35B show waveforms of different signals that occur in the peak detector for an arbitrary input signal of 5 Hz having another spurious peak that the peak detector is also capable of filtering out.

Figure 36A:
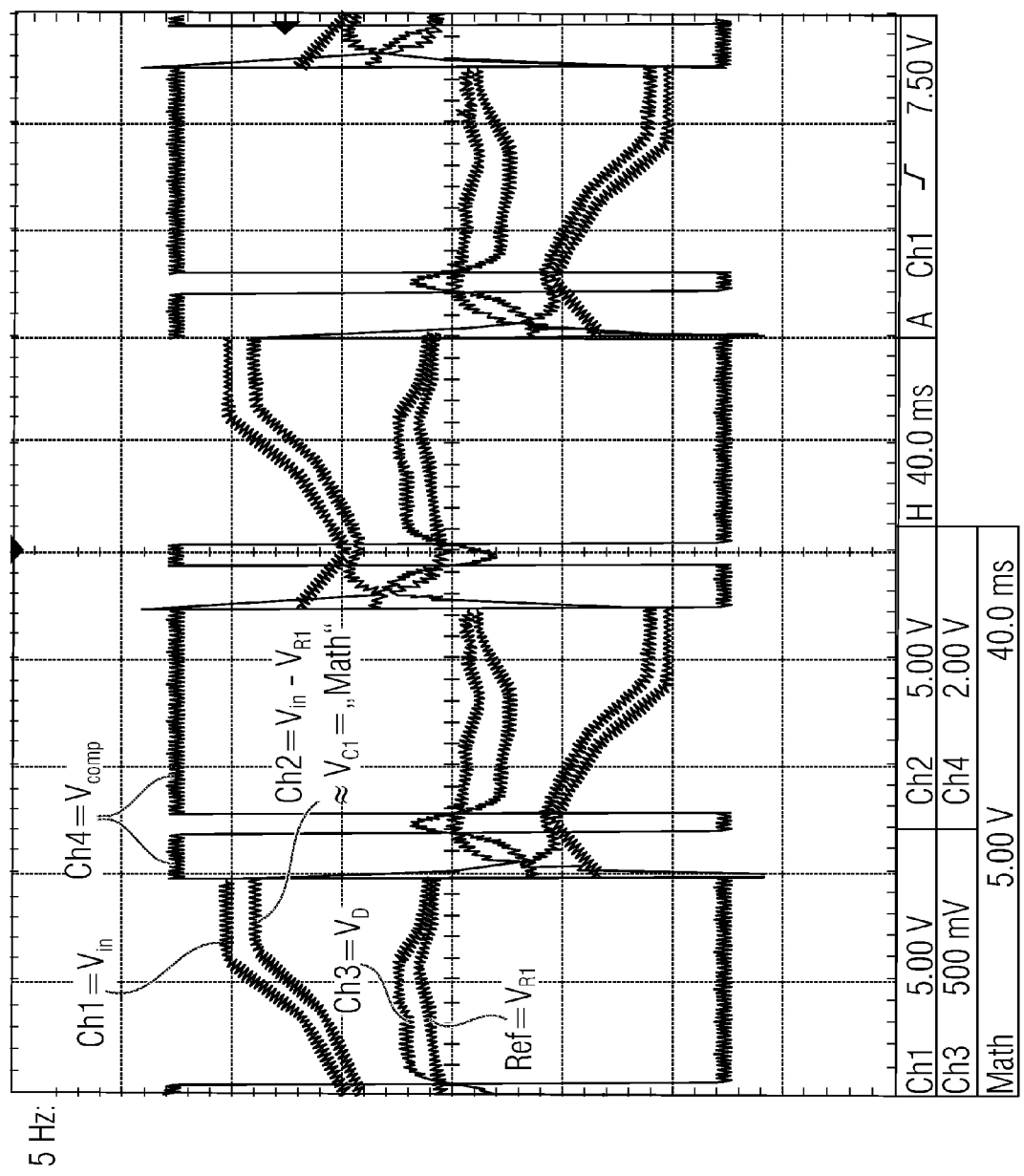
FIGS. 36A and 36B show waveforms of different signals that occur in the peak detector for an arbitrary input signal of 5 Hz having a relatively large spurious peak that the peak detector is not capable of filtering out.
Figure 36B:
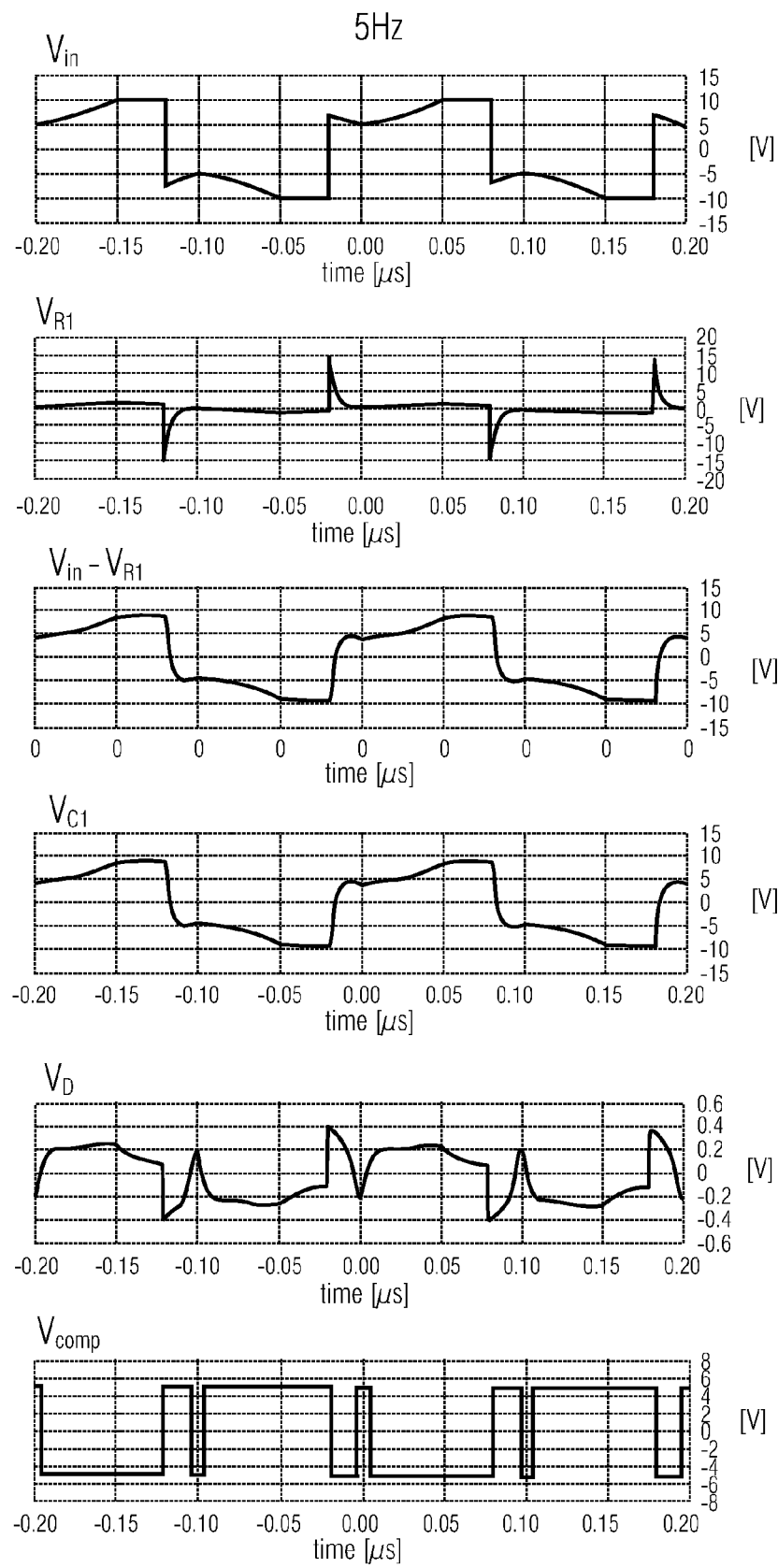

FIGS. 36A and 36B show waveforms of different signals that occur in the peak detector for an arbitrary input signal of 5 Hz having a relatively large additional peak that the peak detector is not capable of filtering out, anymore.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A parallel synchronized switch harvesting on inductor (SSHI) converter, comprising:
   a peak detector including:
      a comparator; and
      a filter configured to detect a voltage peak on a piezoelectric element connected to an input of the peak detector and to reject false voltage peak detections, wherein the filter is configured to filter an output voltage of the piezoelectric element and provide a filtered signal to an input of the comparator, the filter comprising a differentiating transfer characteristic for low frequencies and an integrating transfer characteristic for high frequencies, the filter thus being configured to detect the peaks of the piezoelectric voltage for low frequencies and to reject detection of false peaks that comprise higher frequencies;
   a pair of input terminals connected to a piezoelectric element via an inductor;
   a pair of output terminals connected to a bad; and
   a rectifier bridge including a first bridge branch and a second bridge branch which are connected in a parallel configuration between the input terminals; wherein
   each of the first and second bridge branches includes a first switching element and a second controllable switching element;
   each of the first and second bridge branches includes an output node connected to one of the pair of output terminals;
   the output nodes are located between the first switching elements and the second controllable switching elements of the first and second bridge branches; and
   the second controllable switching elements of the first and second bridge branches are controlled by a control signal provided by the peak detector.

2. The parallel SSHI converter according to claim 1, wherein the comparator is configured to compare the filtered signal with an electric potential of an input terminal to provide an output signal with appropriate voltage levels to operate switching transistors and to also provide an output signal with the opposite polarity of the filtered signal.

3. The parallel SSHI converter according to claim 1, wherein a magnitude transfer function of the filter comprises a maximum at a frequency between the low frequency range and the high frequency range.

4. The parallel SSHI converter according to claim 1, wherein a maximum magnitude frequency of a transfer function of the filter is between 80 Hz and 400 Hz.

5. The parallel SSHI converter according to claim 1, wherein the filter comprises a first filter branch connected between a first peak detector input terminal and a comparator input terminal, and a second filter branch connected between a second peak detector input terminal and the comparator input terminal, wherein at least one of the first filter branch and the second filter branch comprises an energy storing element.

6. The parallel SSHI converter according to claim 1, wherein the filter comprises a voltage divider configured to divide an input voltage corresponding to the input signal and to provide a divisional voltage at an intermediary node on the basis of which the filtered signal is determined.

7. The parallel SSHI converter according to claim 1, wherein the filter comprises two linear component and at least one non-linear component.

8. The parallel SSHI converter according to claim 1, wherein the filter comprises an energy storing circuit connecting a first input of the peak detector to a first input of the comparator, the energy storing circuit exhibiting an energy storing behavior; and
   a clipper circuit connecting a second input of the peak detector to the first input of the comparator, the clipper circuit being configured to maintain a clipper circuit voltage across the clipper circuit within a voltage range defined by at least one clipping threshold and being configured to maintain the clipper circuit voltage at the clipping threshold while an input voltage between the first input and the second input of the peak detector is monotone and outside the voltage range;
   wherein a comparator input voltage between the first input of the comparator and a second input of the comparator is based on the clipper circuit voltage, a comparator threshold voltage of the comparator being within the voltage range;
   wherein the energy storing circuit is configured, due to the energy storing behavior, to push the clipper circuit voltage across the clipping threshold into the voltage range and thereby causes the comparator input voltage to cross the comparator threshold in response to a peak in the input voltage so that an output of the comparator indicates the peak as a signal edge.

9. The parallel SSHI converter according to claim 8, wherein the energy storing circuit comprises a capacitor and a resistor, the capacitor being configured to provide the energy storing behavior by storing an electrical charge.

10. The parallel SSHI converter according to claim 9, wherein in response to the peak a capacitor voltage across the capacitor changes relatively slowly so that the voltage at the first input of the comparator substantially follows the peak which causes the clipper circuit voltage to be pushed away from the clipping threshold into the voltage range of the clipper circuit.

11. The parallel SSHI converter according to claim 8, wherein the clipper circuit is configured to be in a blocking state when the clipper circuit voltage is not at the clipping voltage and to be in a non-blocking state when the clipper circuit voltage is at or beyond the clipping voltage.

12. The parallel SSHI converter according to claim 8, wherein the clipper circuit comprises two antiparallel diodes or two antiparallel elements with diode-like characteristic.

13. The parallel SSHI converter according to claim 8, wherein the clipping threshold is an upper clipping threshold and wherein the voltage range is further defined by a lower clipping threshold;
   wherein the clipper circuit is configured to maintain the clipper circuit voltage at the lower clipping threshold when the input voltage between the first input and the second input of the peak detector is below the lower threshold and monotonously diverging from the lower threshold; and
   wherein the clipper circuit is further configured to maintain the clipper circuit voltage at the upper clipping threshold when the input voltage between the first input and the second input of the peak detector is above the upper threshold and monotonously diverging from the upper threshold.

* * * * *